US008779655B2

(12) United States Patent
Nishimura et al.

(10) Patent No.: US 8,779,655 B2
(45) Date of Patent: *Jul. 15, 2014

(54) ORGANIC ELECTROLUMINESCENCE DEVICE AND MATERIAL FOR ORGANIC ELECTROLUMINESCENCE DEVICE

(75) Inventors: Kazuki Nishimura, Sodegaura (JP);
Toshihiro Iwakuma, Sodegaura (JP);
Kenichi Fukuoka, Sodegaura (JP);
Chishio Hosokawa, Sodegaura (JP);
Masahiro Kawamura, Sodegaura (JP);
Mitsunori Ito, Sodegaura (JP); Yoriyuki Takashima, Sodegaura (JP); Toshinari Ogiwara, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 462 days.

This patent is subject to a terminal disclaimer.

(21) Appl. No.: 12/167,725

(22) Filed: Jul. 3, 2008

(65) Prior Publication Data
US 2009/0045730 A1    Feb. 19, 2009

Related U.S. Application Data

(63) Continuation-in-part of application No. 12/108,066, filed on Apr. 23, 2008.
(60) Provisional application No. 61/053,908, filed on May 16, 2008.

(30) Foreign Application Priority Data

Jul. 7, 2007 (JP) ................. 2007-179109
Jul. 7, 2007 (JP) ................. 2007-179120
Jul. 7, 2007 (JP) ................. 2007-179121

(51) Int. Cl.
*H01L 51/54*    (2006.01)
*H05B 33/14*    (2006.01)
*C09K 11/06*    (2006.01)

(52) U.S. Cl.
USPC ........... 313/504; 313/506; 428/690; 428/917; 257/40; 257/E51.049

(58) Field of Classification Search
None
See application file for complete search history.

(56) References Cited

U.S. PATENT DOCUMENTS 7,097,917 B1 *  8/2006  Fujita et al. ................ 428/690

(Continued)

FOREIGN PATENT DOCUMENTS

EP   1645610  *  4/2006  ............ C09K 11/06

(Continued)

OTHER PUBLICATIONS

Baldo et al., Applied Physics Letters, (1999), vol. 75, No. 1, pp. 4-6.*

(Continued)

*Primary Examiner* — Jennifer Chriss
*Assistant Examiner* — Brett A Crouse
(74) *Attorney, Agent, or Firm* — Oblon, Spivak, McClelland, Maier & Neustadt, L.L.P.

(57) ABSTRACT

An organic electroluminescence device includes: a cathode; an anode; and a single-layered or multilayered organic thin-film layer provided between the cathode and the anode. The organic thin-film layer includes at least one emitting layer. The at least one emitting layer contains at least one phosphorescent material and a host material represented by the following formula (1).

$$Ra—Ar^1—Rb \qquad (1)$$

In the formula, $Ar^1$, Ra and Rb each represent a substituted or unsubstituted benzene ring or a condensed aromatic hydrocarbon ring selected from a substituted or unsubstituted naphthalene ring, a substituted or unsubstituted chrysene ring, a substituted or unsubstituted fluoranthene ring, a substituted or unsubstituted phenanthrene ring, a substituted or unsubstituted benzophenanthrene ring, a substituted or unsubstituted dibenzophenanthrene ring, a substituted or unsubstituted triphenylene ring, a substituted or unsubstituted benzo[a]triphenylene ring, a substituted or unsubstituted benzochrysene ring, a substituted or unsubstituted benzo[b]fluoranthene ring and a substituted or unsubstituted picene ring. Substituents for Ra and Rb are not aryl groups.

18 Claims, 1 Drawing Sheet

(56) References Cited

U.S. PATENT DOCUMENTS

| | | | |
|---|---|---|---|
| 8,021,574 B2* | 9/2011 | Kawamura et al. | 252/301.16 |
| 8,025,815 B2* | 9/2011 | Kawamura et al. | 252/301.16 |
| 2002/0177009 A1* | 11/2002 | Suzuki et al. | 428/690 |
| 2002/0182441 A1 | 12/2002 | Lamansky et al. | |
| 2004/0241495 A1* | 12/2004 | Kwong et al. | 428/690 |
| 2005/0064233 A1 | 3/2005 | Matsuura et al. | |
| 2005/0175857 A1 | 8/2005 | Coggan et al. | |
| 2006/0134456 A1* | 6/2006 | Ikeda et al. | 428/690 |
| 2006/0192482 A1 | 8/2006 | Igarashi et al. | |
| 2006/0210828 A1 | 9/2006 | Nakayama et al. | |
| 2006/0280965 A1* | 12/2006 | Kwong et al. | 428/690 |
| 2007/0134511 A1 | 6/2007 | Kawamura et al. | |
| 2007/0224448 A1* | 9/2007 | Ikeda et al. | 428/690 |
| 2009/0026919 A1* | 1/2009 | Stossel et al. | 313/504 |

FOREIGN PATENT DOCUMENTS

| | | |
|---|---|---|
| JP | 2001-332384 | 11/2001 |
| JP | 2003-27048 | 1/2003 |
| JP | 2003-142267 | 5/2003 |
| JP | 2004-14334 | 1/2004 |
| JP | 2004-75567 | 3/2004 |
| JP | 2004-111228 A | 4/2004 |
| JP | 2005-8588 | 1/2005 |
| JP | 2005-19219 | 1/2005 |
| JP | 2005-63938 | 3/2005 |
| JP | 2005-71983 | 3/2005 |
| JP | 2005-071983 | 3/2005 |
| JP | 2005-197262 | 7/2005 |
| JP | 2005-222948 | 8/2005 |
| JP | 2006-052324 A | 2/2006 |
| JP | 2006-151966 | 6/2006 |
| JP | 2007-507449 A | 3/2007 |
| JP | 2007-291013 A | 11/2007 |
| JP | 2007-308477 A | 11/2007 |
| JP | 2007-314510 A | 12/2007 |
| WO | WO 2004/018588 A1 | 3/2004 |
| WO | WO 2005/084083 A1 | 9/2005 |
| WO | WO2005/112519 * | 11/2005 ............. H05B 33/14 |
| WO | WO 2005/112519 A1 | 11/2005 |
| WO | WO 2006/062078 A1 | 6/2006 |
| WO | WO 2007/046658 A1 | 4/2007 |
| WO | WO 2007/069569 | 6/2007 |

OTHER PUBLICATIONS

Kim et al., Journal of Applied Physics, (2008), vol. 103, 054502-1-054502-4.*
Matsunami et al., JP 2005-272803, (2005), machine assisted translation.*
U.S. Appl. No. 12/275,789, filed Nov. 21, 2008, Nishimura, et al.
U.S. Appl. No. 12/376,236, filed Feb. 3, 2009, Iwakuma, et al.
U.S. Appl. No. 12/816,030, filed Jun. 15, 2010, Nishimura, et al.
A. Salinas Castillo, et al. "Heavy atom induced room temperature phosphorescence: a tool for the analytical characterization of polycyclic aromatic hydrocarbons", Analytica Chimica Acta 516, 2004, pp. 213-220.
U.S. Appl. No. 12/167,737, filed Jul. 3, 2008, Nishimura, et al.
U.S. Appl. No. 12/122,316, filed May 16, 2008, Nishimura, et al.
U.S. Appl. No. 12/122,308, filed May 16, 2008, Nishimura, et al.
M.A. Baldo, et al., "Very high-efficiency green organic light-emitting devices based on electrophosporescence", Allied Physics Letters, vol. 75, No. 1, pp. 4-6, Jul. 5, 1999.
Office Action mailed Jan. 3, 2011.
Bruno et al., CRC Handbook of Fundamental Spectroscopic Correlation Charts, p. 2.
U.S. Appl. No. 13/386,766, filed Jan. 24, 2012, Ogiwara, et al.
Japanese Office Action issued Feb. 21, 2012 in patent application No. 2009-522602 with English translation.
Office Action issued Dec. 11, 2012, in Japanese Patent Application No. 2009-522602 with English translation.
Office Action as received in the Taiwanese Patent Application No. 97125271 dated Sep. 6, 2013 w/English Translation.
European Search Report issued in the corresponding European Patent Application No. 08790860.4 dated May 13, 2011.
Bruno et al., CRC Handbook of Fundamental Spectroscopic Correlation Charts, p. 2, (2005).

* cited by examiner

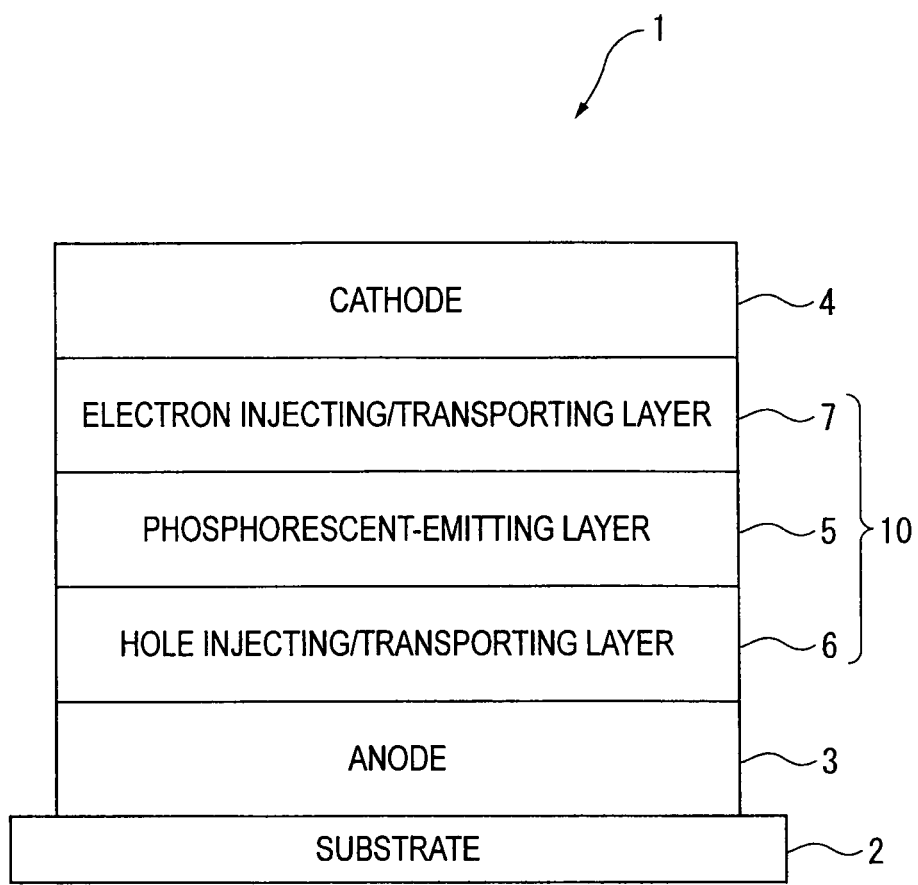

US 8,779,655 B2

ORGANIC ELECTROLUMINESCENCE DEVICE AND MATERIAL FOR ORGANIC ELECTROLUMINESCENCE DEVICE

CROSS-REFERENCE TO RELATED APPLICATIONS

This application is a continuation-in-part of U.S. Ser. No. 12/108,066 filed Apr. 23, 2008 and claims the benefit of U.S. 61/053,908 filed May 16, 2008, JP 2007-179109 filed Jul. 7, 2007, JP 2007-179120 filed Jul. 7, 2007, and JP 2007-179121 filed Jul. 7, 2007.

BACKGROUND OF THE INVENTION

1. Field of the Invention

The present invention relates to an organic electroluminescence device (hereinafter abbreviated as organic EL device) and a material for an organic electroluminescence device. In particular, the present invention relates to an organic electroluminescence device including a red emitting layer and a material used for the organic electroluminescence device.

2. Description of Related Art

An organic EL device, which includes an organic thin-film layer (in which an emitting layer is included) between an anode and a cathode, has been known to emit light using exciton energy generated by a recombination of holes and electrons that have been injected into the emitting layer.

Such an organic EL device, which has the advantages as a self-emitting device, is expected to serve as an emitting device excellent in luminous efficiency, image quality, power consumption and thin design.

An example of a further improvement made in an organic EL device is an improvement in luminous efficiency.

In this respect, in order to enhance internal quantum efficiency, developments have been made on an emitting material (phosphorescent material) that emits light using triplet excitons. In recent years, there has been a report on a phosphorescent organic EL device.

Since the internal quantum efficiency can be enhanced up to 75% or more (up to approximately 100% in theory) by forming the emitting layer (phosphorescent-emitting layer) from such a phosphorescent material, an organic EL device having high efficiency and consuming less power can be obtained.

In forming the emitting layer, a doping method, according to which an emitting material (dopant) is doped to a host material, has been known as a usable method.

The emitting layer formed by the doping method can efficiently generate excitons from electric charges injected into the host material. With the exciton energy generated by the excitons being transferred to the dopant, the dopant can emit light with high efficiency.

In order to intermolecularly transfer the energy from the host material to the phosphorescent dopant, excited triplet energy $Eg_H$ of the host material is required to be larger than excited triplet energy $Eg_D$ of the phosphorescent dopant.

A known representative example of a material having effectively-large excited triplet energy has been CBP (4,4'-bis(N-carbazolyl)biphenyl). See, for instance, a document 1: US2002/182441.

By using CBP disclosed in the patent document 1 as the host material, energy can be transferred to a phosphorescent dopant for emitting light of a predetermined emitting wavelength (e.g., green, red), by which an organic EL device of high efficiency can be obtained.

However, although an organic EL device in which CBP is used as the host material exhibits much higher luminous efficiency due to phosphorescent emission, the organic EL device has such a short lifetime as to be practically inapplicable.

Such a problem is considered to be attributed to considerable degradation of molecules by holes due to not-high oxidation stability that the molecular structure of CBP exhibits.

Alternatively, a document 2 (WO2005/112519) discloses a technique according to which a condensed-ring derivative containing a nitrogen-containing ring such as carbazole is used as the host material for a red-phosphorescent-emitting layer. Although the technique disclosed in the patent document 2 contributes to an improvement in the luminous efficiency and lifetime, the improved luminous efficiency and lifetime are not always sufficient for practical application.

On the other hand, a variety of host materials (fluorescent hosts) for fluorescent dopants are known. Various proposals have been made on a host material capable of, with a combination of a fluorescent dopant, providing a fluorescent-emitting layer excellent in luminous efficiency and lifetime.

However, although a fluorescent host has larger excited singlet energy $Eg(S)$ than a fluorescent dopant, such a fluorescent host does not necessarily have larger excited triplet energy $Eg(T)$. Accordingly, it is not successful to simply apply the fluorescent host to the host material (phosphorescent material) for a phosphorescent-emitting layer.

A well-known example of such a fluorescent host is an anthracene derivative.

However, excited triplet energy $Eg(T)$ of an anthracene derivative is relatively small (approximately 1.9 eV). Thus, energy cannot be reliably transferred to a phosphorescent dopant for emitting light having a wavelength in a visible light range of 500 nm to 720 nm. In addition, excited triplet energy cannot be trapped within the emitting layer.

Accordingly, an anthracene derivative is not suitable for the phosphorescent host.

Further, derivatives such as a perylene derivative, a pyrene derivative and a naphthacene derivative are not preferable phosphorescent hosts for the same reason above.

Alternatively, an exemplary arrangement in which an aromatic hydrocarbon compound is used as the phosphorescent host has been known (see a document 3: JP-A-2003-142267). In such an arrangement, a compound in which two aromatic groups are bonded as substituents to a benzene central skeleton in meta positions is used as the phosphorescent host.

However, the aromatic hydrocarbon compound disclosed in the document 3 has a well-symmetrical and rigid structure including five aromatic rings, in which molecules extend from the benzene central skeleton in a manner symmetrical relative to the benzene central skeleton. Thus, an emitting layer in which the aromatic hydrocarbon compound is used tends to be easily crystallized.

In addition, a document 4 (WO2007/046658), a document 5 (JP-A-2006-151966), a document 6 (JP-A-2005-8588), a document 7 (JP-A-2005-19219), a document 8 (JP-A-2005-197262) and a document 9 (JP-A-2004-75567) disclose organic EL devices in which various aromatic hydrocarbon compounds are used. However, none of the above documents refers to effectiveness of aromatic hydrocarbon compounds as the phosphorescent hosts.

In addition, a document 10 (JP-A-2005-71983) discloses a device in which a phosphorescent host material having two or more triphenylene rings in the same molecule is used. However, the phosphorescent host material has a flat and rigid molecular structure including triphenylene rings on the left and right, three sides or four sides of the central skeleton. An emitting layer in which the phosphorescent host material is used tends to be easily crystallized. An arrangement in which a triphenylene skeleton is built into the molecule is required to be asymmetrically structured in order to reduce intermolecular interaction entailed by its flat structure.

As described above, no host material has been known to be capable of efficiently transferring energy to the phosphorescent material while exhibiting such a long lifetime as to be practically applicable, which has hindered a practical realization of a device in which a phosphorescent material is used.

SUMMARY OF THE INVENTION

An object of the present invention is to provide a phosphorescent organic EL device having high efficiency and long lifetime and a material for an organic EL device from which a phosphorescent organic EL device having high efficiency and long lifetime can be formed.

After conducting concentrated studies in order to achieve such an object, the inventors have found that a phosphorescent organic EL device having high efficiency and long lifetime can be provided by using a material containing a host material represented by the following formula (1) or a host material represented by the following formula (3) or (4) as a phosphorescent host, and reached the present invention.

BRIEF DESCRIPTION OF THE DRAWINGS

FIG. 1 schematically shows an exemplary arrangement of an organic EL device according to an aspect of the present invention.

DETAILED DESCRIPTION OF PREFERRED EMBODIMENT(S)

Exemplary embodiment(s) of the present invention will be described.

Arrangement of Organic EL Device

First of all, arrangement(s) of an organic EL device will be described below.

The followings are representative arrangement examples of an organic EL device:
(1) anode/emitting layer/cathode;
(2) anode/hole injecting layer/emitting layer/cathode;
(3) anode/emitting layer/electron injecting•transporting layer/cathode;
(4) anode/hole injecting layer/emitting layer/electron injecting•transporting layer/cathode;
(5) anode/organic semiconductor layer/emitting layer/cathode;
(6) anode/organic semiconductor layer/electron blocking layer/emitting layer/cathode;
(7) anode/organic semiconductor layer/emitting layer/adhesion improving layer/cathode;
(8) anode/hole injecting•transporting layer/emitting layer/electron injecting•transporting layer/cathode;
(9) anode/insulating layer/emitting layer/insulating layer/cathode;
(10) anode/inorganic semiconductor layer/insulating layer/emitting layer/insulating layer/cathode;
(11) anode/organic semiconductor layer/insulating layer/emitting layer/insulating layer/cathode;
(12) anode/insulating layer/hole injecting•transporting layer/emitting layer/insulating layer/cathode; and
(13) anode/insulating layer/hole injecting transporting layer/emitting layer/electron injecting•transporting layer/cathode.

While the arrangement (8) is preferably used among the above, the arrangement of the present invention is not limited to the above arrangements.

FIG. 1 schematically shows an exemplary arrangement of an organic EL device according to an exemplary embodiment of the present invention.

An organic EL device 1 includes a transparent substrate 2, an anode 3, a cathode 4 and an organic thin-film layer 10 disposed between the anode 3 and the cathode 4.

The organic thin-film layer 10 includes a phosphorescent-emitting layer 5 containing a phosphorescent host and a phosphorescent dopant. A layer such as a hole injecting/transporting layer 6 may be provided between the phosphorescent-emitting layer 5 and the anode 3 while a layer such as an electron injecting/transporting layer 7 may be provided between the phosphorescent-emitting layer 5 and the cathode 4.

In addition, an electron blocking layer may be provided to the phosphorescent-emitting layer 5 adjacent to the anode 3 while a hole blocking layer may be provided to the phosphorescent-emitting layer 5 adjacent to the cathode 4.

With this arrangement, electrons and holes can be trapped in the phosphorescent-emitting layer 5, thereby enhancing probability of exciton generation in the phosphorescent-emitting layer 5.

It should be noted that a "fluorescent host" and a "phosphorescent host" herein respectively mean a host combined with a fluorescent dopant and a host combined with a phosphorescent dopant, and that a distinction between the fluorescent host and phosphorescent host is not unambiguously derived only from a molecular structure of the host in a limited manner.

In other words, the fluorescent host herein means a material for forming a fluorescent-emitting layer containing a fluorescent dopant, and does not mean a host that is only usable as a host of a fluorescent material.

Likewise, the phosphorescent host herein means a material for forming a phosphorescent-emitting layer containing a phosphorescent dopant, and does not mean a host that is only usable as a host of a phosphorescent material.

It should be noted that the "hole injecting/transporting layer (or hole injecting•transporting layer)" herein means "at least either one of a hole injecting layer and a hole transporting layer" while the "electron injecting/transporting layer (or electron injecting•transporting layer)" herein means "at least either one of an electron injecting layer and an electron transporting layer".

Light-Transmissive Substrate

The organic EL device is formed on a light-transmissive substrate. The light-transmissive substrate, which supports the organic EL device, is preferably a smoothly-shaped substrate that transmits 50% or more of light in a visible region of 400 nm to 700 nm.

The light-transmissive plate is exemplarily a glass plate, a polymer plate or the like.

For the glass plate, materials such as soda-lime glass, barium/strontium-containing glass, lead glass, aluminosilicate glass, borosilicate glass, barium borosilicate glass and quartz can be used.

For the polymer plate, materials such as polycarbonate, acryl, polyethylene terephthalate, polyether sulfide and polysulfone can be used.

Anode and Cathode

The anode of the organic EL device is used for injecting holes into the hole injecting layer, the hole transporting layer or the emitting layer. It is effective that the anode has a work function of 4.5 eV or more.

Exemplary materials for the anode are indium-tin oxide (ITO), tin oxide (NESA), indium zinc oxide, gold, silver, platinum and copper.

The anode may be made by forming a thin film from these electrode materials through a method such as vapor deposition or sputtering.

When light from the emitting layer is to be emitted through the anode as in the present embodiment, the anode preferably transmits more than 10% of the light in the visible region. Sheet resistance of the anode is preferably several hundreds Ω/square or lower. Although depending on the material of the anode, thickness of the anode is typically in a range of 10 nm to 1 μm, and preferably in a range of 10 to 200 nm.

The cathode is preferably formed of a material with smaller work function in order to inject electrons into the electron injecting layer, the electron transporting layer and the emitting layer.

Although a material for the cathode is subject to no specific limitation, examples of the material are indium, aluminum, magnesium, alloy of magnesium and indium, alloy of magnesium and aluminum, alloy of aluminum and lithium, alloy of aluminum, scandium and lithium, alloy of magnesium and silver and the like.

Like the anode, the cathode may be made by forming a thin film from the above materials through a method such as vapor deposition or sputtering. In addition, the light may be emitted through the cathode.

Emitting Layer

The emitting layer of the organic EL device has functions as follows, namely:
(1) injecting function: a function for accepting, when an electrical field is applied, the holes injected by the anode or the hole injecting layer, or the electrons injected by the cathode or the electron injecting layer;
(2) transporting function: a function for transporting injected electric charges (the electrons and the holes) by the force of the electrical field; and
(3) emitting function: a function for providing a condition for recombination of the electrons and the holes to emit light.

Injectability of the holes may differ from that of the electrons and transporting capabilities of the hole and the electrons (represented by mobilities of the holes and the electrons) may differ from each other.

As a method of forming the emitting layer, known methods such as vapor deposition, spin coating and an LB method may be employed.

The emitting layer is preferably a molecular deposit film.

The molecular deposit film means a thin film formed by depositing a material compound in gas phase or a film formed by solidifying a material compound in a solution state or in liquid phase. The molecular deposit film is generally distinguished from a thin film formed by the LB method (molecular accumulation film) by differences in aggregation structures, higher order structures and functional differences arising therefrom.

Since the host material represented by the formula (1) exhibits a greater triplet energy gap (excited triplet energy), the host material can transfer the energy to the phosphorescent dopant, so that the phosphorescent dopant can emit light.

While an anthracene derivative, which is well-known as a fluorescent host, is not suitably applied as a host for red-emitting phosphorescent dopant, the host according to the present invention, which exhibits a greater triplet energy gap, can be effectively applied for the red-emitting phosphorescent dopant to emit light.

However, while CBP, which is a conventionally-known phosphorescent host, can serve as the host even for a phosphorescent dopant for emitting light of a shorter wavelength than green, the host material according to the present invention can be used for a green-emitting phosphorescent dopant but cannot be used for a phosphorescent dopant for emitting light of a shorter wavelength than green.

According to the present invention, since the skeleton of the host material partially has a polycyclic condensed ring containing no nitrogen atom, molecular stability thereof can be enhanced and the lifetime of the device can be prolonged.

When the number of ring atoms (i.e., atoms for forming the ring) contained in the skeleton is too small, the molecular stability thereof is not sufficiently high. On the other hand, when the number of rings condensed in the polycyclic condensed ring for structuring the host material is too large, a HOMO-LUMO gap is too much narrowed that the triplet energy gap becomes insufficient for useful emission wavelength. In this respect, since the host material represented by the formula (1) contains the suitable number of the ring atoms, the host material can be favorably applied as the phosphorescent host for a highly-stable phosphorescent emitting layer that emits light of a useful wavelength.

Conventionally, a host material widely usable for phosphorescent dopants that emit light of wide wavelengths ranging from green to red has been selected for each phosphorescent dopant. Thus, a material exhibiting a wider triplet energy gap such as CBP has been used as the host material.

However, it is true that CBP exhibits a wider triplet energy gap Eg(T), but CBP has a shorter lifetime.

In this respect, the host according to the present invention is not applicable as a host for such a wide-gap phosphorescent dopant as to be comparable to a blue-emitting phosphorescent dopant, but is applicable as a host for a red-emitting or green-emitting phosphorescent dopant. Furthermore, when a host material exhibiting too wide triplet energy gap such as CBP is used for a red-emitting phosphorescent dopant, a difference in energy gap between the host and the dopant is so large that the energy is not efficiently transferred intermolecularly. However, since the host according to the present invention exhibits an energy gap suitable for a red-emitting or green-emitting phosphorescent dopant, energy can be efficiently transferred from the excitons of the host to the phosphorescent dopant, or energy generated by directly exciting the phosphorescent dopant can be trapped therein, thereby providing a phosphorescent-emitting layer of considerably high efficiency.

As described above, according to the present invention, a phosphorescent-emitting layer having high efficiency and long lifetime can be provided.

Triplet energy gap Eg(T) of a material for forming an organic EL device may be exemplarily defined based on the phosphorescence spectrum. For instance, in the present invention, the triplet energy gap Eg(T) may be defined as follows.

Specifically, each material was dissolved in an EPA solvent (diethylether:isopentane:ethanol=5:5:2 in volume ratio) with a concentration of 10 μmol/L, thereby forming a sample for phosphorescence measurement.

Then, the sample for phosphorescence measurement is put into a quartz cell, cooled to 77K and irradiated with exciting light, so that a wavelength of phosphorescence radiated therefrom is measured.

A tangent line is drawn to be tangent to a rising section adjacent to short-wavelength of the obtained phosphorescence spectrum, a wavelength value at an intersection of the tangent line and a base line is converted into energy value, and the converted energy value is defined as the triplet energy gap Eg(T).

For the measurement, for instance, a commercially-available measuring equipment F-4500 (manufactured by Hitachi, Ltd.) may be used.

However, the triplet energy gap does not need to be defined by the above method, but may be defined by any other suitable method as long as an object and a spirit of the present invention are not impaired.

The host material contained in the emitting layer of the organic EL device according to the present invention is represented by the following formula (1).

In the formula, $Ar^1$, Ra and Rb each represent a substituted or unsubstituted benzene ring or a condensed aromatic hydrocarbon ring selected from a substituted or unsubstituted naphthalene ring, a substituted or unsubstituted chrysene ring, a substituted or unsubstituted fluoranthene ring, a substituted or unsubstituted phenanthrene ring, a substituted or unsubstituted benzophenanthrene ring, a substituted or unsubstituted dibenzophenanthrene ring, a substituted or unsubstituted triphenylene ring, a substituted or unsubstituted benzo[a]triphenylene ring, a substituted or unsubstituted benzochrysene ring, a substituted or unsubstituted benzo[b]fluoranthene ring and a substituted or unsubstituted picene ring. Substituents for Ra and Rb are not aryl groups; Ra and Rb do not concurrently represent a substituted or unsubstituted triphenylene ring. When $Ar^1$ represents a substituted or unsubstituted triphenylene ring, Ra and Rb represent substituted or unsubstituted condensed aromatic hydrocarbon groups that are mutually different.

The host material contained in the material for an organic EL device according to the present invention is represented by the following formula (2).

In the formula, $Ar^1$, Ra and Rb each represent a substituted or unsubstituted benzene ring or a condensed aromatic hydrocarbon ring selected from a substituted or unsubstituted naphthalene ring, a substituted or unsubstituted chrysene ring, a substituted or unsubstituted fluoranthene ring, a substituted or unsubstituted phenanthrene ring, a substituted or unsubstituted benzophenanthrene ring, a substituted or unsubstituted dibenzophenanthrene ring, a substituted or unsubstituted triphenylene ring, a substituted or unsubstituted benzo[a]triphenylene ring, a substituted or unsubstituted benzochrysene ring, a substituted or unsubstituted benzo[b]fluoranthene ring and a substituted or unsubstituted picene ring. Substituents for Ra and Rb are not aryl groups. Ra and Rb do not concurrently represent a triphenylene ring. When $Ar^1$ represents a substituted or unsubstituted benzene ring, an unsubstituted naphthalene ring, a substituted or unsubstituted 2,7-phenanthrenediyl group or a substituted or unsubstituted triphenylene ring, Ra and Rb represent substituted or unsubstituted condensed aromatic hydrocarbon groups that are mutually different.

The host material contained in the material for an organic EL device according to the present invention is represented by the following formula (3).

In the formula, $Ar^1$ represents a divalent benzene ring bonded with two adjacent groups in meta positions or a naphthalene ring bonded with two adjacent groups respectively in the second and seventh positions. Ra and Rb each represent a condensed aromatic hydrocarbon ring selected from a substituted or unsubstituted chrysene ring, a substituted or unsubstituted fluoranthene ring, a substituted or unsubstituted phenanthrene ring, a substituted or unsubstituted benzophenanthrene ring, a substituted or unsubstituted dibenzophenanthrene ring, a substituted or unsubstituted triphenylene ring, a substituted or unsubstituted benzo[a]triphenylene ring, a substituted or unsubstituted benzochrysene ring, a substituted or unsubstituted benzo[b]fluoranthene ring and a substituted or unsubstituted picene ring. Substituents for Ra and Rb are not aryl groups. Ra and Rb do not concurrently represent a triphenylene ring.

When Ra, Rb or $Ar^1$ in the formulae (1) to (3) each has a single or plural substituent(s), the substituent(s) is preferably an alkyl group having 1 to 20 carbon atoms, a haloalkyl group having 1 to 20 carbon atoms, a cycloalkyl group having 5 to 18 carbon atoms, a silyl group having 3 to 20 carbon atoms, a cyano group or a halogen atom. A substituent for $Ar^1$ may also be an aryl group having 6 to 22 carbon atoms.

Since the substituent(s) contains no nitrogen atom, the stability of the host material can be further enhanced, and the lifetime of the device can be prolonged.

The number of plural aryl substituents for $Ar^1$ is preferably 2 or less, more preferably 1 or less.

Examples of the alkyl group having 1 to 20 carbon atoms are a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neo-pentyl group, a 1-methylpentyl group, 2-methylpentyl group, a 1-pentylhexyl group, a 1-butylpentyl group, a 1-heptyloctyl group and 3-methylpentyl group.

Examples of the haloalkyl group having 1 to 20 carbon atoms are chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group and 1,2,3-triiodopropyl group.

Examples of the cycloalkyl group having 5 to 18 carbon atoms are cyclopentyl group, cyclohexyl group, cyclooctyl group, and 3,5-tetramethylcyclohexyl group, among which cyclohexyl group, cyclooctyl group and 3,5-tetramethylcyclohexyl group are preferable.

The silyl group having 3 to 20 carbon atoms is preferably an alkylsilyl group, an arylsilyl group or an aralkylsilyl group, examples of which are trimethylsilyl group, triethylsilyl group, tributylsilyl group, trioctylsilyl group, triisobutylsilyl group, dimethylethylsilyl group, dimethylisopropylsilyl group, dimethylpropylsilyl group, dimethylbutylsilyl group, dimethyltertiarybutylsilyl group, diethylisopropylsilyl group, phenyldimethylsilyl group, diphenylmethylsilyl group, diphenyltertiarybutylsilyl group and triphenylsilyl group.

Examples of the halogen atom are a fluorine atom, a chlorine atom, a bromine atom and an iodo atom.

The aryl substitute having 6 to 22 carbon atoms is preferably phenyl group, biphenyl group, terphenyl group, naphthyl group, chrysenyl group, fluoranthenyl group, 9,10-dialkylfluorenyl group, 9,10-diarylfluorenyl group, triphenylenyl group, phenanthrenyl group, benzophenanthrenyl group, dibenzophenanthrenyl group, benzotriphenylenyl group, benzochrysenyl group or dibenzofuranyl group, more preferably phenyl group having 6 to 18 carbon atoms, biphenyl group, terphenyl group, naphthyl group, chrysenyl group, fluoranthenyl group, 9,10-dimethylfluorenyl group, triphenylenyl group, phenanthrenyl group, benzophenanthrenyl group or dibenzofuranyl group, much more preferably a phenyl group having 6 to 14 carbon atoms, biphenyl group, naphthyl group, phenanthrenyl group or dibenzofuranyl group.

In the present invention, excited triplet energy of the host material is preferably in a range of 2.0 eV to 2.8 eV.

When the excited triplet energy is 2.0 eV or more, energy can be transferred to a phosphorescent material that emits light in a range of 500 nm to 720 nm. On the other hand, when the excited triplet energy is 2.8 eV or less, a difference in energy gap between the red-emitting phosphorescent dopant and the host material can be prevented from becoming so large that light is not efficiently emitted.

The excited triplet energy of the host material is preferably in a range of 2.0 eV to 2.7 eV, more preferably in a range of 2.1 eV to 2.7 eV.

Examples of compounds for the host material according to the present invention are as follows.

A1

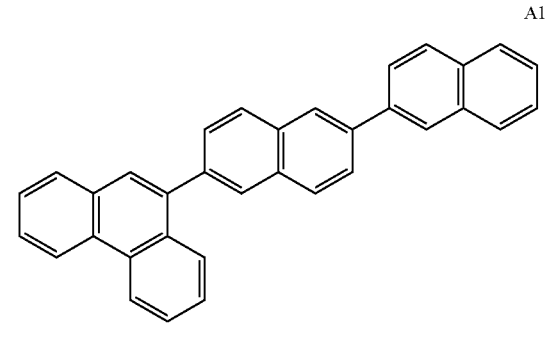

A2

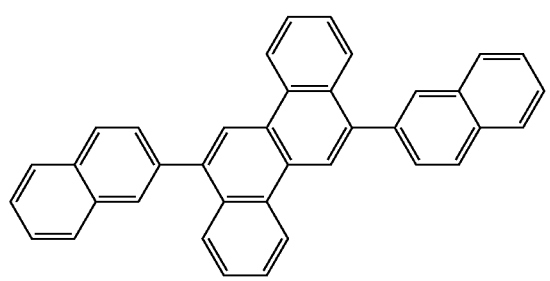

A3

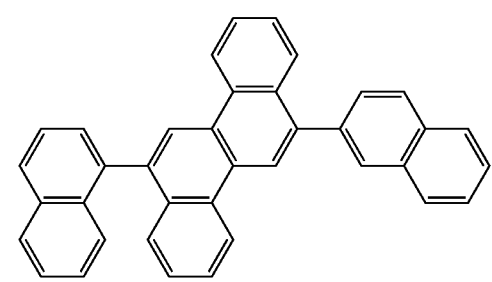

-continued

A4

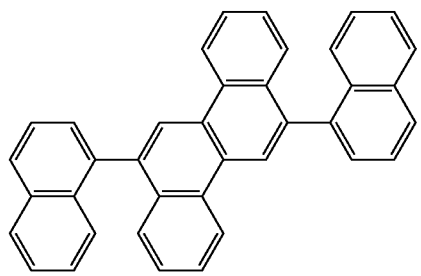

A5

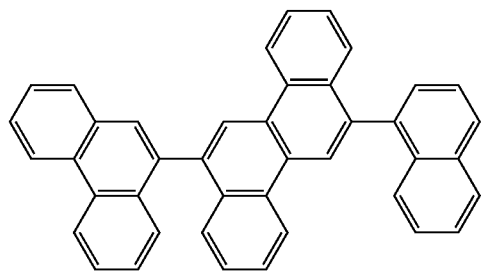

A6

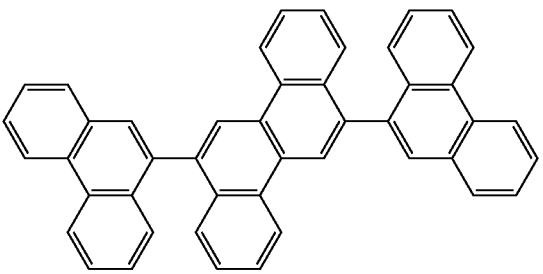

A7

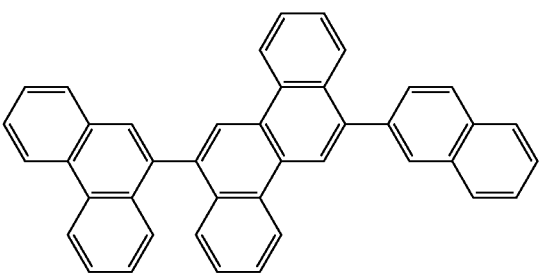

A8

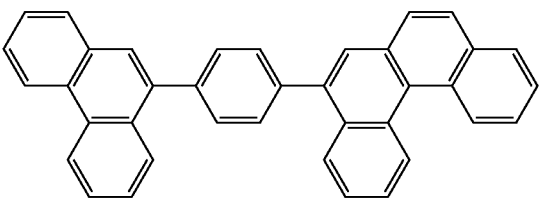

A9

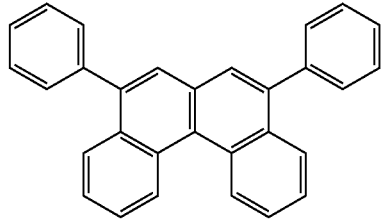

A10
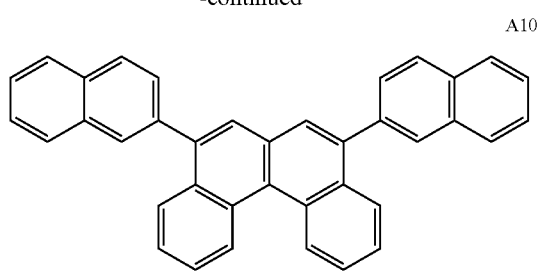
A11
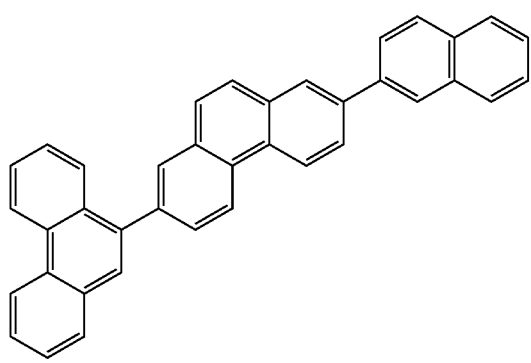
A12
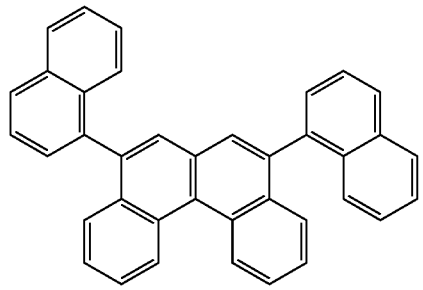
A13
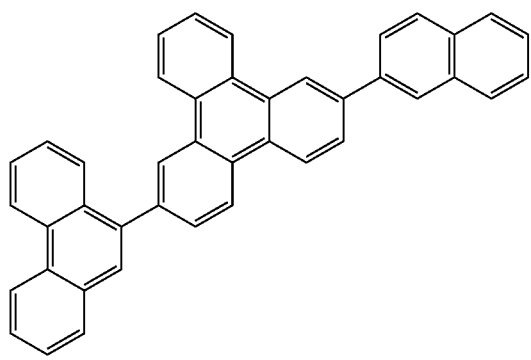
A14
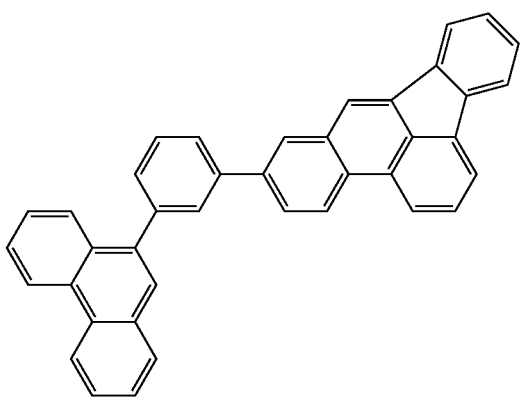
A15
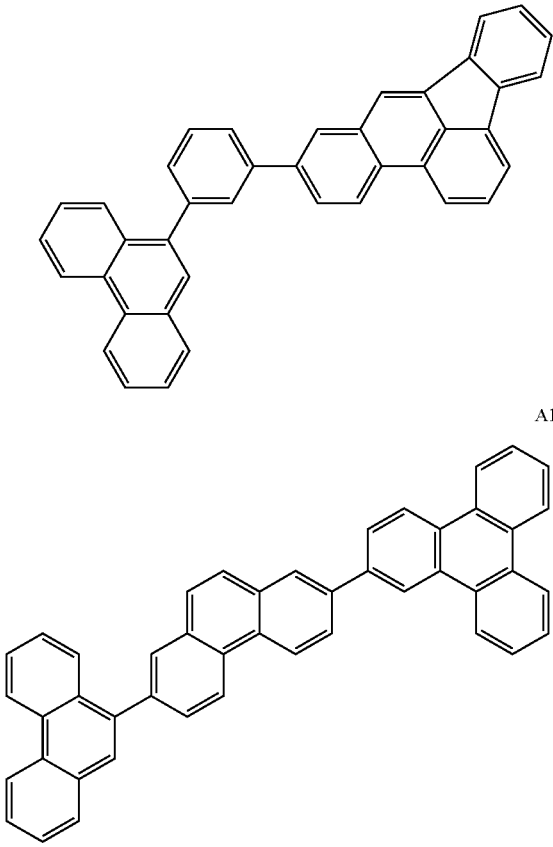
A16
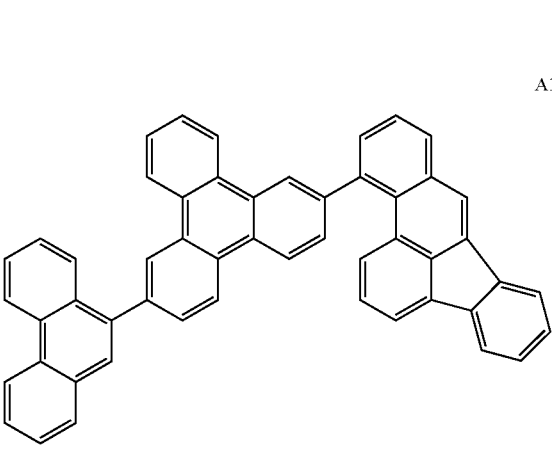
A17
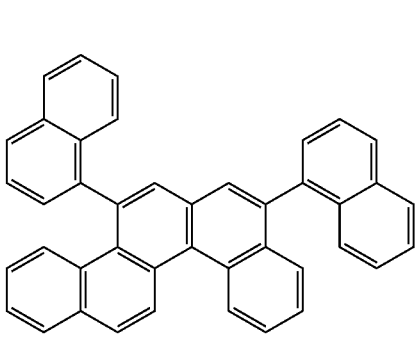

A18
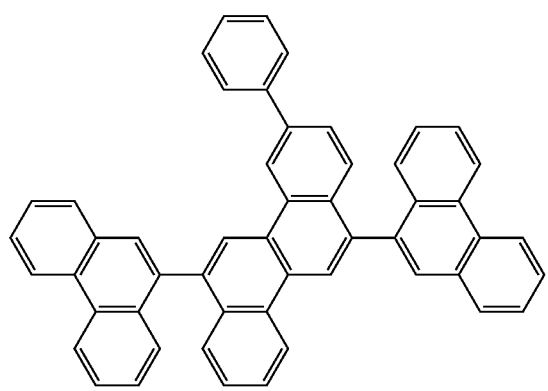
A19
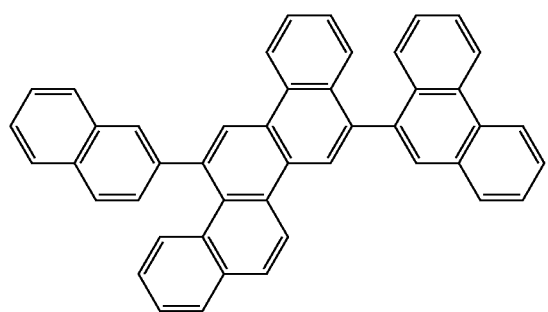
A20
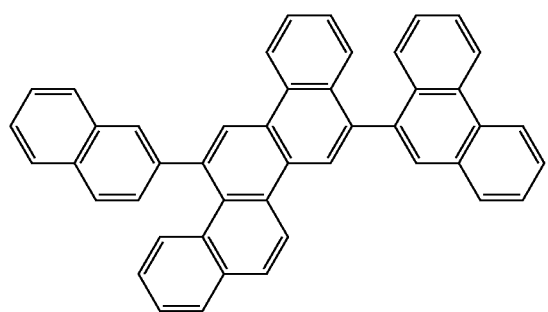
A21
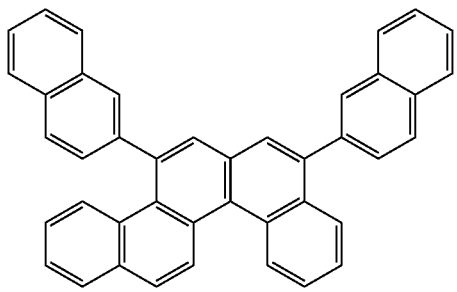
A22
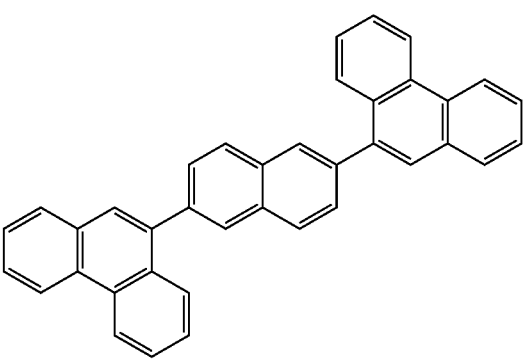
A23
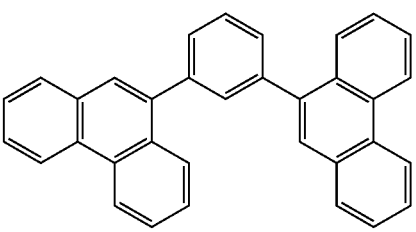
A24
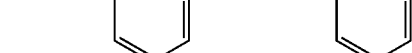
A25
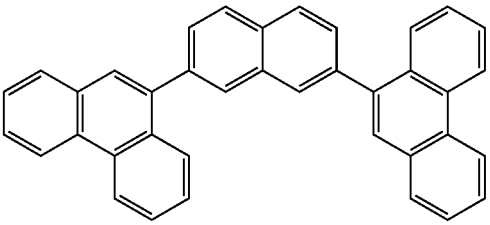
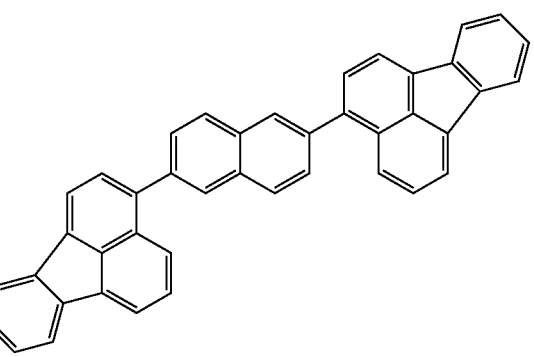
B1
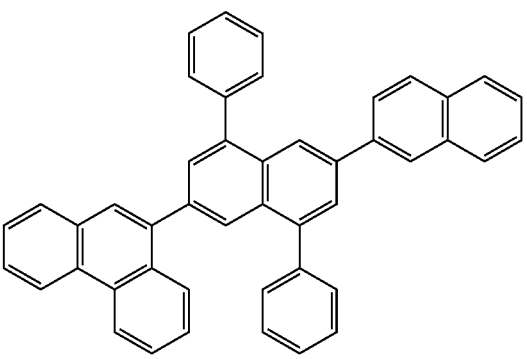

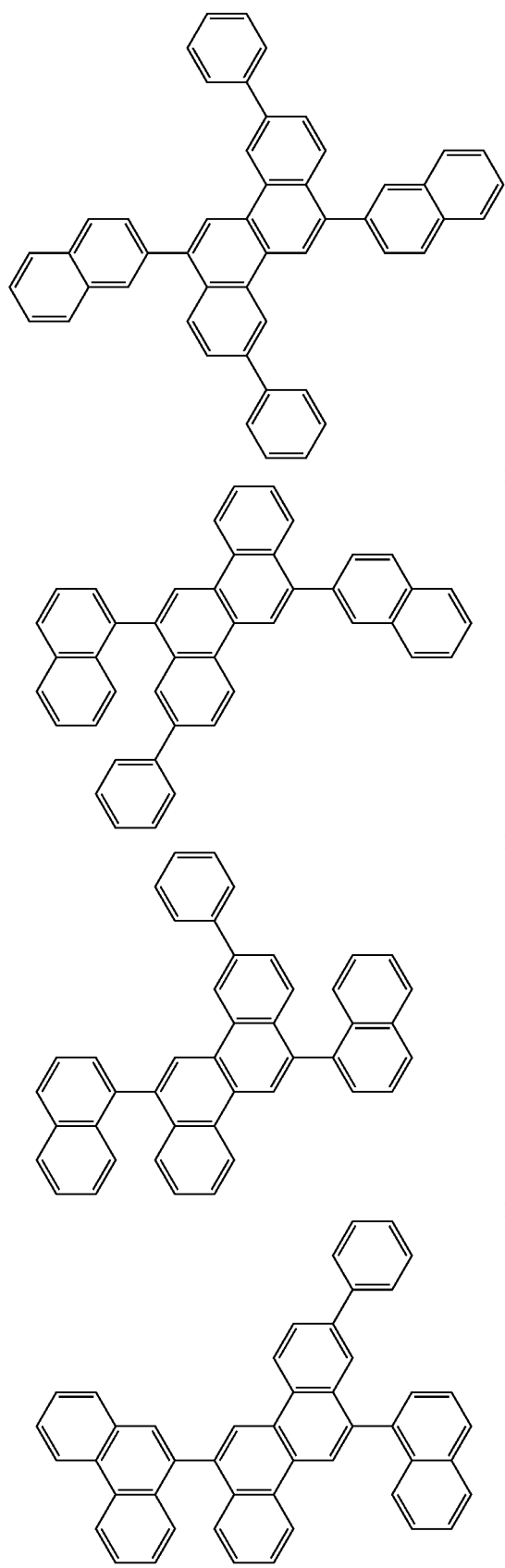
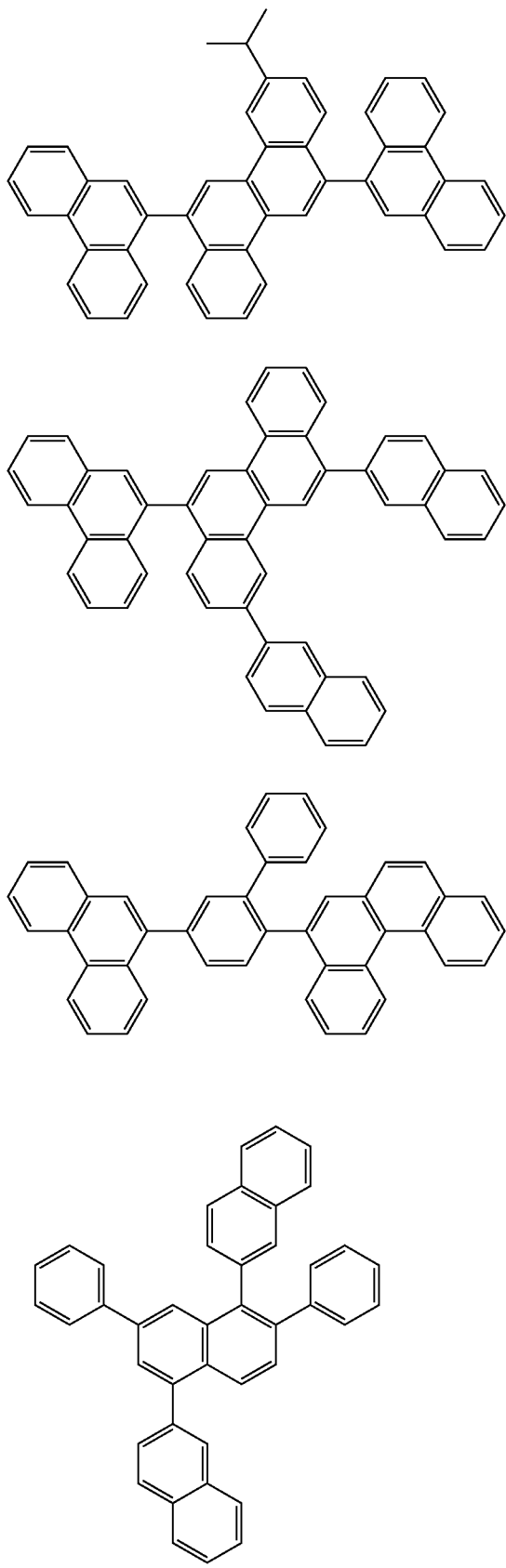

-continued
B10
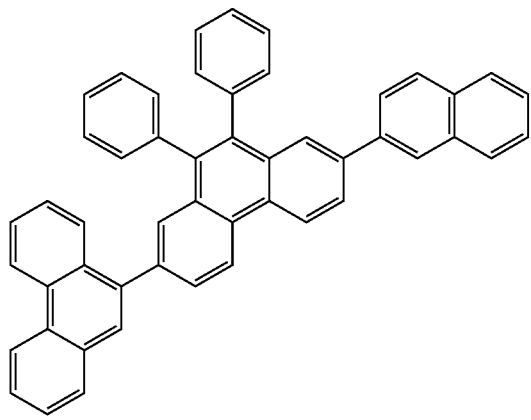
B11
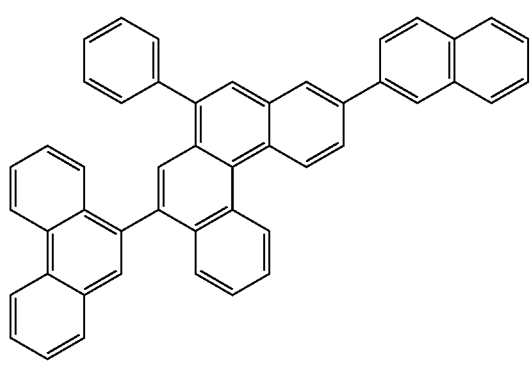
B12
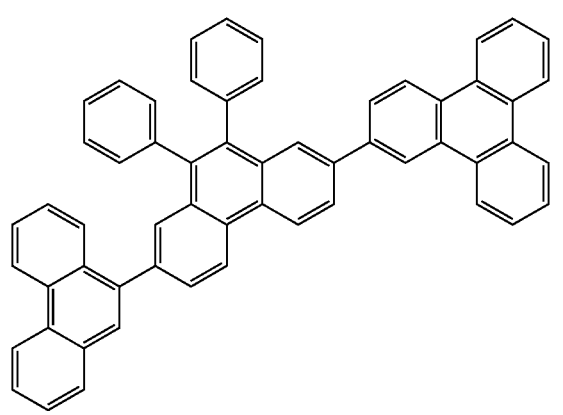
B13
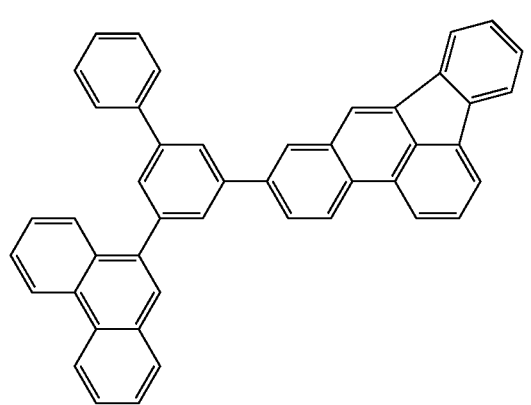
-continued
B14
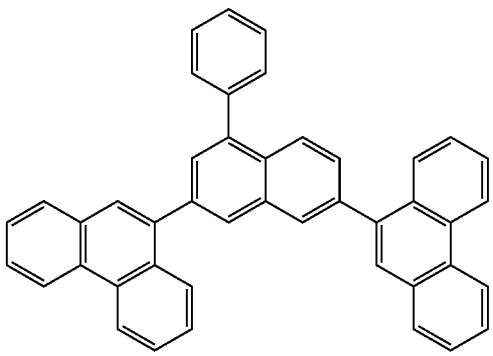
B15
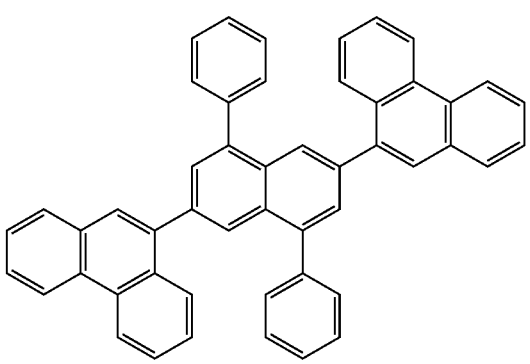
B16
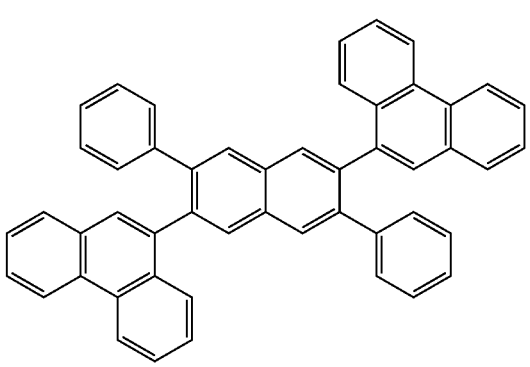
B17
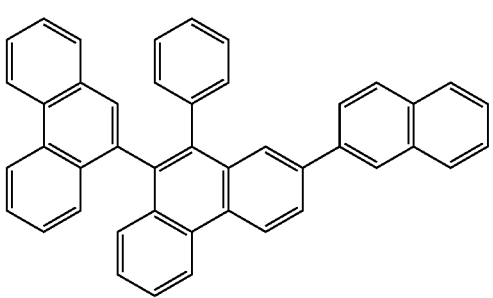

B18

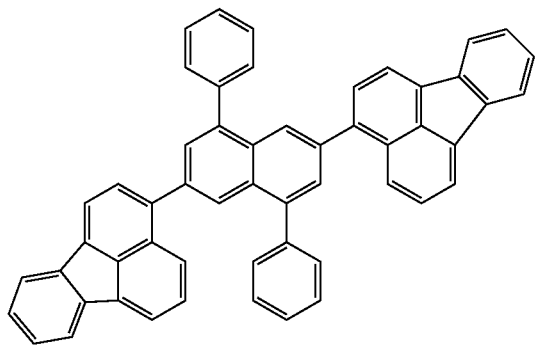

B19

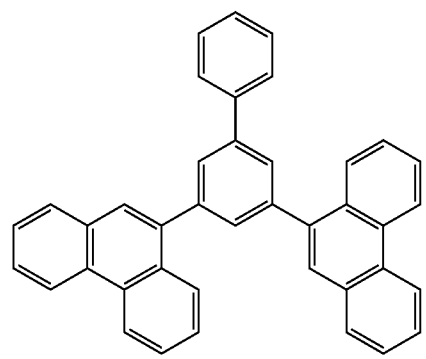

B20

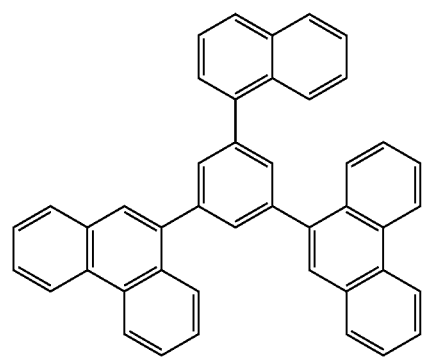

B21

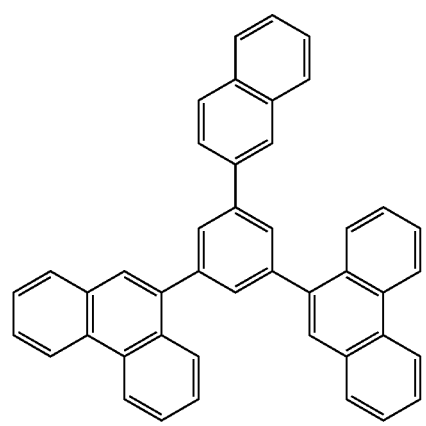

B22

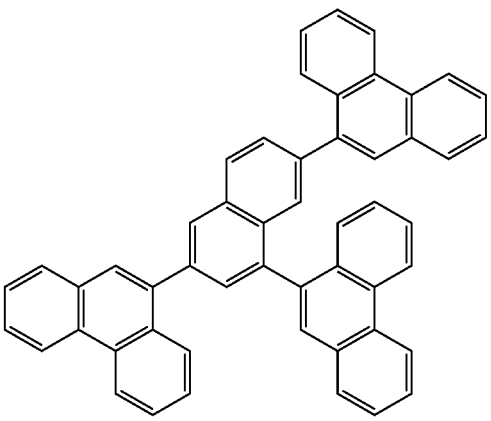

In the present invention, the phosphorescent material preferably contains a metal complex, and the metal complex preferably has a metal atom selected from Ir, Pt, Os, Au, Cu, Re and Ru, and an ligand. Particularly, the ligand preferably has an ortho-metal bond.

The phosphorescent material is preferably a compound containing a metal selected from iridium (Ir), osmium (Os) and platinum (Pt) because such a compound, which exhibits high phosphorescence quantum yield, can further enhance external quantum efficiency of the emitting device. The phosphorescent material is more preferably a metal complex such as an iridium complex, an osmium complex or a platinum complex, among which an iridium complex and a platinum complex are more preferable and ortho metalation of an iridium complex is the most preferable.

Examples of the preferable metal complexes are shown below, among which metal complexes that emit green to red light are particularly preferred.

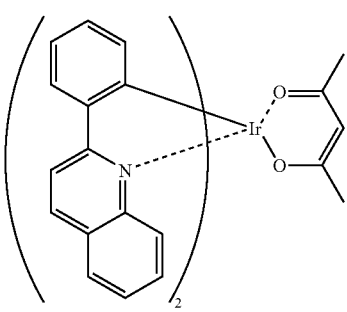

PQIr

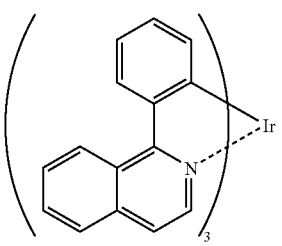

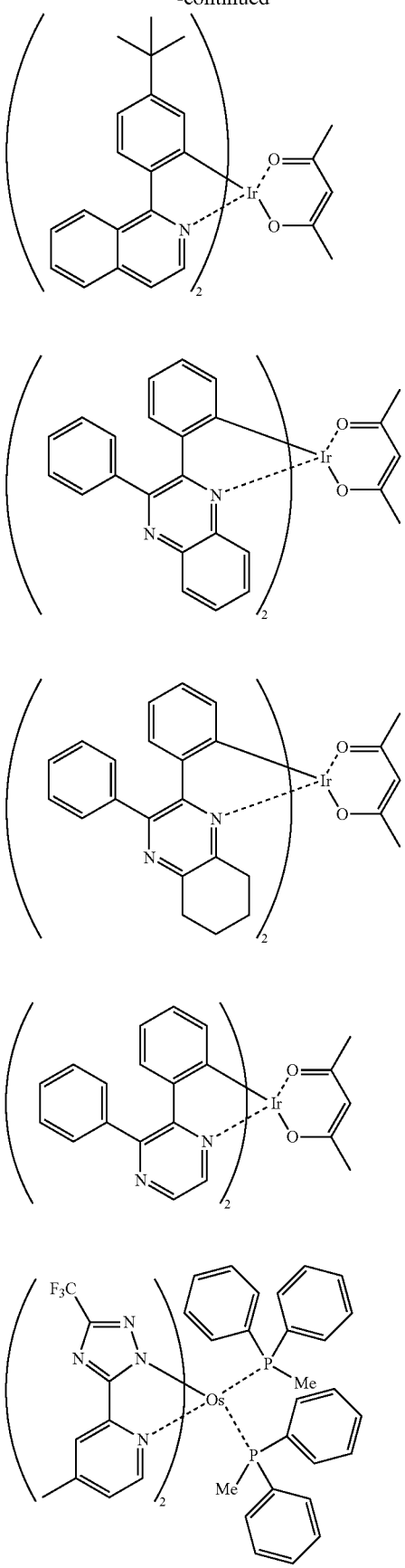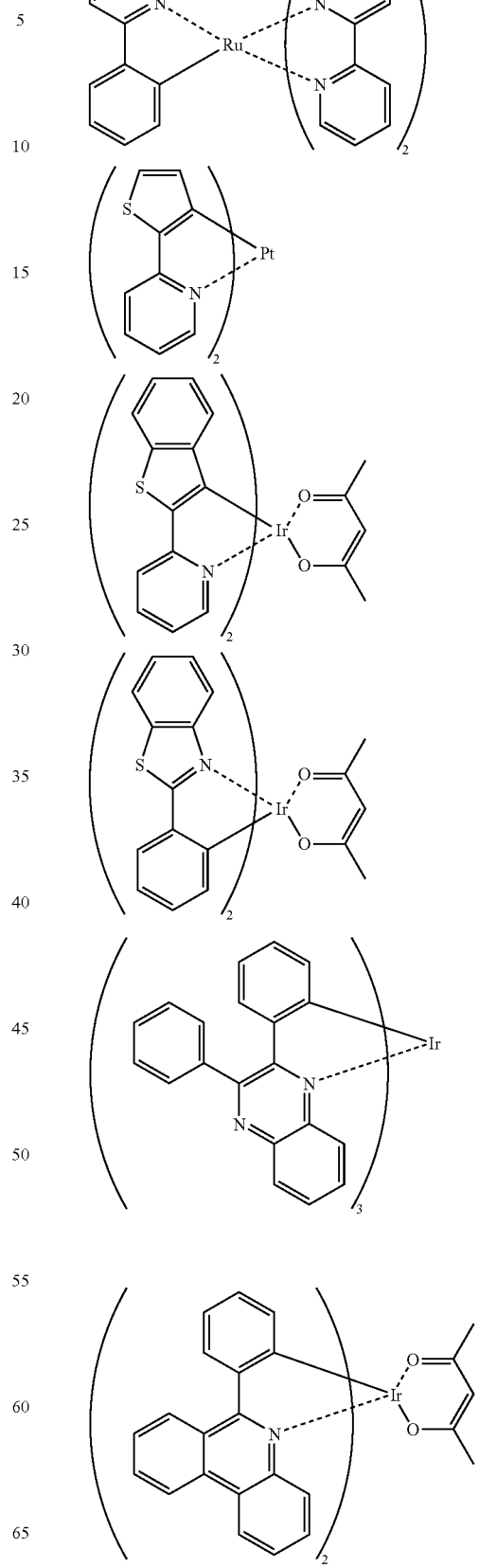

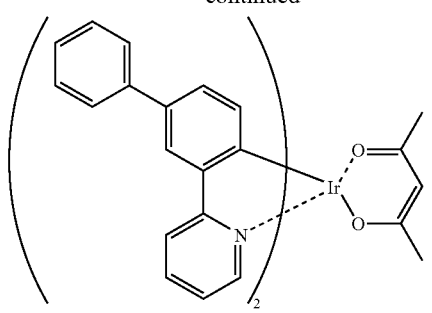
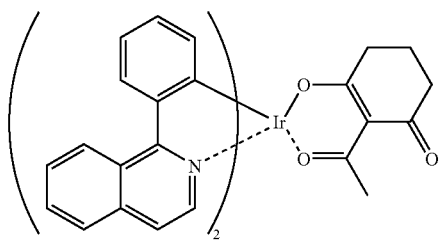
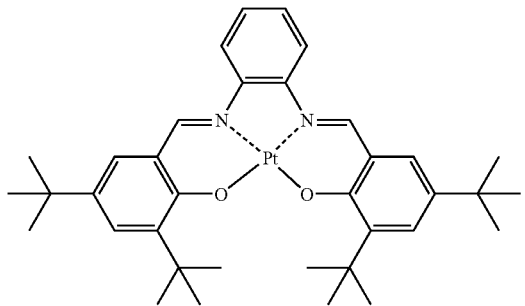
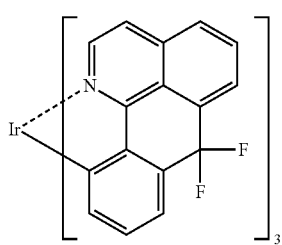
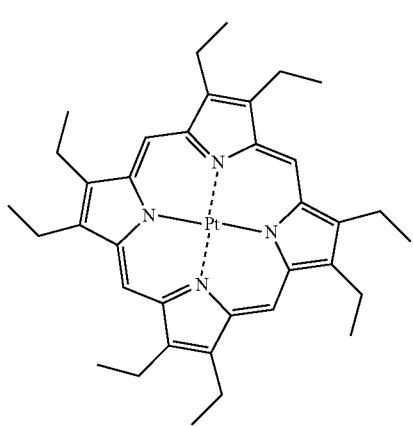
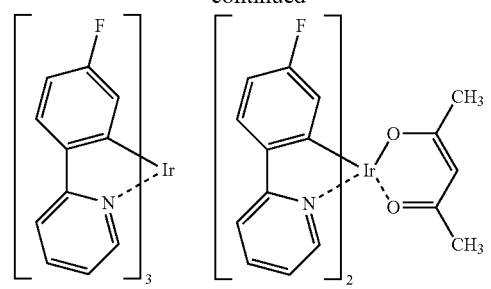
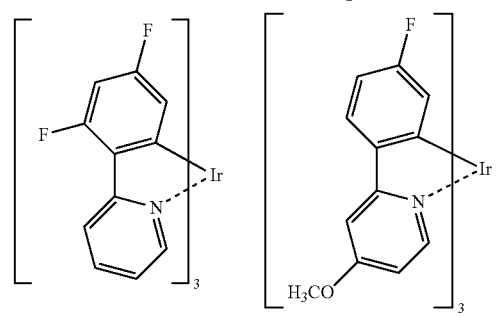
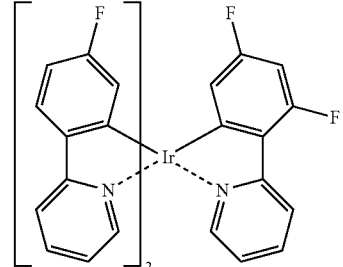

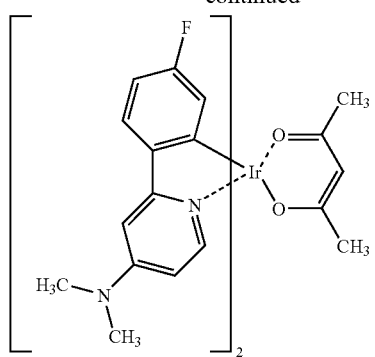
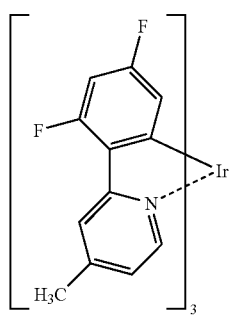
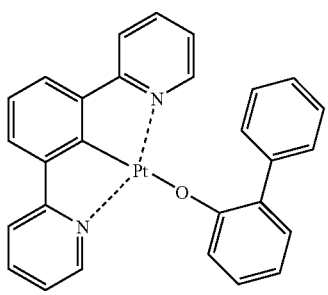
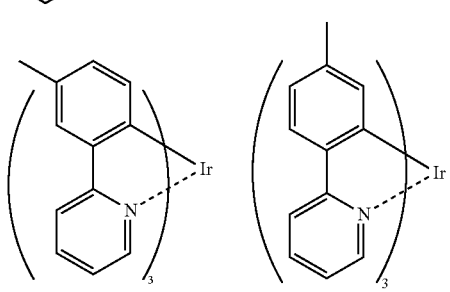
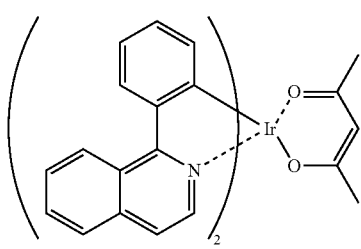
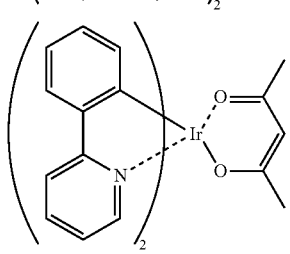
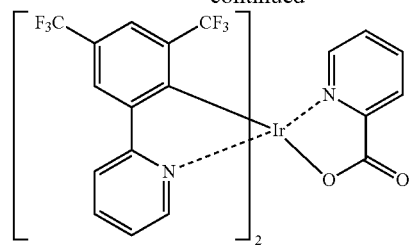
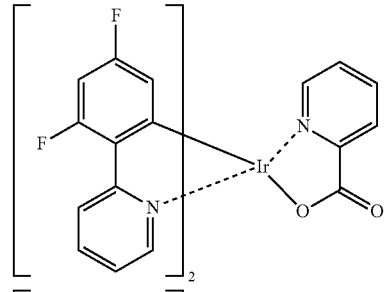
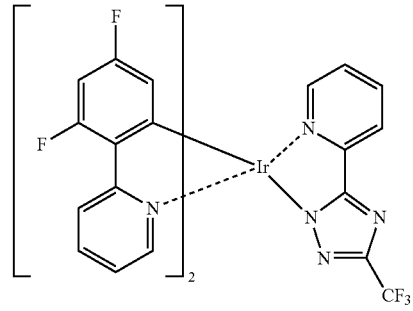
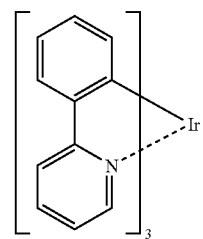
Ir(ppy)₃
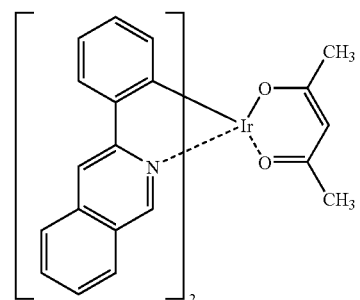
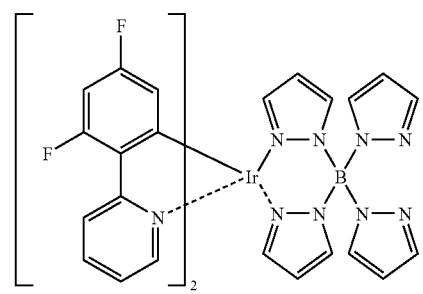

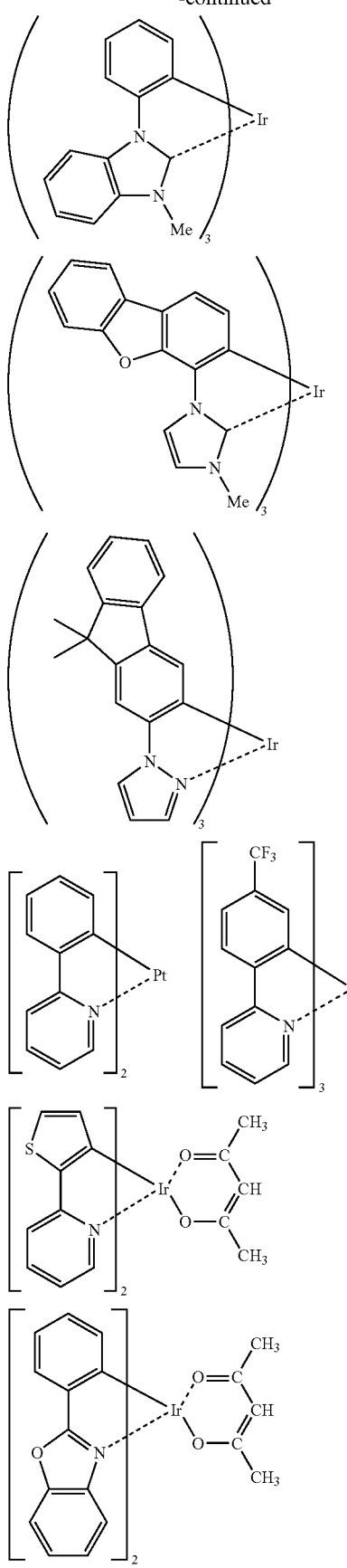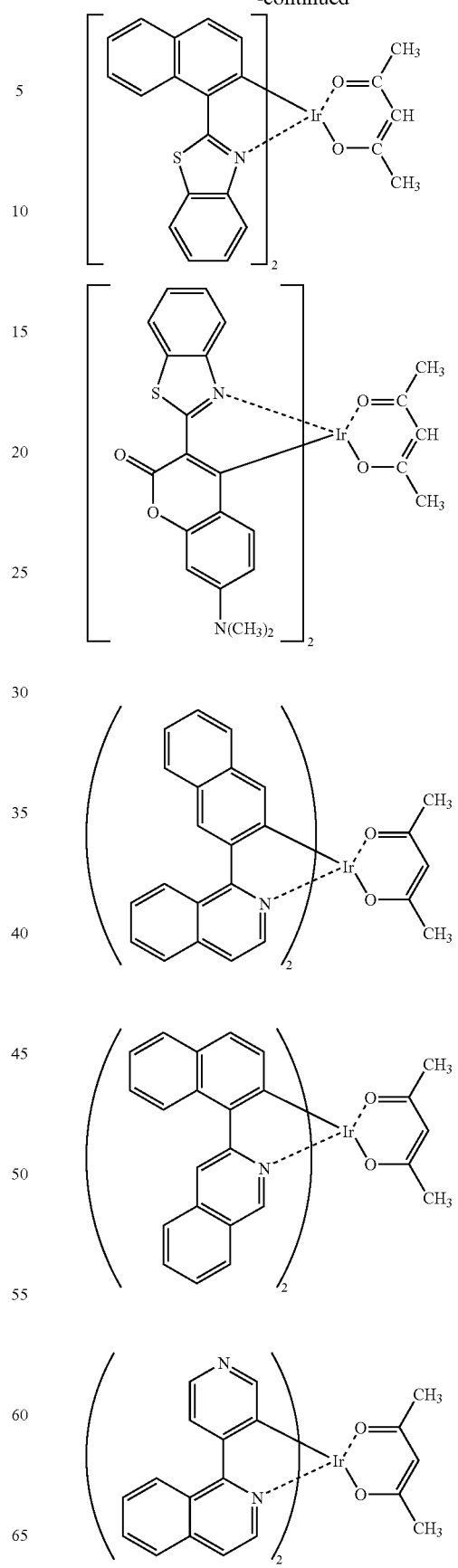

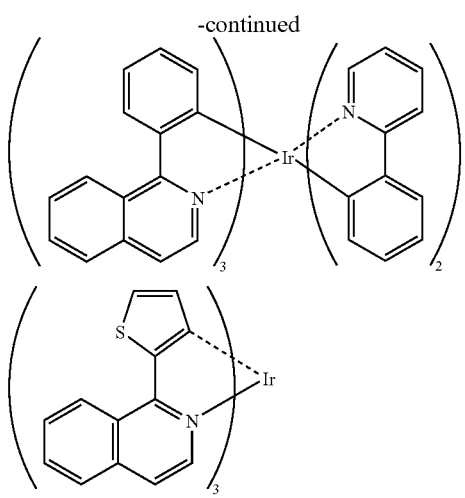

In the present invention, the maximum wavelength of light emission of the at least one phosphorescent material contained in the emitting layer is preferably in a range of 500 nm to 720 nm.

The maximum wavelength is more preferably in a range of 520 nm to 700 nm.

By doping the phosphorescent material (phosphorescent dopant) having such an emission wavelength to the specific host material usable for the present invention so as to form the emitting layer, the organic EL device can exhibit high efficiency.

The organic EL device according to the present invention may include the hole transporting layer (or the hole injecting layer). The hole transporting layer (or the hole injecting layer) may preferably contain the material for an organic EL device according to the present invention. Alternatively, when the organic EL device according to the present invention includes the electron transporting layer and/or the hole blocking layer, the electron transporting layer and/or the hole blocking layer may preferably contain the material for an organic El device according to the present invention.

In the organic EL device according to the present invention, a reductive dopant may be preferably contained in an interfacial region between the cathode and the organic thin-film layer.

With this arrangement, the organic EL device can emit light with enhanced luminance intensity and have a longer lifetime.

The reductive dopant may be at least one compound selected from an alkali metal, an alkali metal complex, an alkali metal compound, an alkali earth metal, an alkali earth metal complex, an alkali earth metal compound, a rare-earth metal, a rare-earth metal complex, a rare-earth metal compound and the like.

Examples of the alkali metal are Na (work function: 2.36 eV), K (work function: 2.28 eV), Rb (work function: 2.16 eV), Cs (work function: 1.95 eV) and the like, among which a substance having a work function of 2.9 eV or less is particularly preferable. Among the above, the reductive dopant is preferably K, Rb or Cs, more preferably Rb or Cs, the most preferably Cs.

Examples of the alkali earth metal are Ca (work function: 2.9 eV), Sr (work function: 2.0 to 2.5 eV), Ba (work function: 2.52 eV), and the like, among which a substance having a work function of 2.9 eV or less is particularly preferable.

Examples of the rare-earth metal are Sc, Y, Ce, Tb, Yb and the like, among which a substance having a work function of 2.9 eV or less is particularly preferable.

Since the above preferable metals have particularly high reducibility, addition of a relatively small amount of these alkali metals to an electron injecting zone can enhance luminance intensity and lifetime of the organic EL device.

Examples of the alkali metal compound are an alkali oxide such as $Li_2O$, $Cs_2O$ or $K_2O$, an alkali halogen compound such as LiF, NaF, CsF or KF and the like, among which LiF, $Li_2O$ and NaF are preferable.

Examples of the alkali earth metal compound are BaO, SrO, CaO, a mixture thereof such as $Ba_xSr_{1-x}O$ (0<x<1) or $Ba_xCa_{1-x}O$ (0<x<1) and the like, among which BaO, SrO and CaO are preferable.

Examples of the rare-earth metal compound are $YbF_3$, $ScF_3$, $ScO_3$, $Y_2O_3$, $Ce_2O_3$, $GdF_3$, $TbF_3$ and the like, among which $YbF_3$, $ScF_3$ and $TbF_3$ are preferable.

The alkali metal complex, the alkali earth metal complex and the rare-earth metal complex are not specifically limited, as long as at least one of alkali metal ion, alkali earth metal ion and rare-earth metal ion is contained therein as metal ion. A ligand for each of the complexes is preferably quinolinol, benzoquinolinol, acridinol, phenanthridinol, hydroxyphenyl oxazole, hydroxyphenyl thiazole, hydroxydiaryl oxadiazole, hydroxydiaryl thiadiazole, hydroxyphenyl pyridine, hydroxyphenyl benzoimidazole, hydroxybenzo triazole, hydroxy fluborane, bipyridyl, phenanthroline, phthalocyanine, porphyrin, cyclopentadiene, β-diketones, azomethines, or a derivative thereof, but the ligand is not limited thereto.

The reductive dopant is added to preferably form a layer or an island pattern in the interfacial region. The layer of the reductive dopant or the island pattern of the reductive dopant is preferably formed by depositing the reductive dopant by resistance heating deposition while an emitting material for forming the interfacial region or an organic substance as an electron-injecting material are simultaneously deposited, so that the reductive dopant is dispersed in the organic substance. Dispersion concentration at which the reductive dopant is dispersed in the organic substance is a mole ratio (organic substance to reductive dopant) of 100:1 to 1:100, preferably 5:1 to 1:5.

When the reductive dopant forms the layer, the emitting material or the electron injecting material for forming the organic layer of the interfacial region is initially layered, and the reductive dopant is subsequently deposited singularly thereon by resistance heating deposition to form a preferably 0.1 to 15 nm-thick layer.

When the reductive dopant forms the island pattern, the emitting material or the electron injecting material for forming the organic layer of the interfacial region is initially formed in an island shape, and the reductive dopant is subsequently deposited singularly thereon by resistance heating deposition to form a preferably 0.05 to 1 nm-thick island shape.

A ratio of the main component to the reductive dopant in the organic EL device according to the present invention is preferably a mole ratio (main component to reductive dopant) of 5:1 to 1:5, more preferably 2:1 to 1:2.

The organic EL device according to the present invention preferably includes the electron injecting layer between the emitting layer and the cathode, and the electron injecting layer preferably contains a nitrogen-containing cyclic derivative as the main component. The electron injecting layer may serve as the electron transporting layer.

It should be noted that "as the main component" means that the nitrogen-containing cyclic derivative is contained in the electron injecting layer with a content of 50 mass % or more.

The electron injecting layer or the electron transporting layer, which aids injection of the electrons into the emitting layer, has a high electron mobility. The electron injecting layer is provided for adjusting energy level, by which, for instance, sudden changes of the energy level can be reduced.

A preferable example of an electron transporting material for forming the electron injecting layer is an aromatic heterocyclic compound having in the molecule at least one heteroatom. Particularly, a nitrogen-containing cyclic derivative is preferable. The nitrogen-containing cyclic derivative is preferably an aromatic ring having a nitrogen-containing six-membered or five-membered ring skeleton, or a condensed aromatic cyclic compound having a nitrogen-containing six-membered or five-membered ring skeleton.

A preferable example of the nitrogen-containing cyclic derivative is a nitrogen-containing cyclic metal chelate complex represented by the following formula (A).

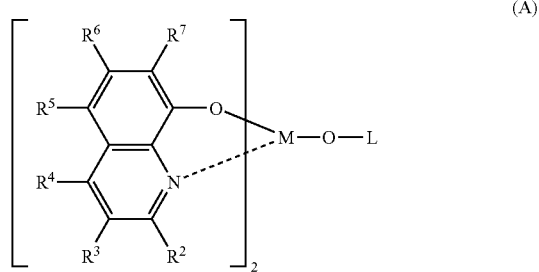

In the formula, $R^2$ to $R^7$ each independently represent a hydrogen atom, a halogen atom, an oxy group, an amino group, a hydrocarbon group having 1 to 40 carbon atoms, an alkoxy group, an aryloxy group, an alkoxycarbonyl group or a heterocyclic group. $R^2$ to $R^7$ may be substituted or unsubstituted.

Examples of the halogen atom are fluorine, chlorine, bromine, iodine and the like. Examples of a substituted or unsubstituted amino group are an alkylamino group, an arylamino group and an aralkylamino group.

Examples of the hydrocarbon group having 1 to 40 carbon atoms are a substituted or unsubstituted alkyl group, an alkenyl group, a cycloalkyl group, an aryl group, an aralkyl group and the like.

Examples of the alkyl group are a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, 1-methylpentyl group, 2-methylpentyl group, 1-pentylhexyl group, 1-butylpentyl group, 1-heptyloctyl group, 3-methylpentyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 1,2-dinitroethyl group, 2,3-dinitro-t-butyl group and 1,2,3-trinitropropyl group.

Among the above, the alkyl group is preferably a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, an neopentyl group, a 1-methylpentyl group, a 1-pentylhexyl group, a 1-butylpentyl group, or a 1-heptyloctyl group.

Examples of the alkenyl group are a vinyl group, allyl group, 1-butenyl group, 2-butenyl group, 3-butenyl group, 1,3-butanedienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group and 3-phenyl-1-butenyl group, among which a styryl group, 2,2-diphenylvinyl group, 1,2-diphenylvinyl group and the like are preferable.

Examples of the cycloalkyl group are a cyclopentyl group, cyclohexyl group, cyclooctyl group, and 3,5-tetramethylcyclohexyl group, among which cyclohexyl group, cyclooctyl group and 3,5-tetramethylcyclohexyl group are preferable.

The alkoxy group is a group represented by —OY. Examples of Y are the same as the examples described in relation to the alkyl group, and preferable examples of Y are also the same as those described in relation to the alkyl group.

Examples of non-condensed aryl group are a phenyl group, biphenyl-2-yl group, biphenyl-3-yl group, biphenyl-4-yl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 4'-methylbiphenylyl group, 4"-t-butyl-p-terphenyl-4-yl group, o-cumenyl group, m-cumenyl group, p-cumenyl group, 2,3-xylyl group, 3,4-xylyl group, 2,5-xylyl group, mesityl group, m-quater-phenyl group and the like.

Among the above, a phenyl group, a biphenyl-2-yl group, a biphenyl-3-yl group, a biphenyl-4-yl group, an m-terphenyl-4-yl group, an m-terphenyl-3-yl group, an m-terphenyl-2-yl group, a p-tolyl group, a 3,4-xylyl group, an m-quater-phenyl-2-yl group are preferable.

Examples of a condensed aryl group are a 1-naphthyl group and 2-naphthyl group.

The heterocyclic group, which may be monocyclic or condensed, preferably has 1 to 20 carbon atoms forming the ring, more preferably 1 to 12 carbon atoms forming the ring, further preferably 2 to 10 carbon atoms forming the ring. The heterocyclic group is an aromatic heterocyclic group having at least one heteroatom selected from a nitrogen atom, an oxygen atom, a sulfur atom and a selenium atom. Examples of the heterocyclic group are groups induced by pyrrolidine, piperidine, piperazine, morpholine, thiophene, selenophene, furane, pyrrole, imidazole, pyrazole, pyridine, pyrazine, pyridazine, pyrimidine, triazole, triazine, indole, indazole, purine, thiazoline, thiazole, thiadiazole, oxazoline, oxazole, oxadiazole, quinoline, isoquinoline, phthalazine, naphthyridine, quinoxaline, quinazoline, cinnoline, pteridine, acridine, phenanthroline, phenazine, tetrazole, benzoimidazole, benzooxazole, benzothiazole, benzotriazole, tetra-aza indene, carbazole, azepine and the lile, preferably groups induced by furane, thiophene, pyridine, pyrazine, pyrimidine, pyridazine, triazine, quinoline, phthalazine, naphthyridine, quinoxaline and quinazoline, further preferably groups induced by frane, thiophene, pyridine and quinoline, furthermore preferably a quinolinyl group.

Examples of the aralkyl group are a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, 1-chloro-2-phenylisopropyl group and the like.

Among the above, a benzyl group, p-cyanobenzyl group, m-cyanobenzyl group, o-cyanobenzyl group, 1-phenylethyl group, 2-phenylethyl group, 1-phenylisopropyl group and 2-phenylisopropyl group are preferable.

The aryloxy group is represented by —OY'. Preferable examples of Y' are a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group and the like.

A heteroaryloxy group of the aryloxy group is represented by —OZ'. Examples of Z' are a 2-pyrroyl group, 3-pyrroryl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 11,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl 1-indolyl group, 4-t-butyl 1-indolyl group, 2-t-butyl 3-indolyl group, 4-t-butyl 3-indolyl group and the like.

The alkoxycarbonyl group is represented by —COOY'. Examples of Y' are the same as the examples of the alkyl group.

The alkylamino group and the aralkylamino group are represented by —NQ$^1$Q$^2$. Examples for each of Q$^1$ and Q$^2$ are the same as the examples described in relation to the alkyl group and the aralkyl group, and preferable examples for each of Q$^1$ and Q$^2$ are also the same as those described in relation to the alkyl group and the aralkyl group. Either one of Q$^1$ and Q$^2$ may be a hydrogen atom.

The arylamino group is represented by —NAr$^1$Ar$^2$. Examples for each of Ar$^1$ and Ar$^2$ are the same as the examples described in relation to the non-condensed aryl group and the condensed aryl group. Either one of $Ar^1$ and $Ar^2$ may be a hydrogen atom.

M represents aluminum (Al), gallium (Ga) or indium (In), among which In is preferable.

L in the formula (A) represents a group represented by the following formula (A') or the following formula (A").

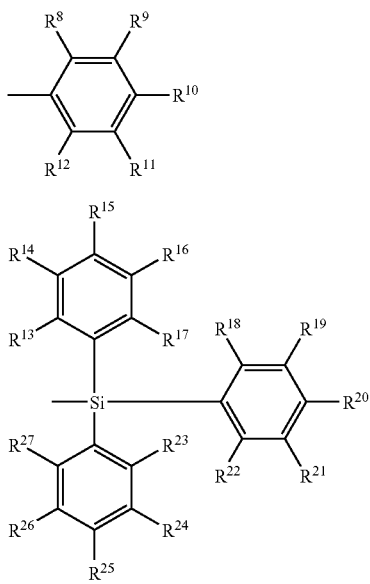

In the formula, $R^8$ to $R^{12}$ each independently represent a hydrogen atom or a substituted or unsubstituted hydrocarbon group having 1 to 40 carbon atoms. Adjacent groups may form a cyclic structure. $R^{13}$ to $R^{27}$ each independently represent a hydrogen atom or a substituted or unsubstituted hydrocarbon group having 1 to 40 carbon atoms. Adjacent groups may form a cyclic structure.

Examples of the hydrocarbon group having 1 to 40 carbon atoms represented by each of $R^8$ to $R^{12}$ and $R^{13}$ to $R^{27}$ in the formulae (A') and (A") are the same as those of $R^2$ to $R^7$.

Examples of a divalent group formed when an adjacent set of $R^8$ to $R^{12}$ and $R^{13}$ to $R^{27}$ forms a cyclic structure are a tetramethylene group, a pentamethylene group, a hexamethylene group, a diphenylmethane-2,2'-diyl group, a diphenylethane-3,3'-diyl group, a diphenylpropane-4,4'-diyl group and the like.

Examples of the nitrogen-containing cyclic metal chelate complex represented by the formula (A) will be shown below. However, the nitrogen-containing cyclic metal chelate complex is not limited to the exemplary compounds shown below.

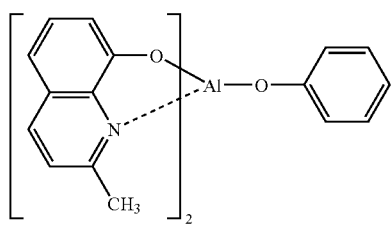

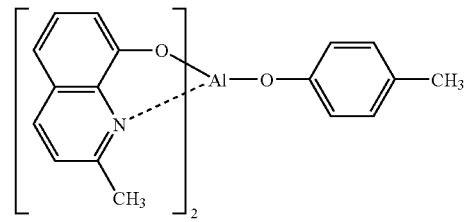

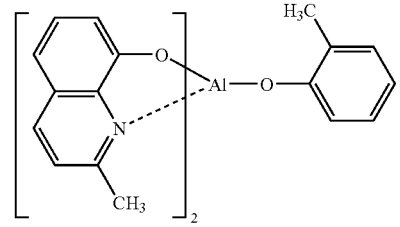

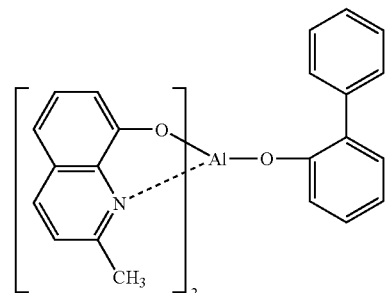

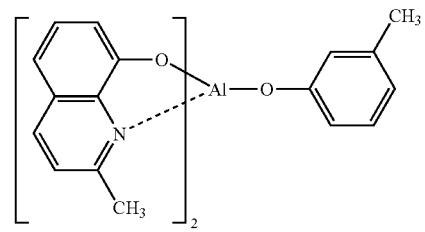

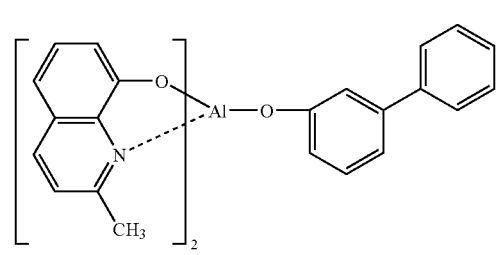

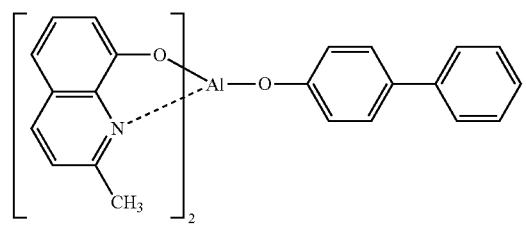

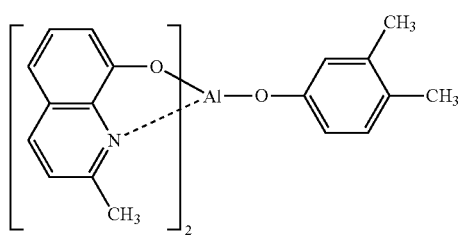 (A-8)
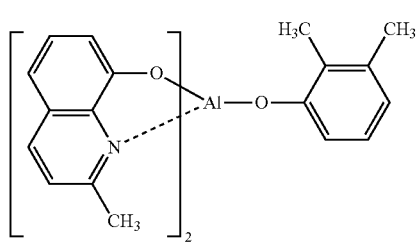 (A-9)
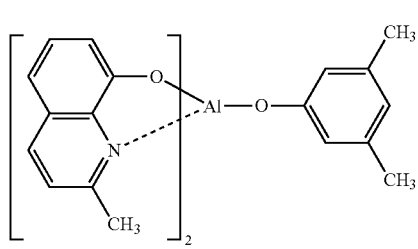 (A-10)
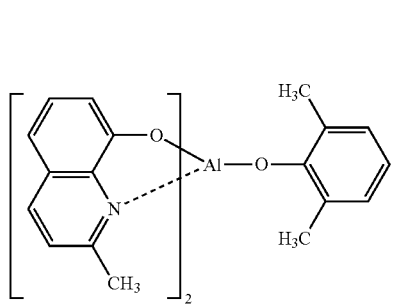 (A-11)
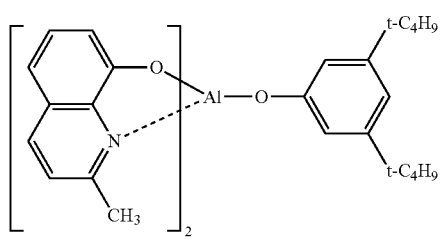 (A-12)
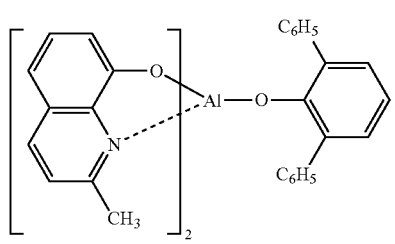 (A-13)
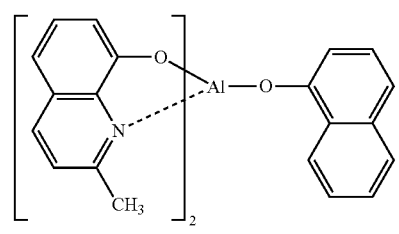 (A-14)
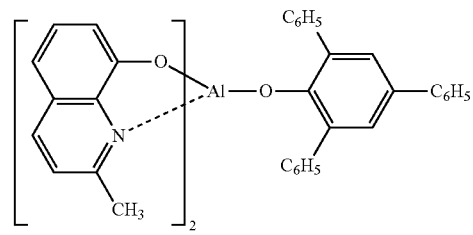 (A-15)
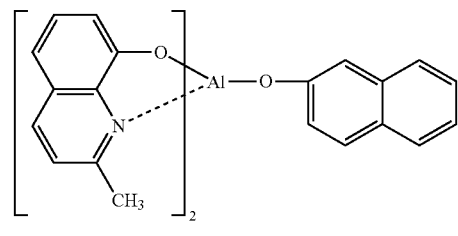 (A-16)
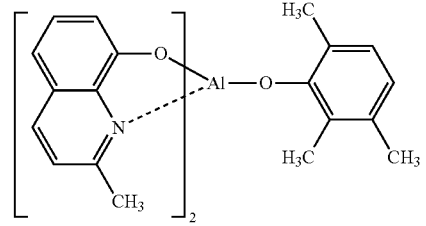 (A-17)
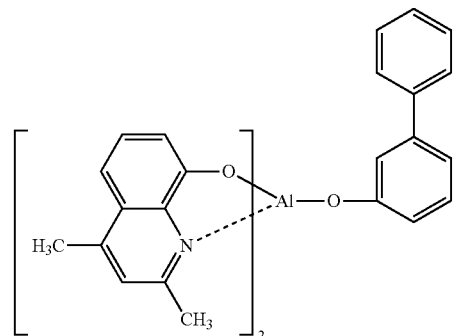 (A-18)
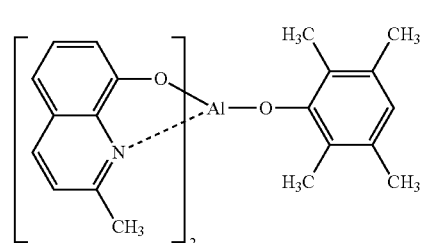 (A-19)

(A-20)
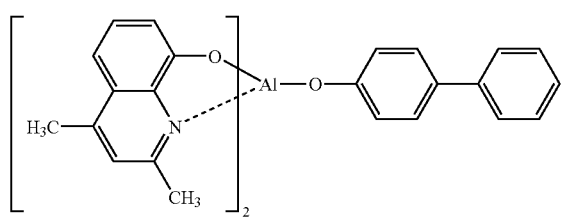
(A-21)
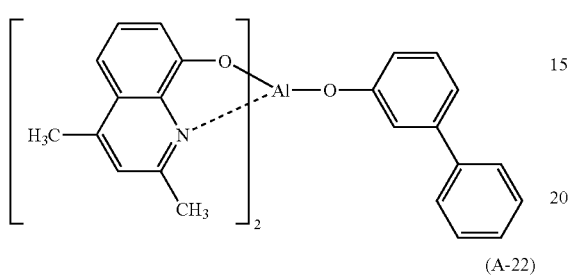
(A-22)
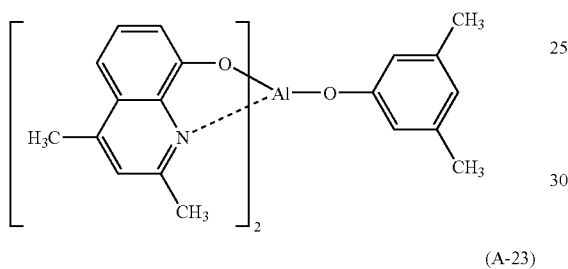
(A-23)
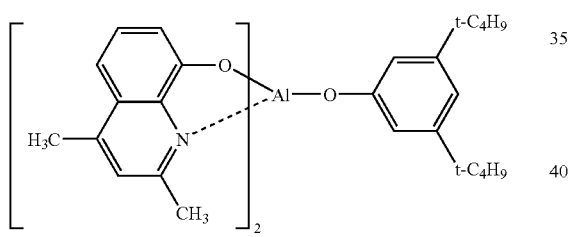
(A-24)
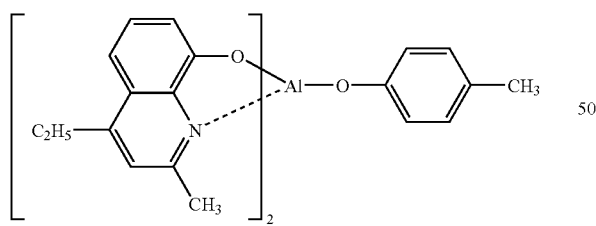
(A-25)
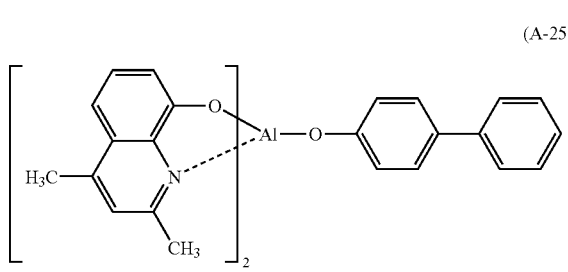
(A-26)
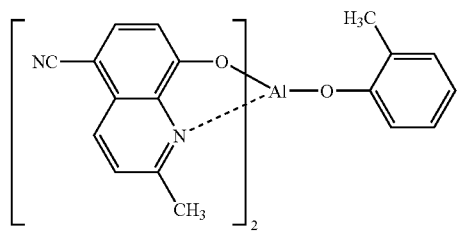
(A-27)
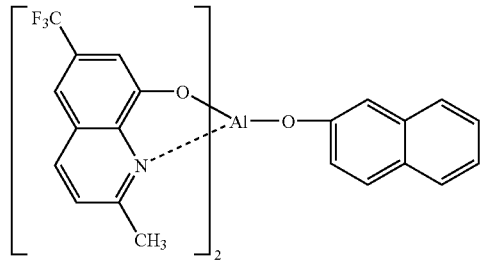
(A-28)
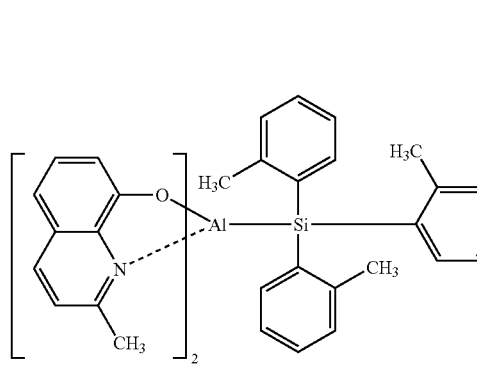
(A-29)
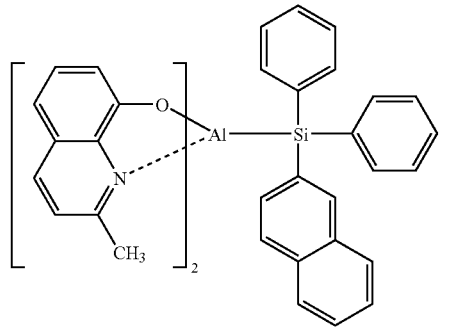
(A-30)
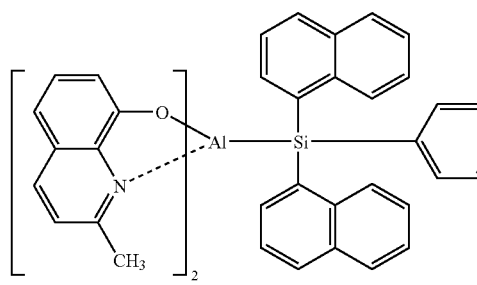

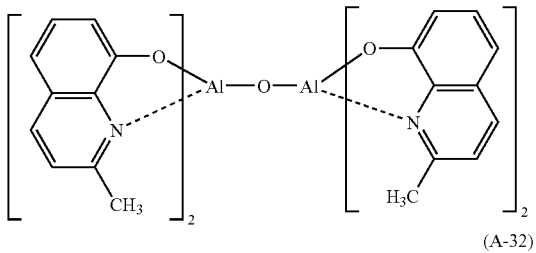
(A-31)

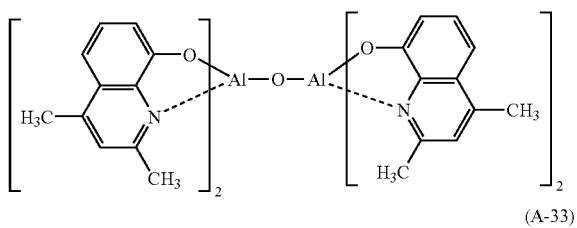
(A-32)

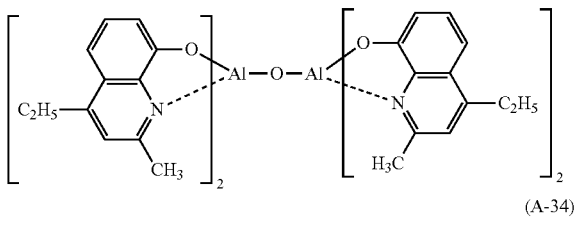
(A-33)

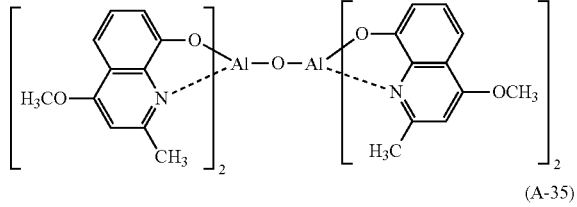
(A-34)

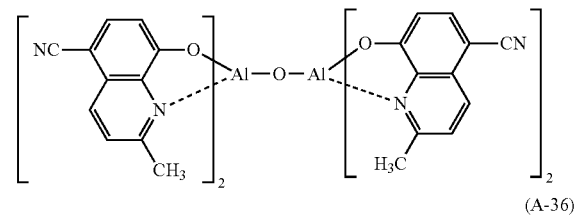
(A-35)

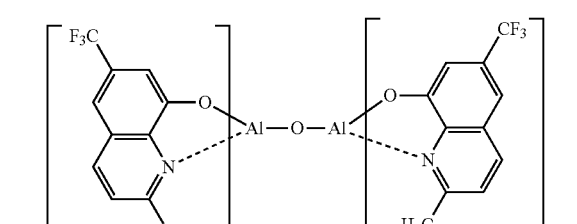
(A-36)

According to the present invention, the electron injecting layer or the electron transporting layer preferably contains a nitrogen-containing heterocyclic derivative.

The electron injecting layer or the electron transporting layer, which aids injection of the electrons into the emitting layer, has a high electron mobility. The electron injecting layer is provided for adjusting energy level, by which, for instance, sudden changes of the energy level can be reduced. As a material for the electron injecting layer or the electron transporting layer, 8-hydroxyquinoline or a metal complex of its derivative, an oxadiazole derivative and a nitrogen-containing heterocyclic derivative are preferable. An example of the 8-hydroxyquinoline or the metal complex of its derivative is a metal chelate oxinoid compound containing a chelate of oxine (typically 8-quinolinol or 8-hydroxyquinoline). For instance, tris(8-quinolinol) aluminum can be used. Examples of the oxadiazole derivative are as follows.

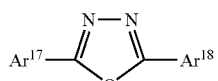

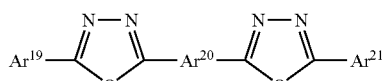

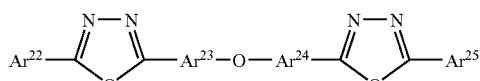

In the formula, $Ar^{17}$, $Ar^{18}$, $Ar^{19}$, $Ar^{21}$, $Ar^{22}$ and $Ar^{25}$ each represent a substituted or unsubstituted aryl group. $Ar^{17}$, $Ar^{19}$ and $Ar^{22}$ may be respectively the same as or different from $Ar^{18}$, $Ar^{21}$ and $Ar^{25}$. $Ar^{20}$, $Ar^{23}$ and $Ar^{24}$ each represent a substituted or unsubstituted arylene group. $Ar^{23}$ and $Ar^{24}$ may be mutually the same or different.

Examples of the arylene group are a phenylene group, a naphthylene group, a biphenylene group, an anthranylene group, a perylenylene group and a pyrenylene group. Examples of the substituent therefor are an alkyl group having 1 to 10 carbon atoms, an alkoxy group having 1 to 10 carbon atoms and a cyano group. Such an electron transport compound is preferably an electron transport compound that can be favorably formed into a thin film(s). Examples of the electron transport compounds are as follows.

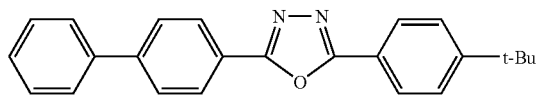

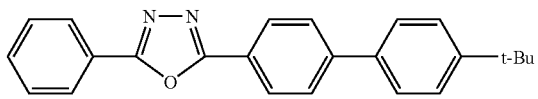

-continued

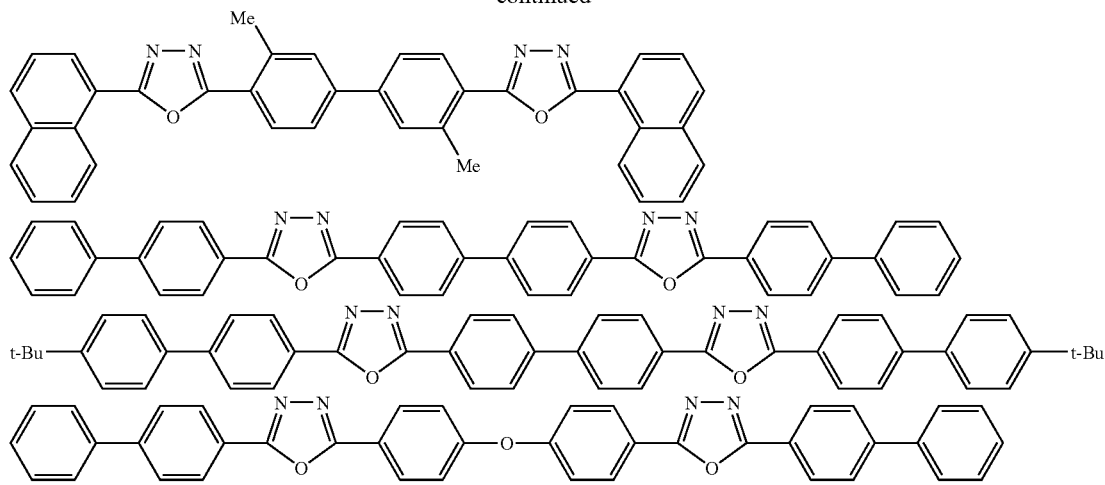

An example of the nitrogen-containing heterocyclic derivative is a nitrogen-containing compound that is not a metal complex, the derivative being formed of an organic compound represented by one of the following general formulae. Examples of the nitrogen-containing heterocyclic derivative are five-membered ring or six-membered ring derivative having a skeleton represented by the formula (A) and a derivative having a structure represented by the formula (B).

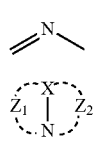

(A)

(B)

In the formula (B), X represents a carbon atom or a nitrogen atom. $Z_1$ and $Z_2$ each independently represent an atom group from which a nitrogen-containing heterocycle can be formed.

(C)

Preferably, the nitrogen-containing heterocyclic derivative is an organic compound having a nitrogen-containing aromatic polycyclic group having a five-membered ring or six-membered ring. When the nitrogen-containing heterocyclic derivative is such a nitrogen-containing aromatic polycyclic group that contains plural nitrogen atoms, the nitrogen-containing heterocyclic derivative may be a nitrogen-containing aromatic polycyclic organic compound having a skeleton formed by a combination of the skeletons respectively represented by the formulae (A) and (B), or by a combination of the skeletons respectively represented by the formulae (A) and (C).

A nitrogen-containing group of the nitrogen-containing organic compound is selected from nitrogen-containing heterocyclic groups respectively represented by the following general formulae.

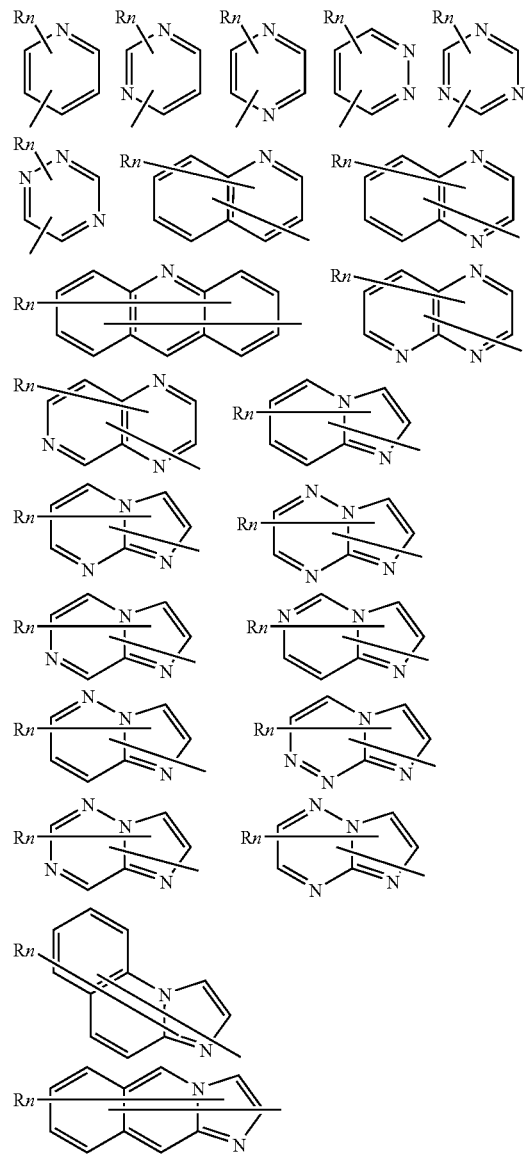

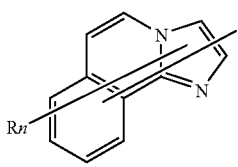

In the formulae: R represents an aryl group having 6 to 40 carbon atoms, a heteroaryl group having 3 to 40 carbon atoms, an alkyl group having 1 to 20 carbon atoms or an alkoxy group having 1 to 20 carbon atoms; and n represents an integer in a range of 0 to 5. When n is an integer of 2 or more, plural R may be mutually the same or different.

A preferable specific compound is a nitrogen-containing heterocyclic derivative represented by the following formula.

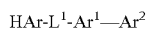

In the formula, HAr represents a substituted or unsubstituted nitrogen-containing heterocycle having 3 to 40 carbon atoms; $L^1$ represents a single bond, a substituted or unsubstituted arylene group having 6 to 40 carbon atoms, or a substituted or unsubstituted heteroarylene group having 3 to 40 carbon atoms; $Ar^1$ represents a substituted or unsubstituted divalent aromatic hydrocarbon group having 6 to 40 carbon atoms; and $Ar^2$ represents a substituted or unsubstituted aryl group having 6 to 40 carbon atoms, or a substituted or unsubstituted heteroaryl group having 3 to 40 carbon atoms.

HAr is exemplarily selected from the following group.

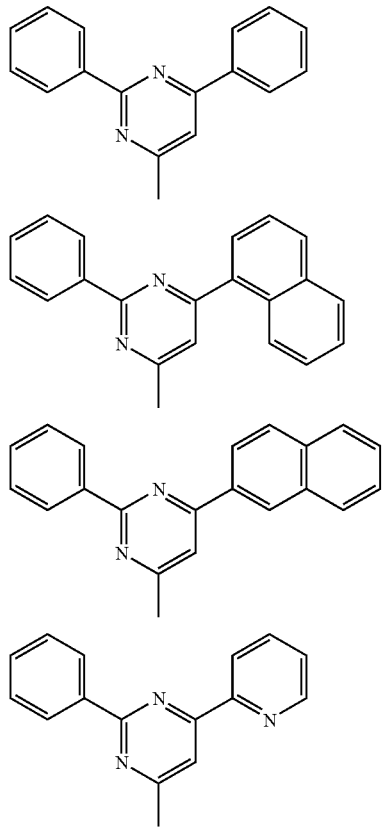

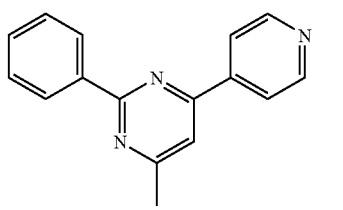

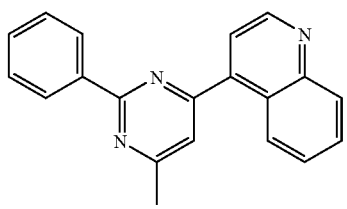

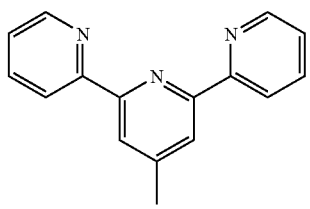

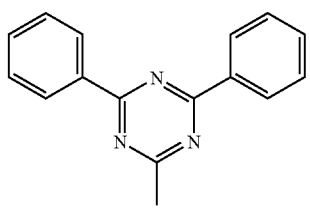

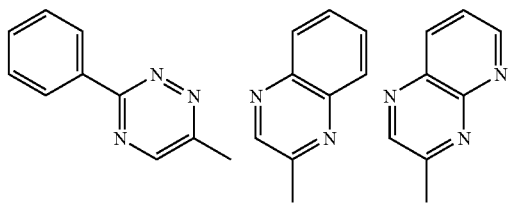

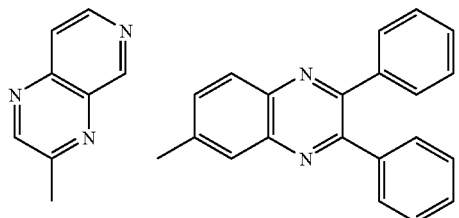

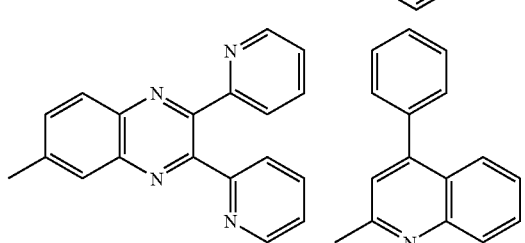

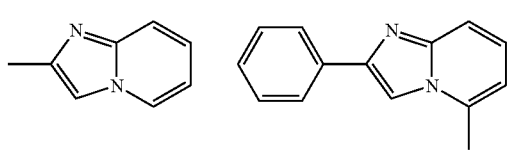

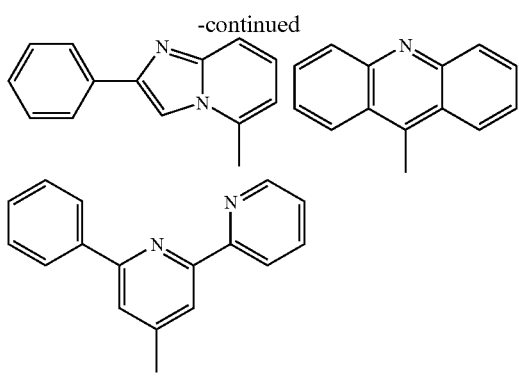

$L^1$ is exemplarily selected from the following group.

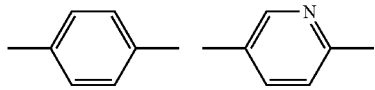

$Ar^2$ is exemplarily selected from the following group.

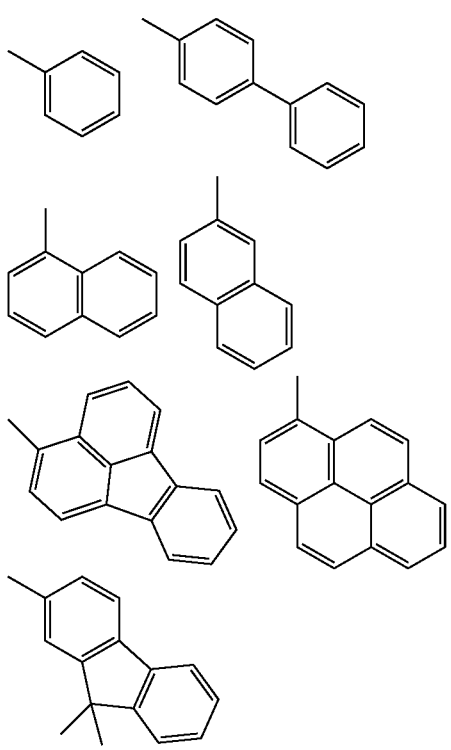

$Ar^1$ is exemplarily selected from the following arylanthranil groups.

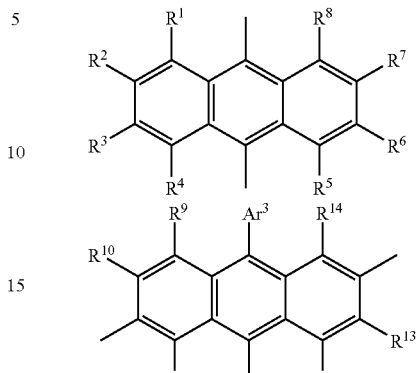

In the formula, $R^1$ to $R^{14}$ each independently represent a hydrogen atom, a halogen atom, an alkyl group having 1 to 20 carbon atoms, an alkoxy group having 1 to 20 carbon atoms, an aryloxy group having 6 to 40 carbon atoms, a substituted or unsubstituted aryl group having 6 to 40 carbon atoms, or a heteroaryl group having 3 to 40 carbon atoms. $Ar^3$ represents a substituted or unsubstituted aryl group having 6 to 40 carbon atoms, or a heteroaryl group having 3 to 40 carbon atoms.

The nitrogen-containing heterocyclic derivative may be a nitrogen-containing heterocyclic derivative in which $R^1$ to $R^8$ in the structure of $Ar^1$ represented by the above formula each represent a hydrogen atom.

Other than the above, the following compound (see JP-A-9-3448) can be favorably used.

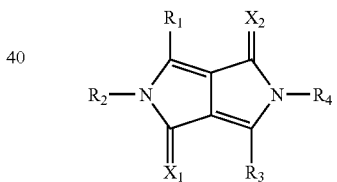

In the formula, $R_1$ to $R_4$ each independently represent a hydrogen atom, a substituted or unsubstituted aliphatic group, a substituted or unsubstituted alicyclic group, a substituted or unsubstituted carbocyclic aromatic cyclic group, or substituted or unsubstituted heterocyclic group. $X_1$ and $X_2$ each represent an oxygen atom, a sulfur atom or a dicyanomethylene group.

Alternatively, the following compound (see JP-A-2000-173774) can also be favorably used.

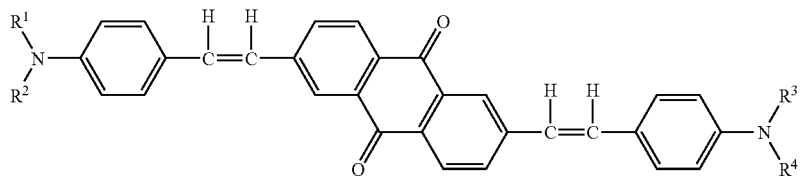

In the formula, $R^1$, $R^2$, $R^3$ and $R^4$, which may be mutually the same or different, each are an aryl group represented by the following formula.

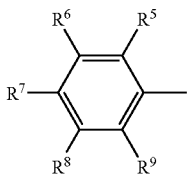

In the formula, $R^5$, $R^6$, $R^7$, $R^8$ and $R^9$, which may be mutually the same or different, each represent a hydrogen atom, a saturated or unsaturated alkoxy group, an alkyl group, an amino group or an alkylamino group. At least one of $R^5$, $R^6$, $R^7$, $R^8$ and $R^9$ represents a saturated or unsaturated alkoxy group, an alkyl group, an amino group or an alkylamino group.

A polymer compound containing the nitrogen-containing heterocyclic group or a nitrogen-containing heterocyclic derivative may be used.

The electron transporting layer preferably contains at least one of nitrogen-containing heterocycle derivatives respectively represented by the following formulae (201) to (203).

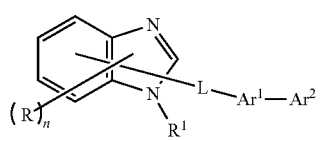
(201)

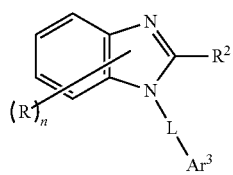
(202)

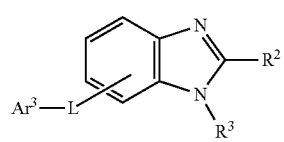
(203)

In the formulae (201) to (203): R represents a hydrogen atom, a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms, or a substituted or unsubstituted alkoxy group having 1 to 20 carbon atoms; n represents an integer in a range of 0 to 4; $R^1$ represents a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms, or an alkoxy group having 1 to 20 carbon atoms; $R^2$ and $R^3$ each independently represent a hydrogen atom, a substituted or unsubstituted aryl group having 6 to 60 carbon atoms, a substituted or unsubstituted pyrydyl group, a substituted or unsubstituted quinolyl group, a substituted or unsubstituted alkyl group having 1 to 20 carbon atoms, or a substituted or unsubstituted alkoxy group having 1 to 20 carbon atoms; L represents a substituted or unsubstituted arylene group having 6 to 60 carbon atoms, a substituted or unsubstituted pyridnylene group, a substituted or unsubstituted quinolinylene group, or a substituted or unsubstituted fluorenylene group; $Ar^1$ represents a substituted or unsubstituted arylene group having 6 to 60 carbon atoms, a substituted or unsubstituted pyridnylene group, or a substituted or unsubstituted quinolinylene group; $Ar^2$ represents a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms or a substituted or unsubstituted alkoxy group having 1 to 20 carbon atoms.

$Ar^3$ represents a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms, a substituted or unsubstituted alkoxy group having 1 to 20 carbon atoms, or a group represented by —$Ar^1$—$Ar^2$ ($Ar^1$ and $Ar^2$ may be the same as the above).

In the formulae (201) to (203), R represents a hydrogen atom, a substituted or unsubstituted aryl group having 6 to 60 carbon atoms, a substituted or unsubstituted pyridyl group, substituted or unsubstituted quinolyl group, a substituted or unsubstituted alkyl group having 1 to 20 carbon atoms, or a substituted or unsubstituted alkoxy group having 1 to 20 carbon atoms.

The aryl group having 6 to 60 carbon atom is preferably an aryl group having 6 to 40 carbon atoms, more preferably an aryl group having 6 to 20 carbon atoms. Examples of such an aryl group are a phenyl group, naphthyl group, anthryl group, phenanthryl group, naphthacenyl group, chrysenyl group, pyrenyl group, biphenyl group, terphenyl group, tolyl group, t-butylphenyl group, (2-phenylpropyl)phenyl group, fluoranthenyl group, fluorenyl group, a monovalent group formed of spirobifluorene, perfluorophenyl group, perfluoronaphthyl group, perfluoroanthryl group, perfluorobiphenyl group, a monovalent group formed of 9-phenylanthracene, a monovalent group formed of 9-(1'naphthyl) anthracene, a monovalent group formed of 9-(2'-naphthyl)anthracene, a monovalent group formed of 6-phenylchrysene, and a monovalent group formed of 9-[4-(diphenylamine)phenyl]anthracene, among which a phenyl group, naphthyl group, biphenyl group, terphenyl group, 9-(10-phenyl)anthryl group, 9-[10-(1'-naphthyl)]anthryl group and 9-[10-(2'-naphthyl)]anthryl group are preferable.

The alkyl group having 1 to 20 carbon atoms is preferably an alkyl group having 1 to 6 carbon atoms. Examples of such an alkyl group are a methyl group, ethyl group, propyl group, butyl group, pentyl group, hexyl group, and a haloalkyl group such as trifluoromethyl group. When such an alkyl group has 3 or more carbon atoms, the alkyl group may be linear, cyclic or branched.

The alkoxy group having 1 to 20 carbon atoms is preferably an alkoxy group having 1 to 6 carbon atoms. Examples of such an alkoxy group are a methoxy group, ethoxy group, propoxy group, butoxy group, pentyloxy group, and hexyloxy group. When such an alkoxy group has 3 or more carbon atoms, the alkoxy group may be linear, cyclic or branched.

Examples of a substituent for the group represented by R are a halogen atom, a substituted or unsubstituted alkyl group having 1 to 20 carbon atoms, a substituted or unsubstituted alkoxy group having 1 to 20 carbon atoms, a substituted or unsubstituted aryloxy group having 6 to 40 carbon atoms, a substituted or unsubstituted aryl group having 6 to 40 carbon atoms, or a substituted or unsubstituted heteroaryl group having 3 to 40 carbon atoms.

Examples of the halogen atom are fluorine, chlorine, bromine, iodine and the like.

Examples for each of the alkyl group having 1 to 20 carbon atoms, the alkoxy group having 1 to 20 carbon atoms, and an aryl group having 6 to 40 carbon atoms may be the same as the above examples.

Examples of the aryloxy group having 6 to 40 carbon atoms are a phenoxy group and a biphenyloxy group.

Examples of the heteroaryl group having 3 to 40 carbon atoms are a pyrroryl group, furyl group, thienyl group, silolyl group, pyridyl group, quinolyl group, isoquinolyl group, benzofuryl group, imidazolyl group, pyrimidyl group, carbazolyl group, selenophenyl group, oxadiazolyl group and triazolyl group.

n is an integer in a range of 0 to 4, preferably 0 to 2.

In the formulae (201), $R^1$ represents a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms, or an alkoxy group having 1 to 20 carbon atoms.

Examples for each of the groups, the preferable number of carbon atoms contained in each of the groups, and preferable examples of the substituent for each of the groups are the same as those described in relation to R.

In the formulae (202) and (203), $R^2$ and $R^3$ each independently represent a hydrogen atom, a substituted or unsubstituted aryl group having 6 to 60 carbon atoms, a substituted or unsubstituted pyridyl group, substituted or unsubstituted quinolyl group, a substituted or unsubstituted alkyl group having 1 to 20 carbon atoms, or a substituted or unsubstituted alkoxy group having 1 to 20 carbon atoms.

Examples for each of the groups, the preferable number of carbon atoms contained in each of the groups, and preferable examples of the substituent for each of the groups are the same as those described in relation to R.

In the formulae (201) to (203), L represents a substituted or unsubstituted arylene group having 6 to 60 carbon atoms, a substituted or unsubstituted pyridinylene group, a substituted or unsubstituted quinolinylene group, or a substituted or unsubstituted fluorenylene group.

The arylene group having 6 to 60 carbon atoms is preferably an arylene group having 6 to 40 carbon atoms, more preferably an arylene group having 6 to 20 carbon atoms. An example of such an arylene group is a divalent group formed by removing one hydrogen atom from the aryl group having been described in relation to R. Examples of a substituent for the group represented by L are the same as those described in relation to R.

Alternatively, L is preferably a group selected from a group consisting of the following.

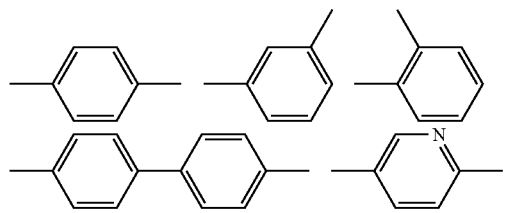

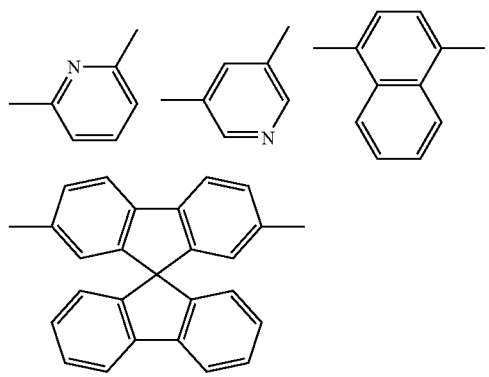

In the formula (201), $Ar^1$ represents a substituted or unsubstituted arylene group having 6 to 60 carbon atoms, a substituted or unsubstituted pyridinylene group, or a substituted or unsubstituted quinolinylene group. Examples of a substituent for the groups respectively represented by $Ar^1$ and $Ar^3$ are the same as those described in relation to R.

Alternatively, $Ar^1$ is preferably selected from condensed cyclic groups respectively represented by the following formulae (101) to (110).

(101)

(102)

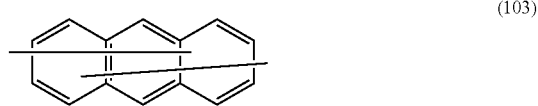
(103)

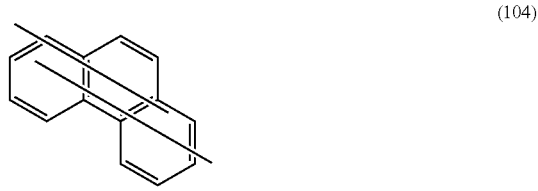
(104)

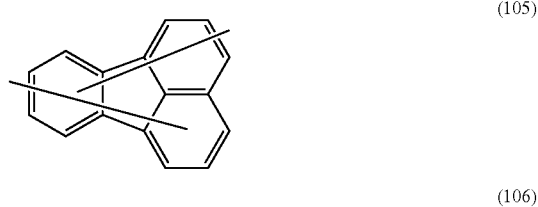
(105)

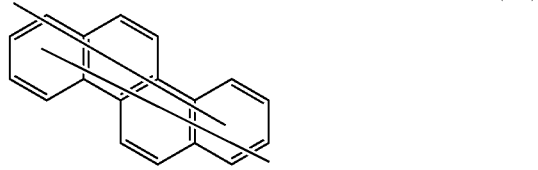
(106)

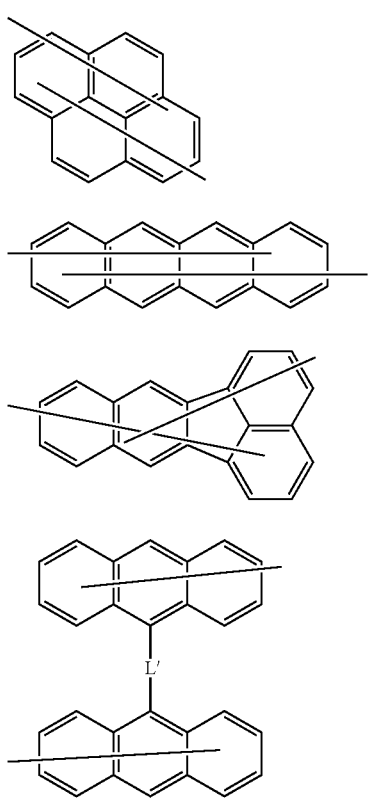
(107)
(108)
(109)
(110)

In the formulae (101) to (110), the condensed rings each may be linked with a link group formed of a halogen atom, a substituted or unsubstituted alkyl group having 1 to 20 carbon atoms, a substituted or unsubstituted alkoxy group having 1 to 20 carbon atoms, a substituted or unsubstituted aryloxy group having 6 to 40 carbon atoms, a substituted or unsubstituted aryl group having 6 to 40 carbon atoms or a substituted or unsubstituted heteroaryl group having 3 to 40 carbon atoms. When the rings each are linked with plural link groups, the plural link groups may be mutually the same or different. Examples for each of the groups are the same as those described above.

In the formula (110), L' represents a single bond or a group selected from a group consisting of the following.

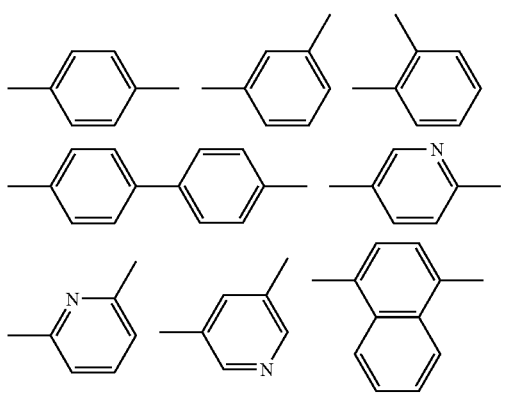

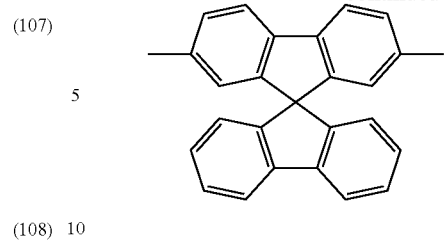

The structure of Ar$^1$ represented by the formula (103) is preferably a condensed cyclic group represented by any one of the following formulae (111) to (125).

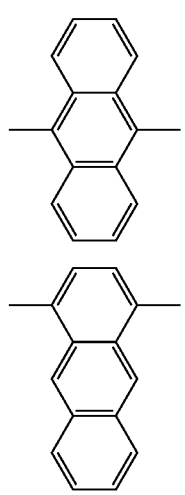
(111)

(112)

(113)

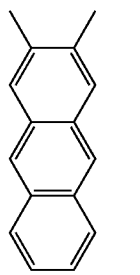
(114)

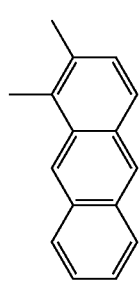
(115)

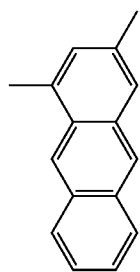

-continued (116) 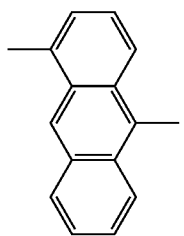

(117) 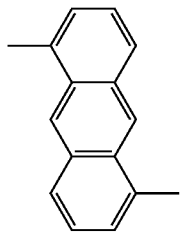

(118) 

(119) 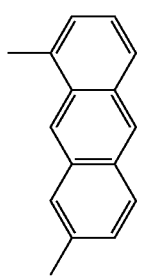

(120) 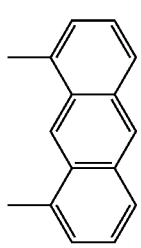

(121) 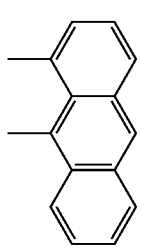

-continued (122) 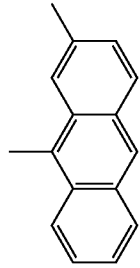

(123) 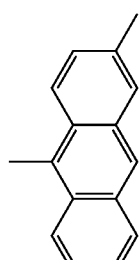

(124) 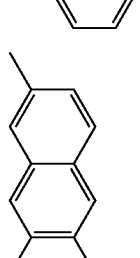

(125) 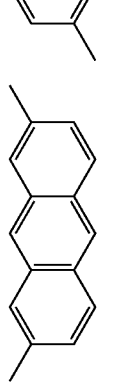

In the formulae (111) to (125), the condensed rings each may be linked with a link group formed of a halogen atom, a substituted or unsubstituted alkyl group having 1 to 20 carbon atoms, a substituted or unsubstituted alkoxy group having 1 to 20 carbon atoms, a substituted or unsubstituted aryloxy group having 6 to 40 carbon atoms, a substituted or unsubstituted aryl group having 6 to 40 carbon atoms or a substituted or unsubstituted heteroaryl group having 3 to 40 carbon atoms. When the rings each are linked with plural link groups, the plural link groups may be mutually the same or different. Examples for each of the groups are the same as those described above.

In the formula (201), $Ar^2$ represents a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms, or a substituted or unsubstituted alkoxy group having 1 to 20 carbon atoms.

Examples for each of the groups, the preferable number of carbon atoms contained in each of the groups, and preferable examples of the substituent for each of the groups are the same as those described in relation to R.

In the formulae (202) and (203), Ar³ represents a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms, a substituted or unsubstituted alkoxy group having 1 to 20 carbon atoms, or a group represented by —Ar¹—Ar² (Ar¹ and Ar² may be the same as the above).

Examples for each of the groups, the preferable number of carbon atoms contained in each of the groups, and preferable examples of the substituent for each of the groups are the same as those described in relation to R.

Alternatively, Ar³ is preferably selected from condensed cyclic groups respectively represented by the following formulae (126) to (135).

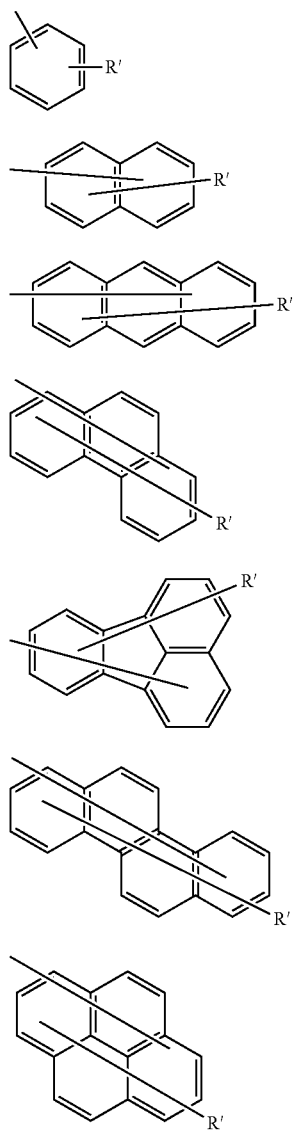

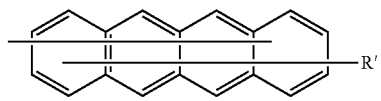

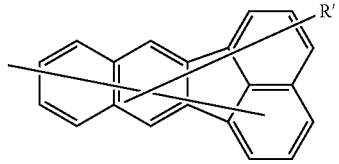

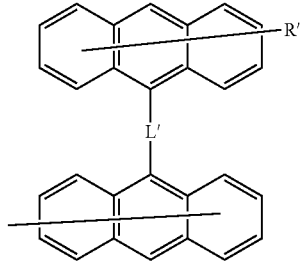

In the formulae (126) to (135), the condensed rings each may be linked with a link group formed of a halogen atom, a substituted or unsubstituted alkyl group having 1 to 20 carbon atoms, a substituted or unsubstituted alkoxy group having 1 to 20 carbon atoms, a substituted or unsubstituted aryloxy group having 6 to 40 carbon atoms, a substituted or unsubstituted aryl group having 6 to 40 carbon atoms or a substituted or unsubstituted heteroaryl group having 3 to 40 carbon atoms. When the rings each are linked with plural link groups, the plural link groups may be mutually the same or different. Examples for each of the groups are the same as those described above.

In the formula (135), L' represents the same as the above.

In the formulae (126) to (135), R' represents a hydrogen atom, a substituted or unsubstituted alkyl group having 1 to 20 carbon atoms, a substituted or unsubstituted aryl group having 6 to 40 carbon atoms, or a substituted or unsubstituted heteroaryl group having 3 to 40 carbon atoms. Examples for each of the groups are the same as those described above.

A structure represented by the formula (128), which is an example of Ar³, is preferably a condensed cyclic group represented by any one of the following formulae (136) to (158).

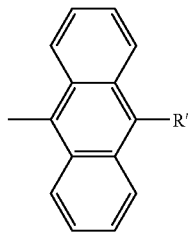

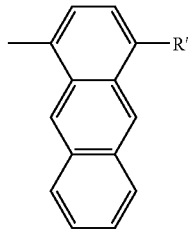

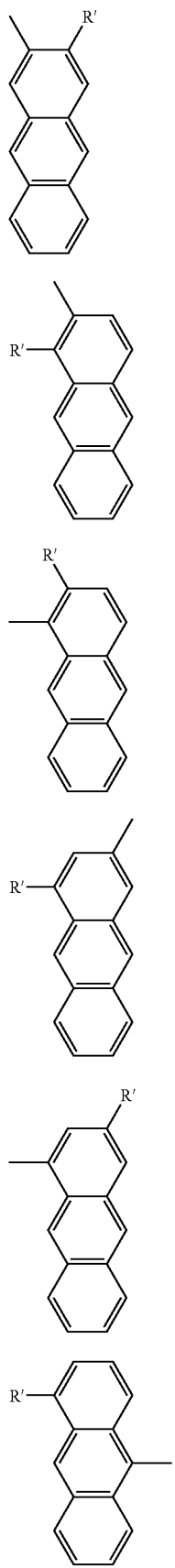
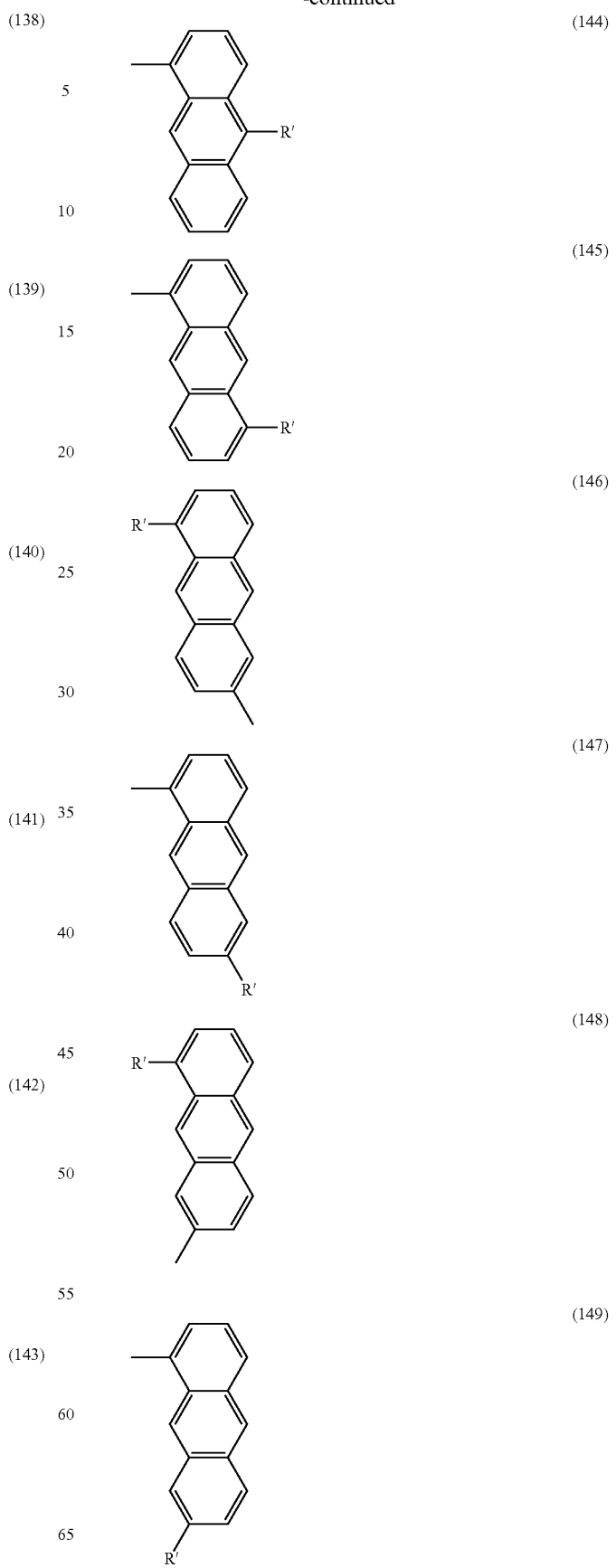

(150) 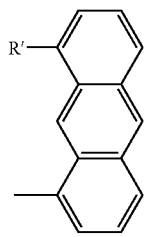

(151) 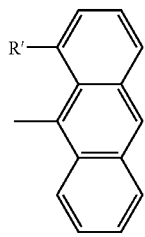

(152) 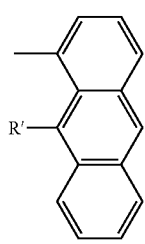

(153) 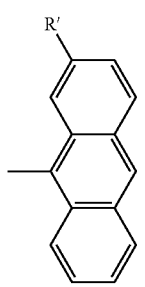

(154) 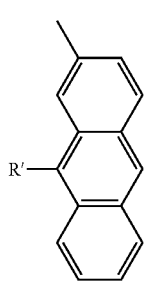

(155) 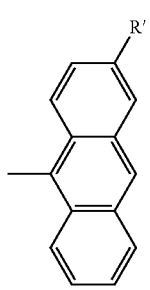

(156) 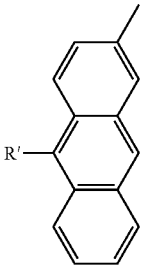

(157) 

(158) 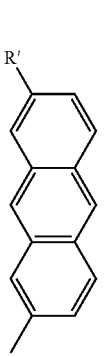

In the formulae (136) to (158), the condensed rings each may be linked with a link group formed of a halogen atom, a substituted or unsubstituted alkyl group having 1 to 20 carbon atoms, a substituted or unsubstituted alkoxy group having 1 to 20 carbon atoms, a substituted or unsubstituted aryloxy group having 6 to 40 carbon atoms, a substituted or unsubstituted aryl group having 6 to 40 carbon atoms or a substituted or unsubstituted heteroaryl group having 3 to 40 carbon atoms. When the rings each are linked with plural link groups, the plural link groups may be mutually the same or different. Examples for each of the groups are the same as those described above. R' is the same as the above.

Alternatively, $Ar^2$ and $Ar^3$ each are preferably a group selected from a group consisting of the following.

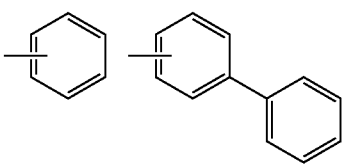

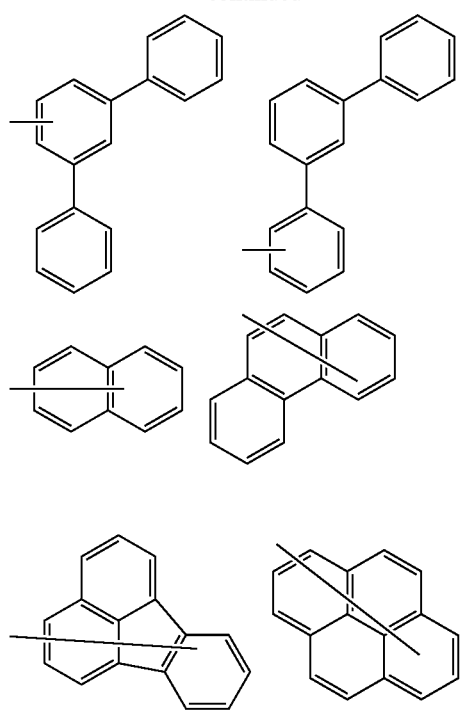

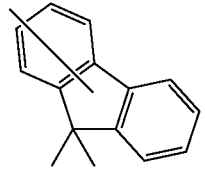

Examples of the nitrogen-containing heterocyclic derivative represented by any one of the general formulae (201) to (203) according to the present invention will be shown below. However, the present invention is not limited to the exemplary compounds shown below.

In the chart shown below, HAr represents any one of the following structures respectively in the structures represented by the formulae (201) to (203).

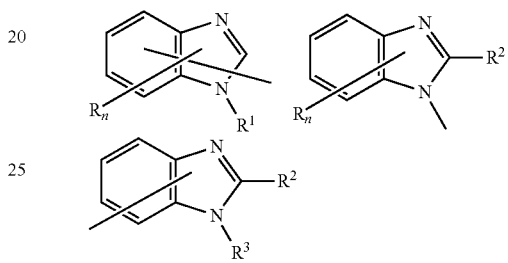

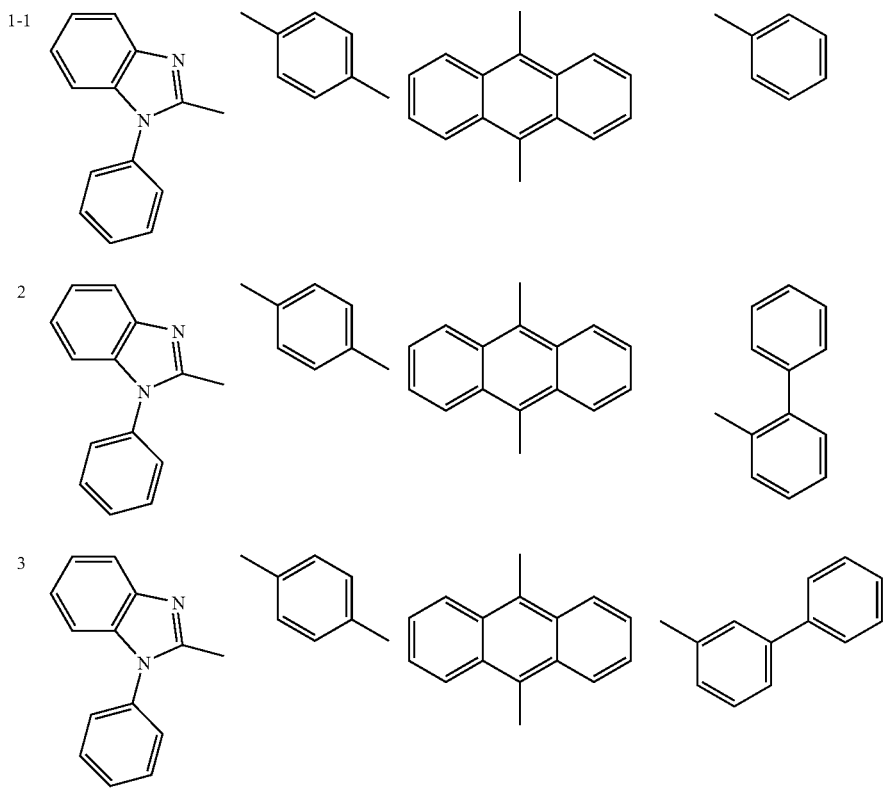

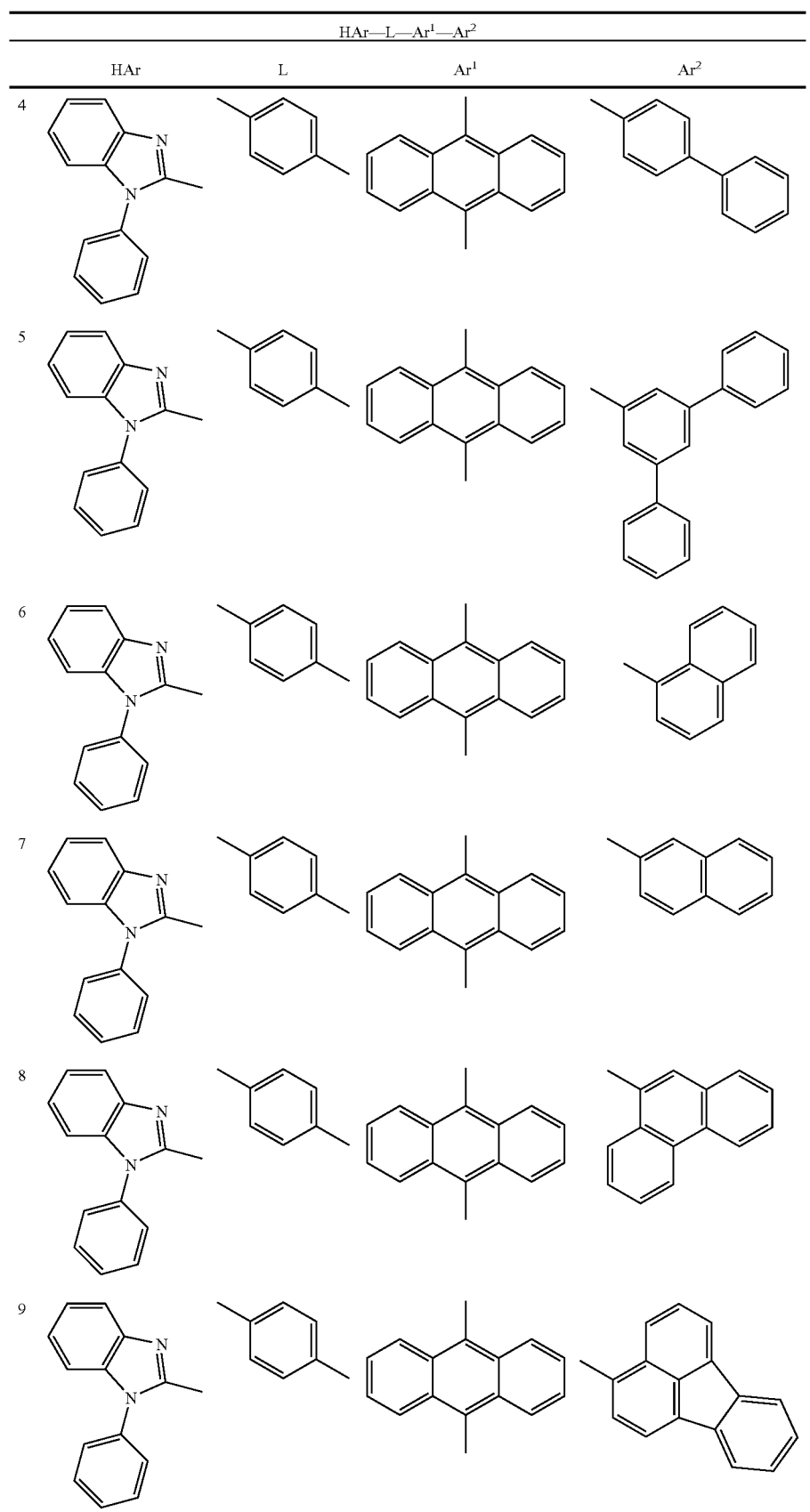

-continued
| HAr | L | Ar¹ | Ar² |
|---|---|---|---|
| 10 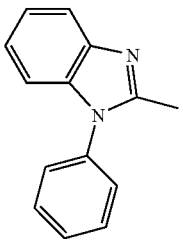 | 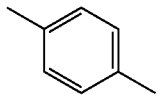 | 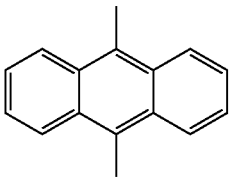 | 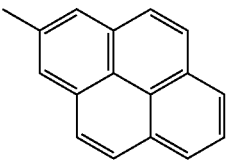 |
| 11 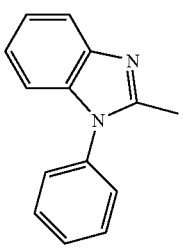 | 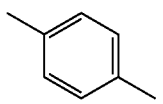 | 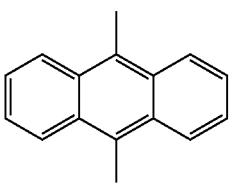 | 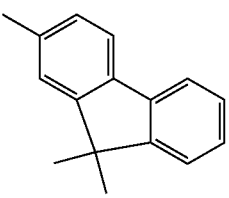 |
| 12 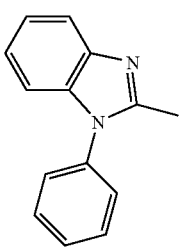 | 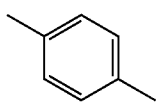 | 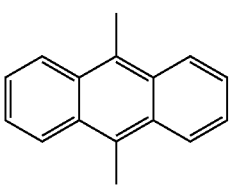 | 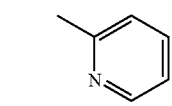 |
| 13 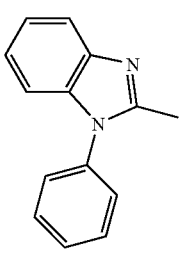 | 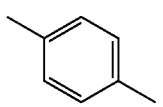 | 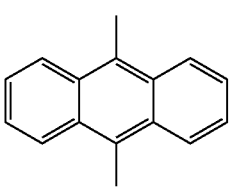 | 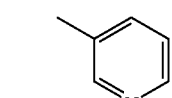 |
| 14 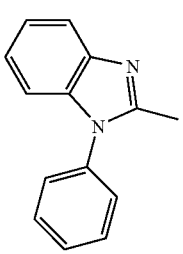 | 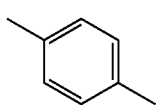 | 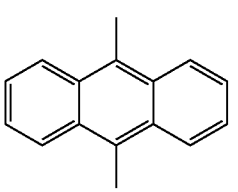 | 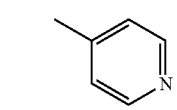 |

| | HAr | L | Ar¹ | Ar² |
|---|---|---|---|---|
| 2-1 | 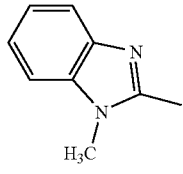 | 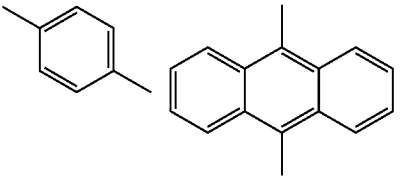 | 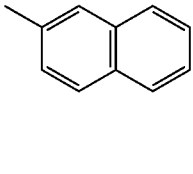 | 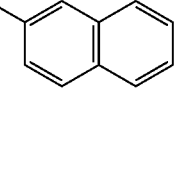 |
| 2 | 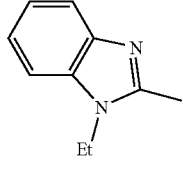 | 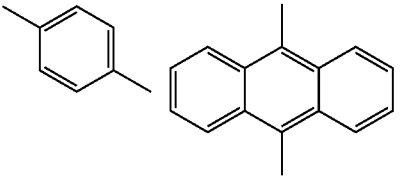 | 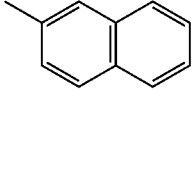 | 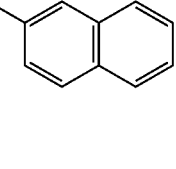 |
| 3 | 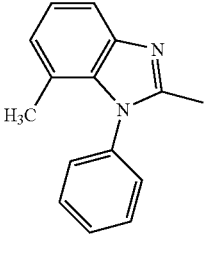 | 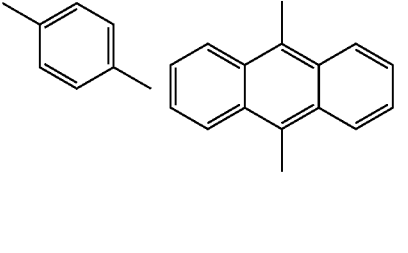 | 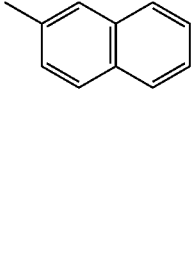 | 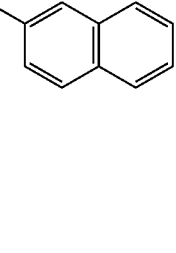 |
| 4 | 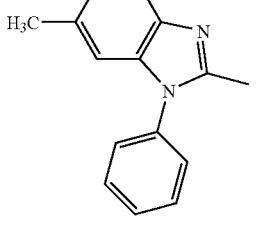 | 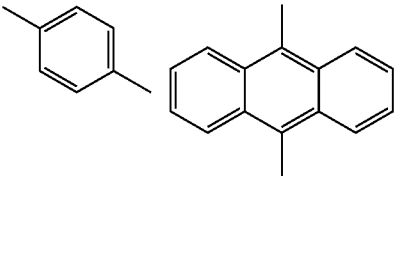 | 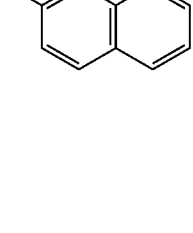 | 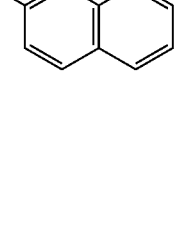 |
| 5 | 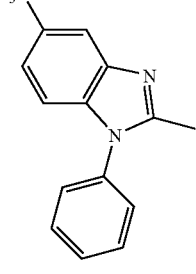 | 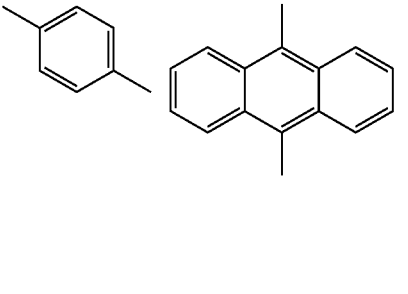 | 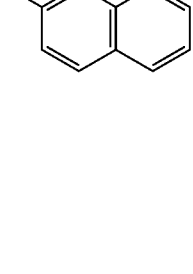 | 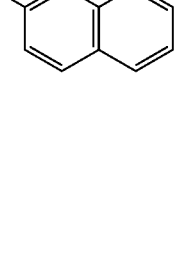 |
| 6 | 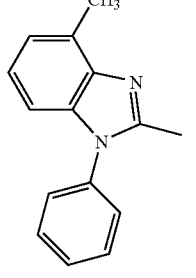 | 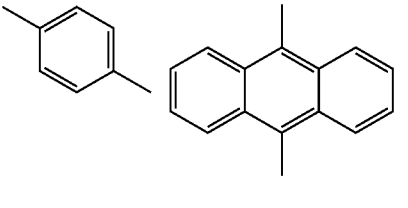 | 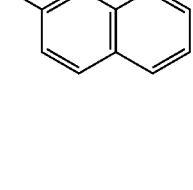 | 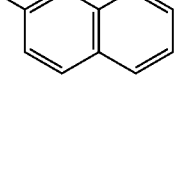 |

-continued
| HAr—L—Ar¹—Ar² | | | |
|---|---|---|---|
| HAr | L | Ar¹ | Ar² |
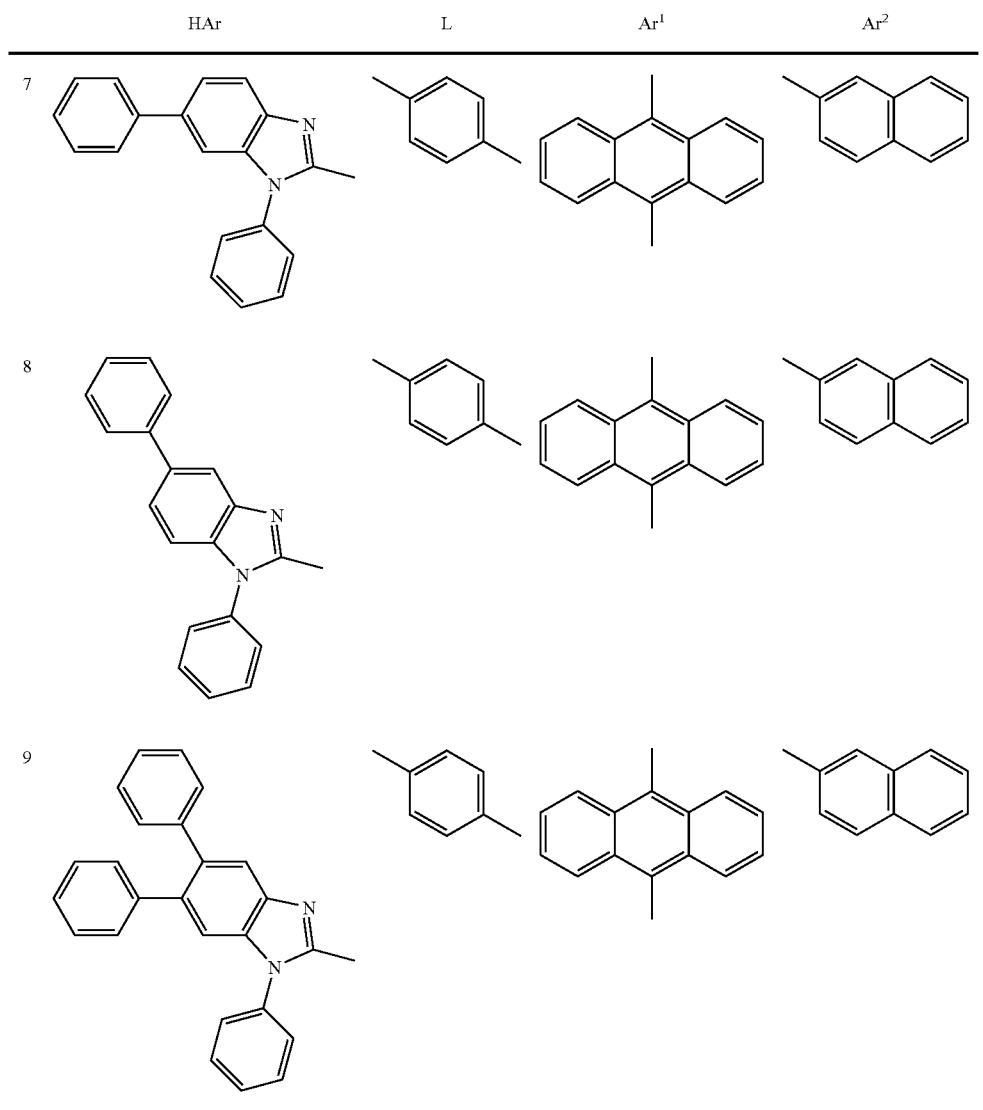
| HAr—L—Ar¹—Ar² | | | |
|---|---|---|---|
| HAr | L | Ar¹ | Ar² |
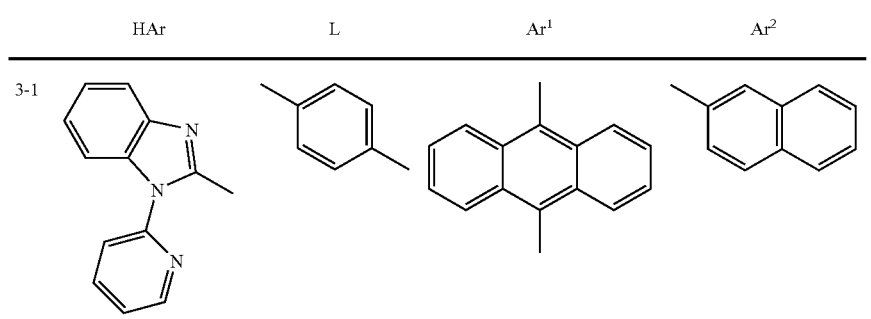

-continued
| | HAr | L | Ar¹ | Ar² |
|---|---|---|---|---|
| 2 | 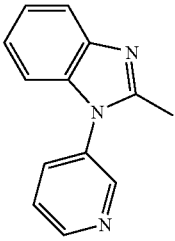 | 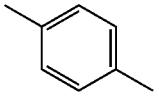 | 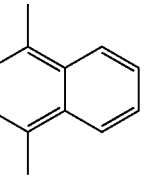 | 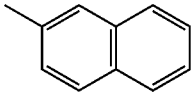 |
| 3 | 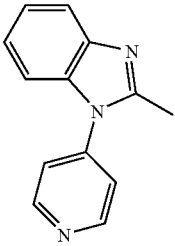 | 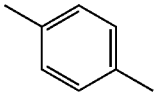 | 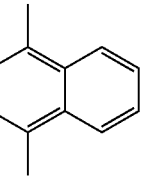 | 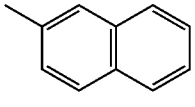 |
| 4 | 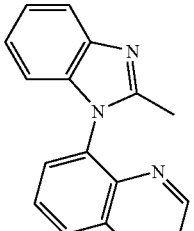 | 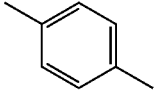 | 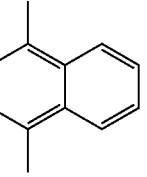 | 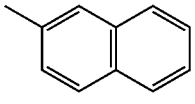 |
| 5 | 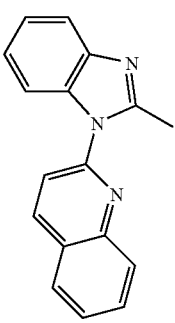 | 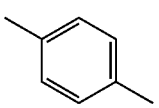 | 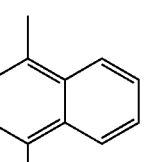 | 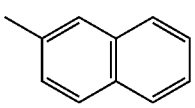 |
| 6 | 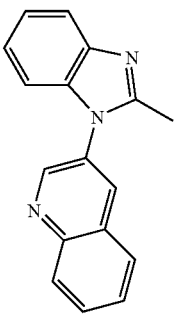 | 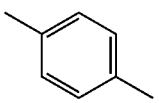 | 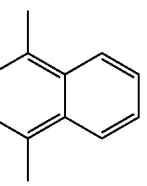 | 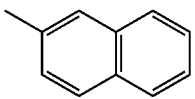 |

| | HAr—L—Ar¹—Ar² | | | |
|---|---|---|---|---|
| | HAr | L | Ar¹ | Ar² |
| 4-1 | 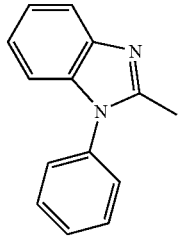 |  | 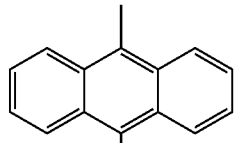 | 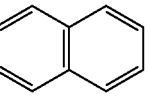 |
| 2 | 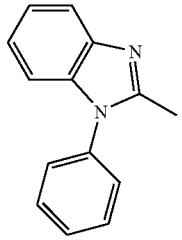 | 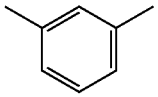 | 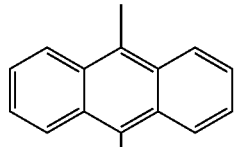 | 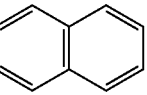 |
| 3 | 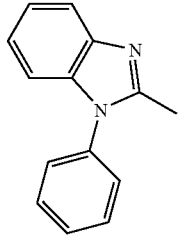 | 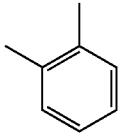 | 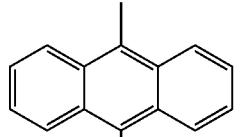 | 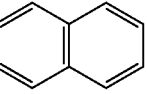 |
| 4 | 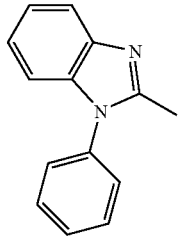 | 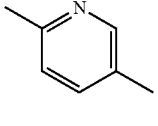 | 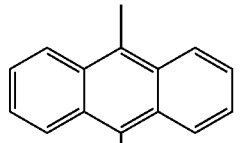 | 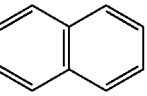 |
| 5 | 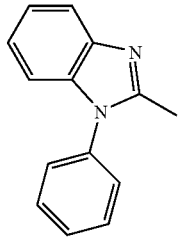 | 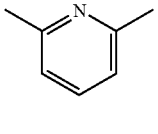 | 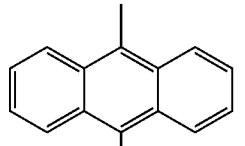 | 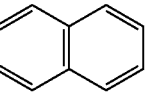 |
| 6 | 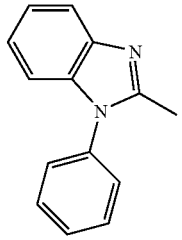 | 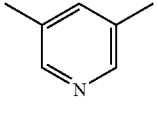 | 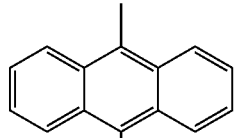 | 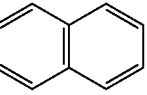 |

-continued
| | HAr | L | Ar¹ | Ar² |
|---|---|---|---|---|
| 7 | 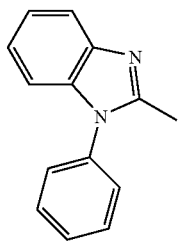 | 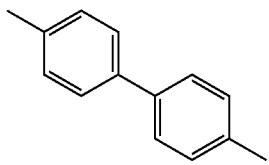 | 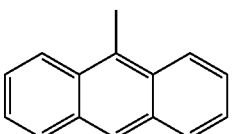 | 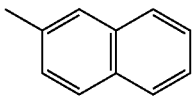 |
| 8 | 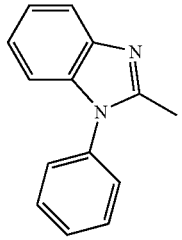 | 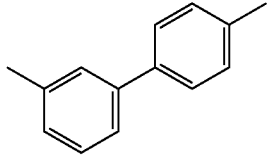 | 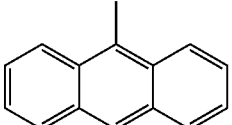 | 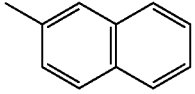 |
| 9 | 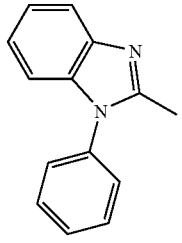 | 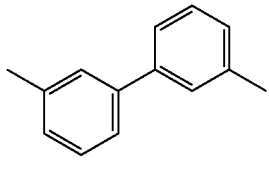 | 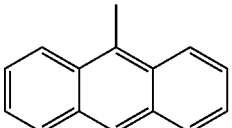 | 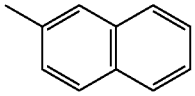 |
| 10 | 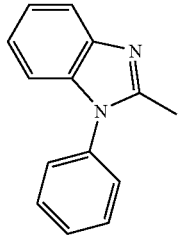 | 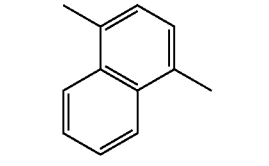 | 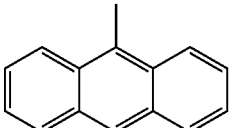 | 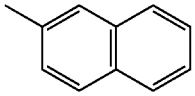 |
| 11 | 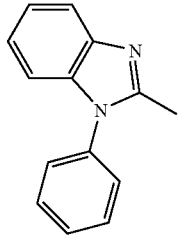 | 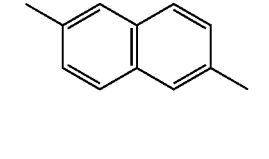 | 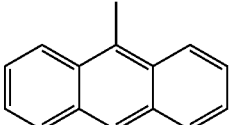 | 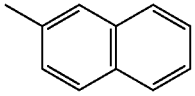 |
| 12 | 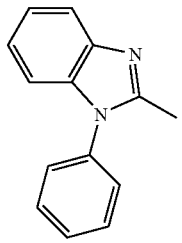 | 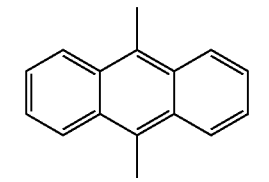 | 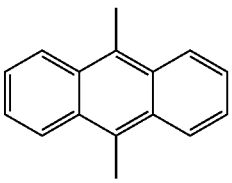 | 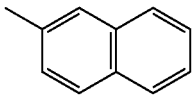 |

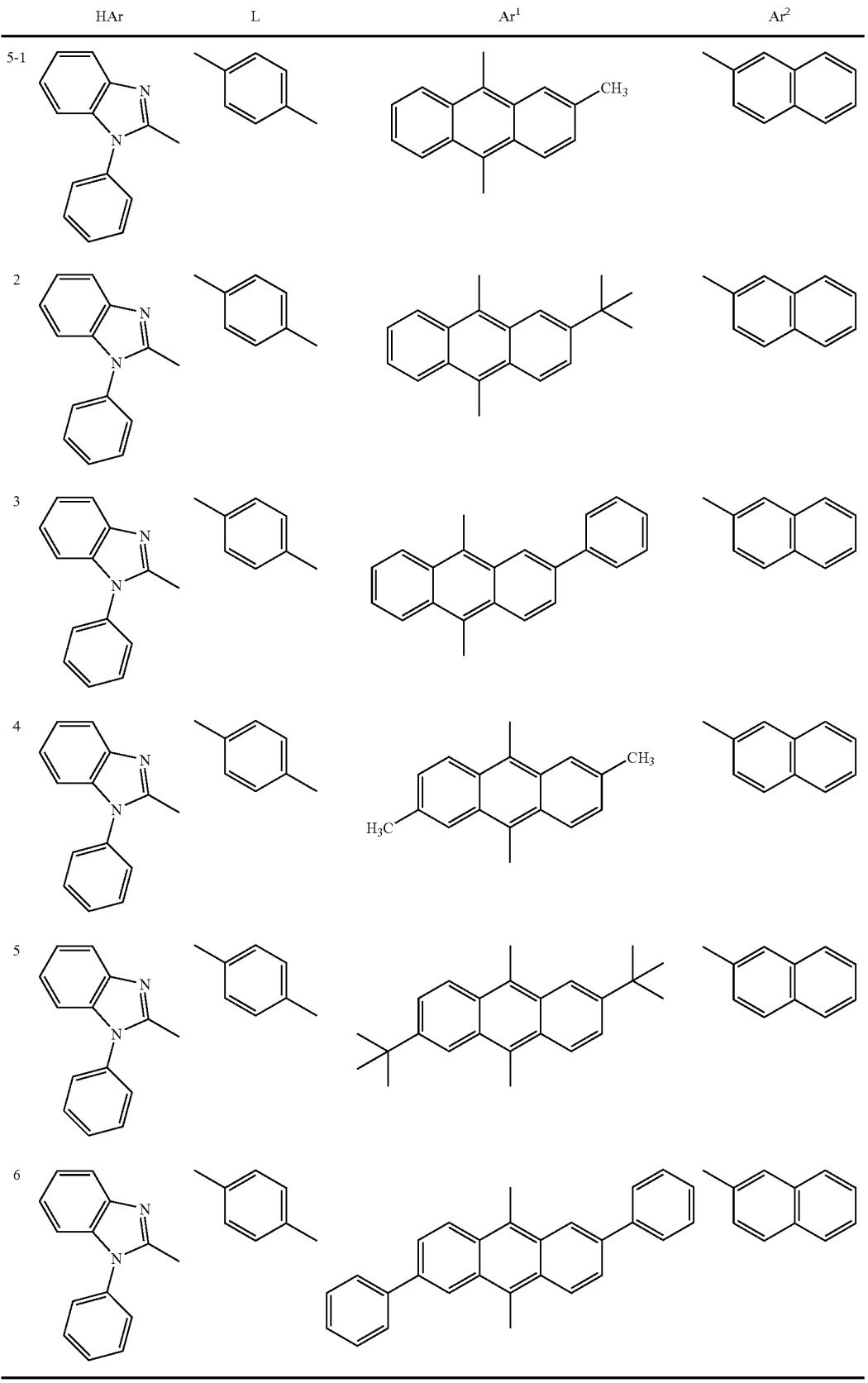

| | HAr | L | Ar¹ | Ar² |
|---|---|---|---|---|
| 6-1 | 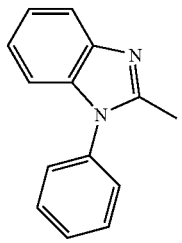 | 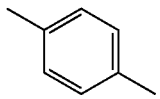 | 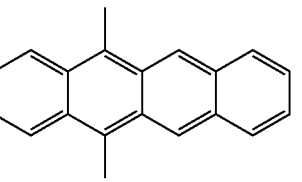 | 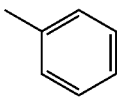 |
| 2 | 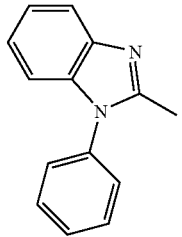 | 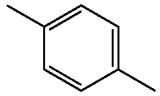 | 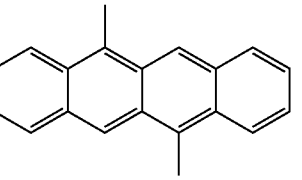 | 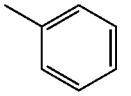 |
| 3 | 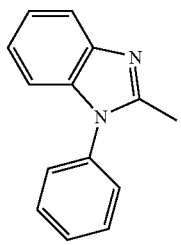 | 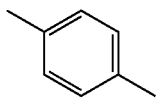 | 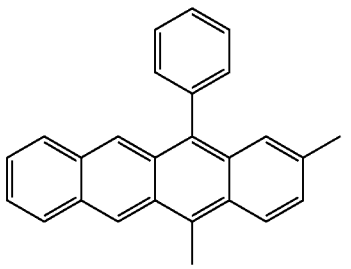 | 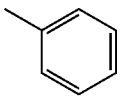 |
| 4 | 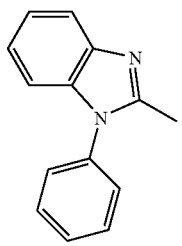 | 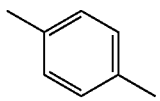 | 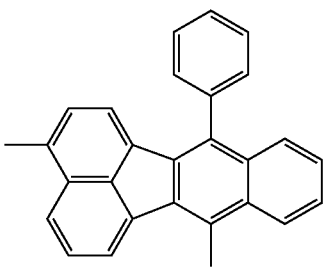 | 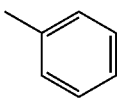 |
| 5 | 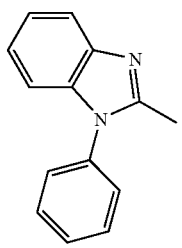 | 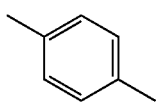 | 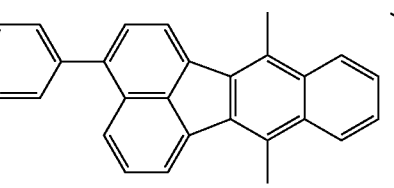 | 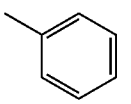 |

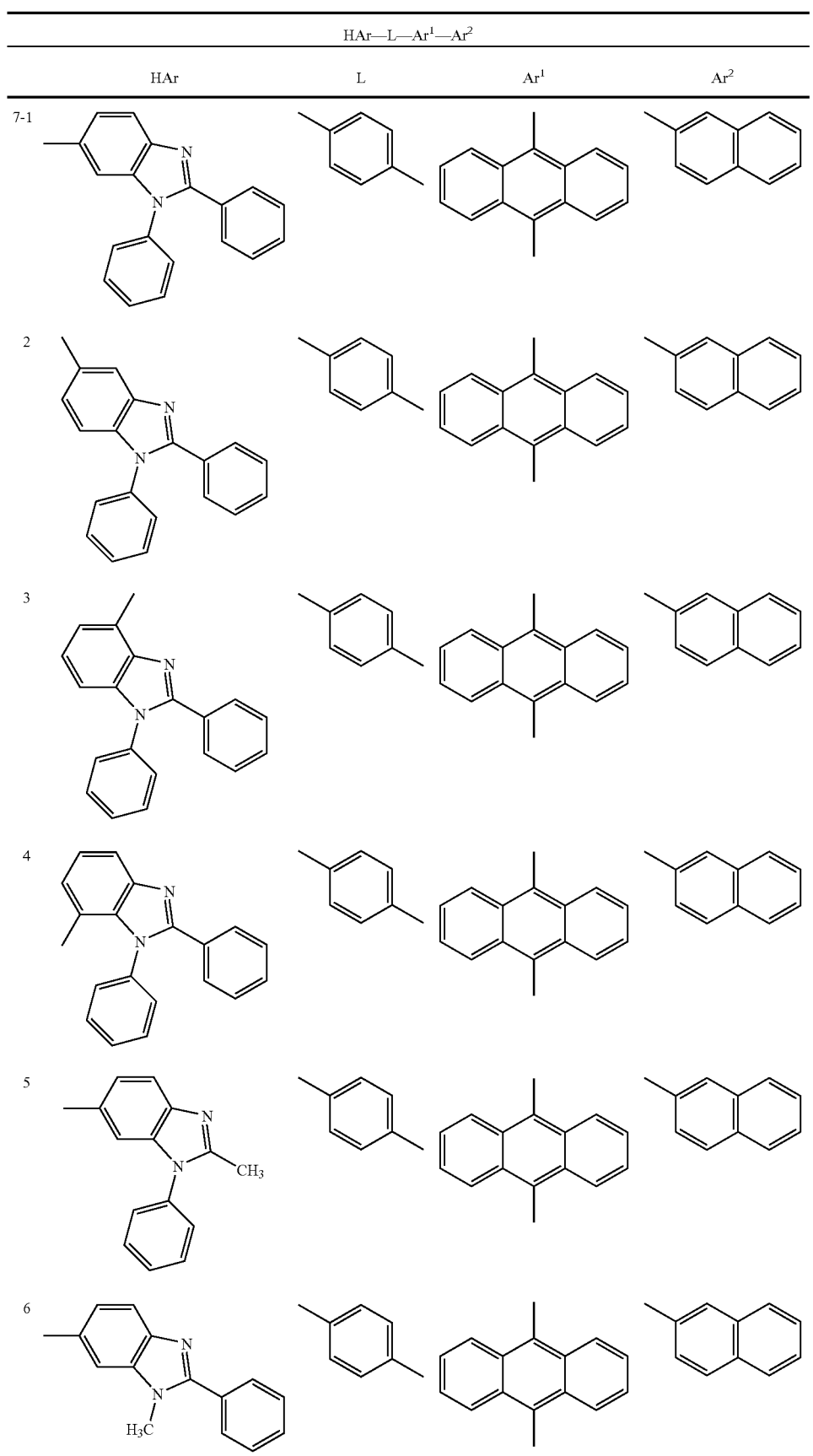

-continued
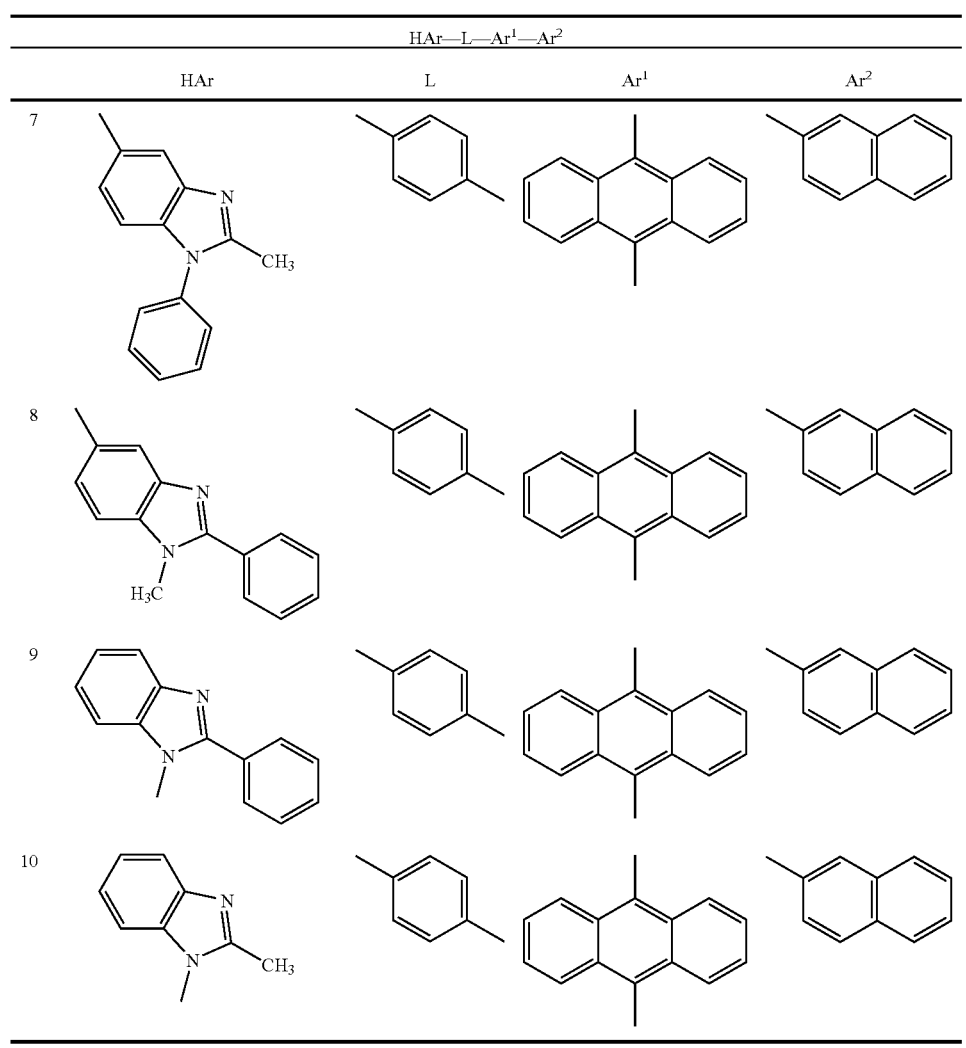
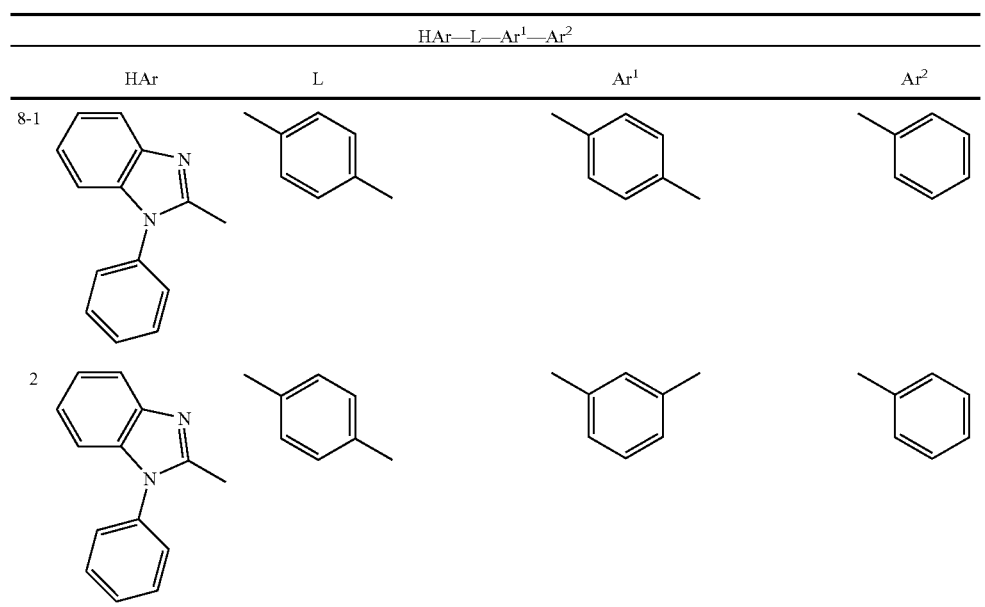

-continued

| | HAr—L—Ar¹—Ar² | | | |
|---|---|---|---|---|
| | HAr | L | Ar¹ | Ar² |
| 3 | 1-phenyl-2-methyl-benzimidazole | 1,4-phenylene | 1,4-naphthylene | phenyl |
| 4 | 1-phenyl-2-methyl-benzimidazole | 1,4-phenylene | 2,6-naphthylene | phenyl |
| 5 | 1-phenyl-2-methyl-benzimidazole | 1,4-phenylene | 9,10-phenanthrylene | phenyl |
| 6 | 1-phenyl-2-methyl-benzimidazole | 1,4-phenylene | 2,7-phenanthrylene | phenyl |
| 7 | 1-phenyl-2-methyl-benzimidazole | 1,4-phenylene | 9-phenanthryl | H |
| 8 | 1-phenyl-2-methyl-benzimidazole | 1,4-phenylene | 6,12-chrysenylene | phenyl |

-continued
| | HAr | L | Ar¹ | Ar² |
|---|---|---|---|---|
| 9 | 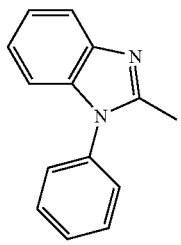 | 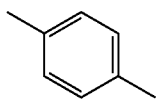 | 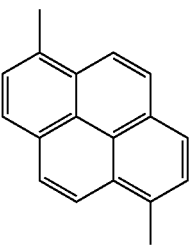 | 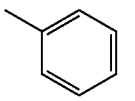 |
| 10 | 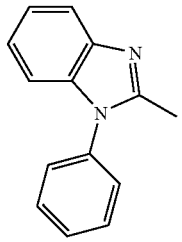 | 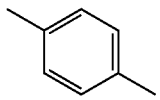 | 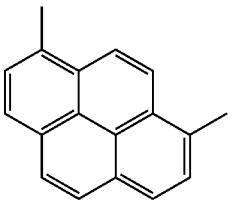 | 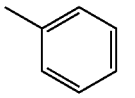 |
| 11 | 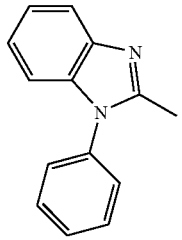 | 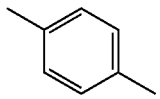 | 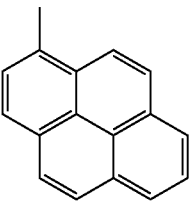 |  |
| 12 | 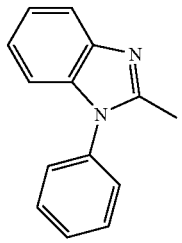 | 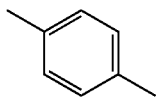 | 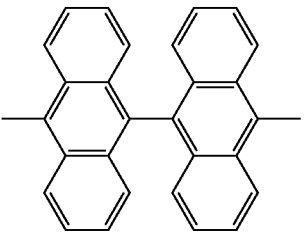 | 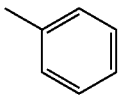 |
| 13 | 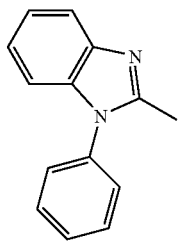 | 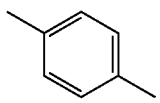 | 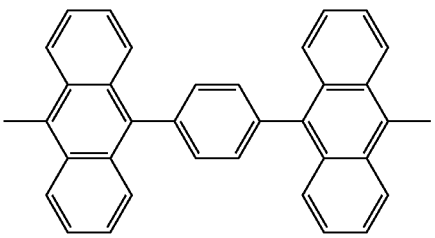 | 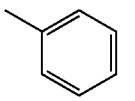 |

| HAr—L—Ar¹—Ar² | | | |
|---|---|---|---|
| HAr | L | Ar¹ | Ar² |

-continued
| | HAr | L | Ar¹ | Ar² |
|---|---|---|---|---|
| 8 | 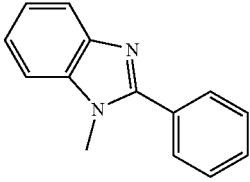 | 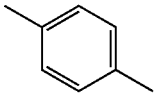 | 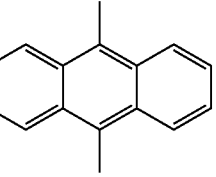 | 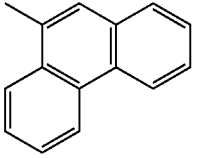 |
| 9 | 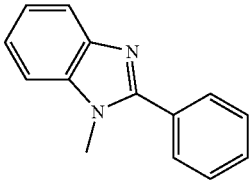 | 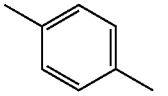 | 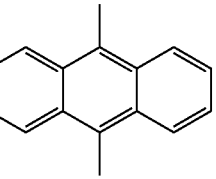 | 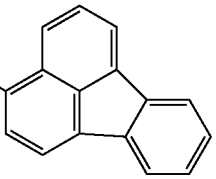 |
| 10 | 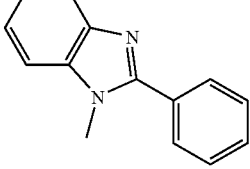 | 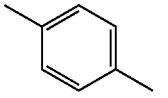 | 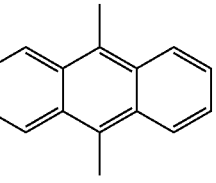 | 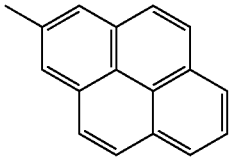 |
| 11 | 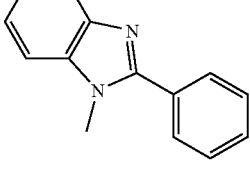 | 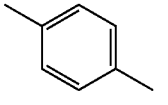 | 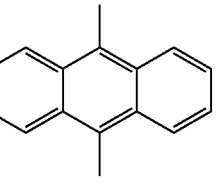 | 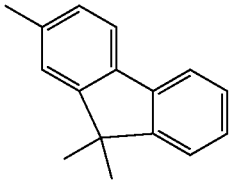 |
| 12 | 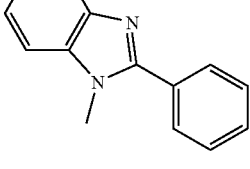 | 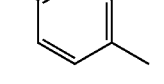 | 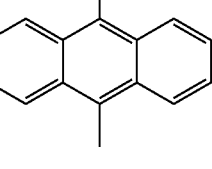 | 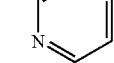 |
| 13 | 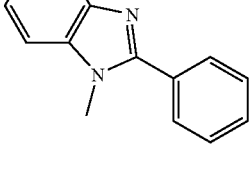 | 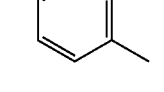 | 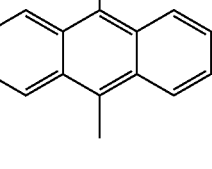 | 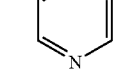 |
| 14 | 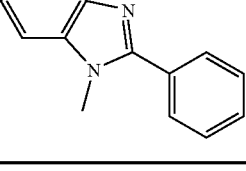 | 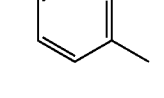 | 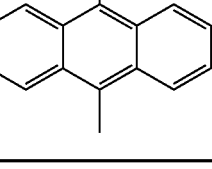 | 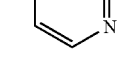 |

| | HAr | L | Ar¹ | Ar² |
|---|---|---|---|---|
| | HAr—L—Ar¹—Ar² | | | |
| 10-1 | 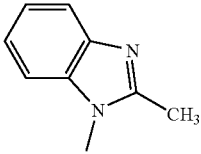 | 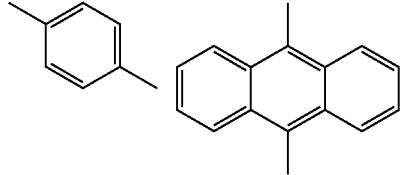 | 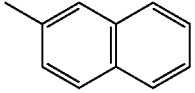 | 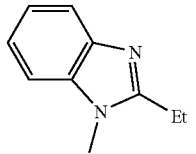 |
| 2 | 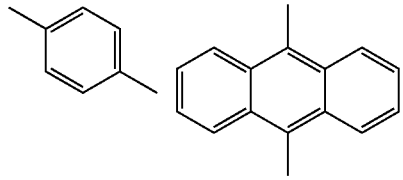 | 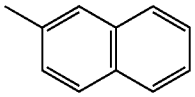 | 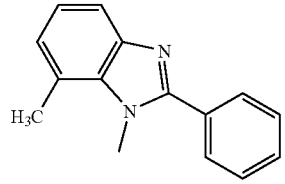 | 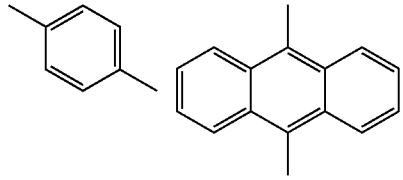 |
| 3 | 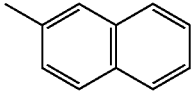 | 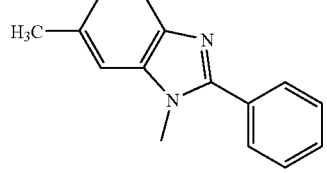 | 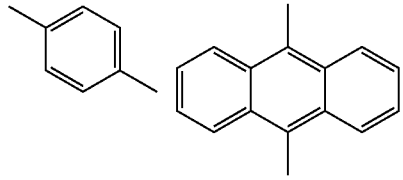 | 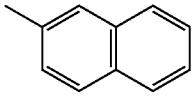 |
| 4 | 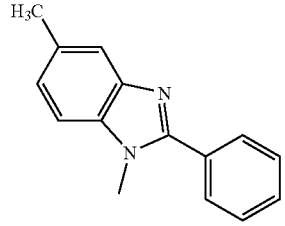 | 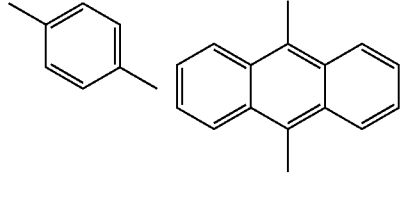 | 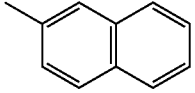 | 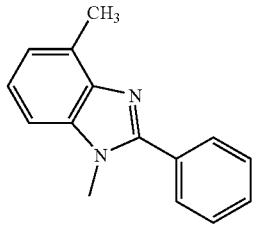 |
| 5 | 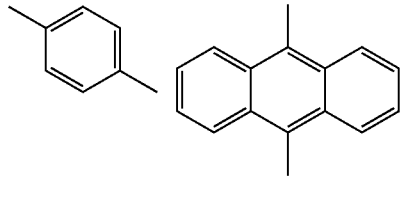 | | | |
| 6 | 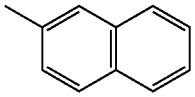 | 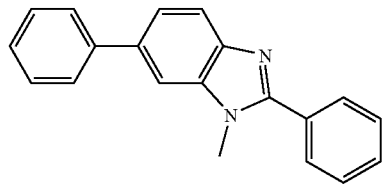 | | |
| 7 | 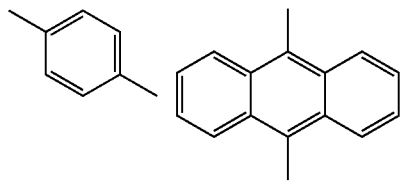 | 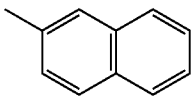 | | |

-continued
| | HAr | L | Ar¹ | Ar² |
|---|---|---|---|---|
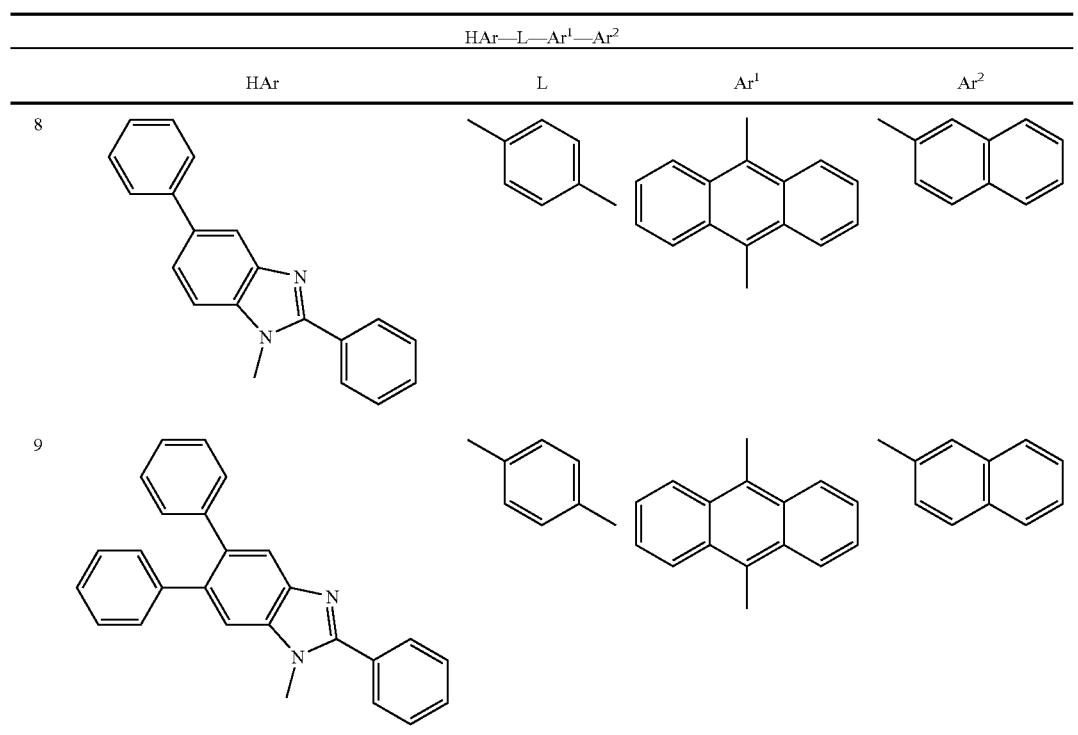
| | HAr | L | Ar¹ | Ar² |
|---|---|---|---|---|
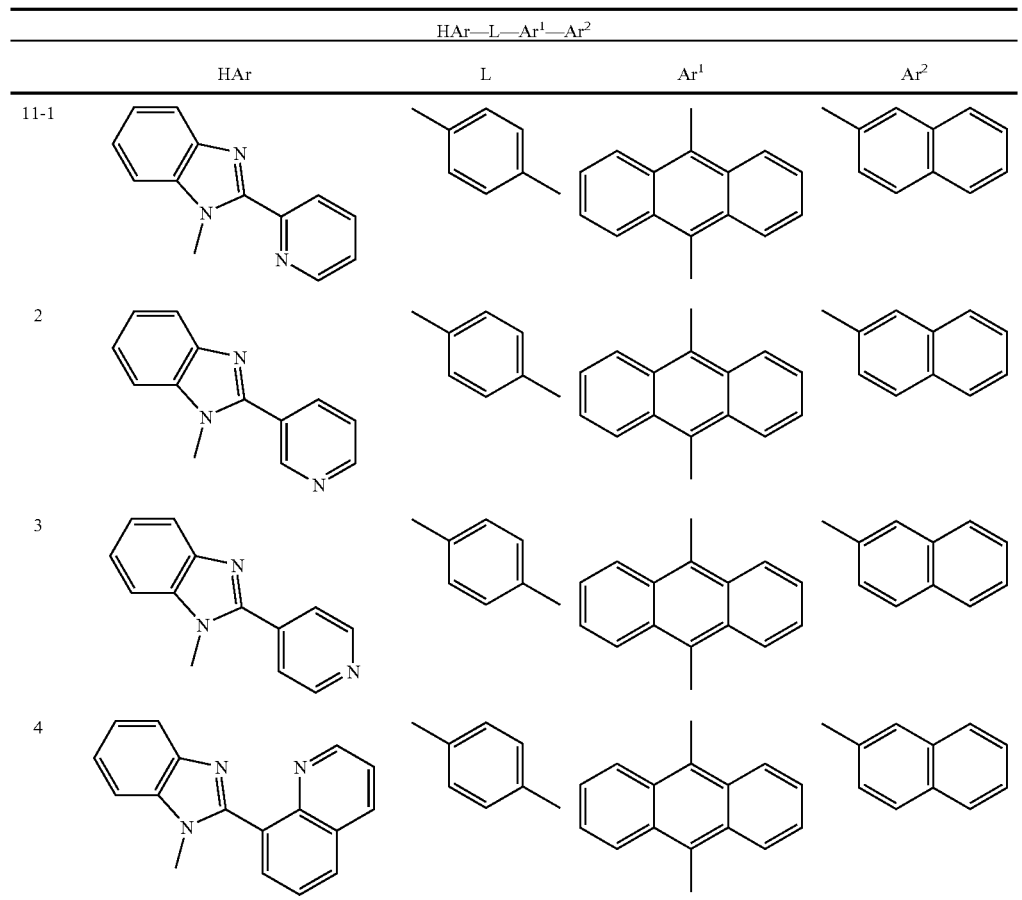

-continued
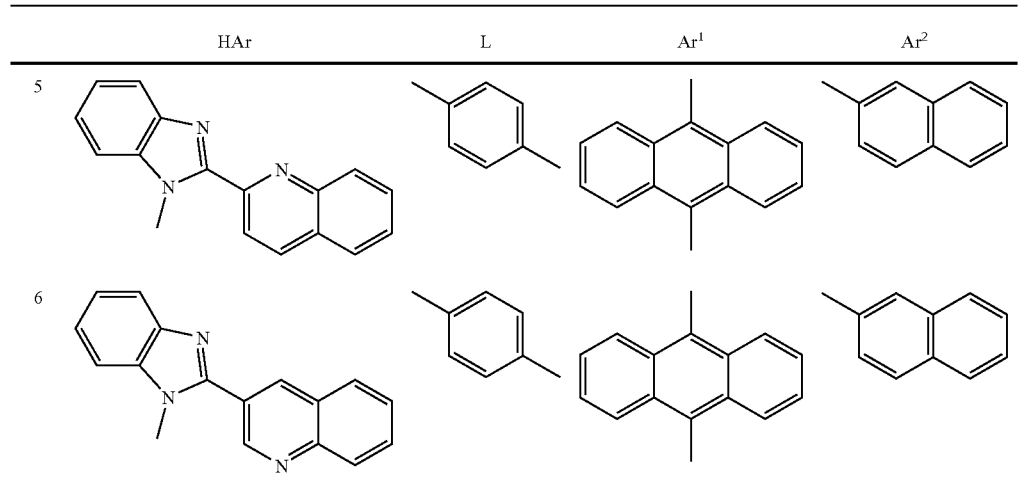
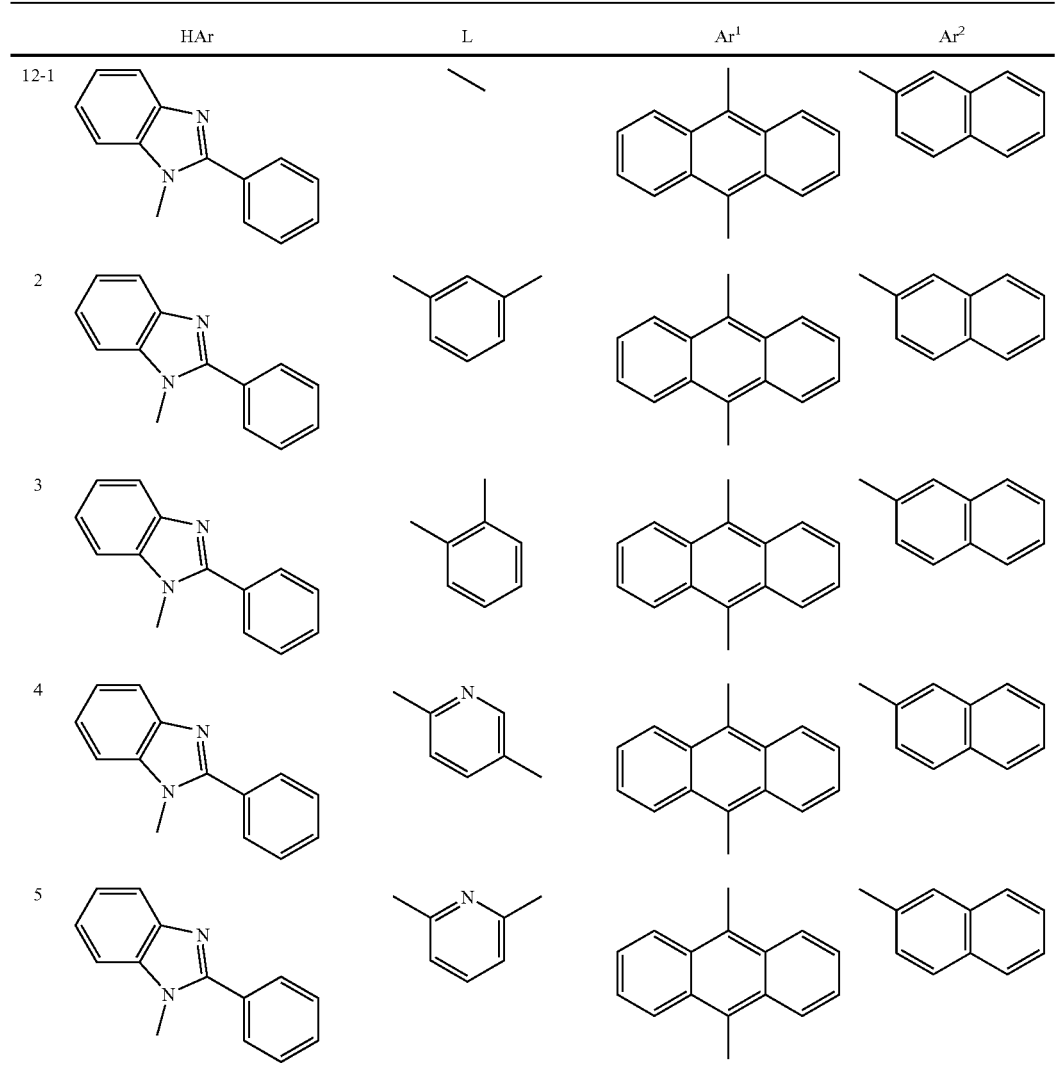

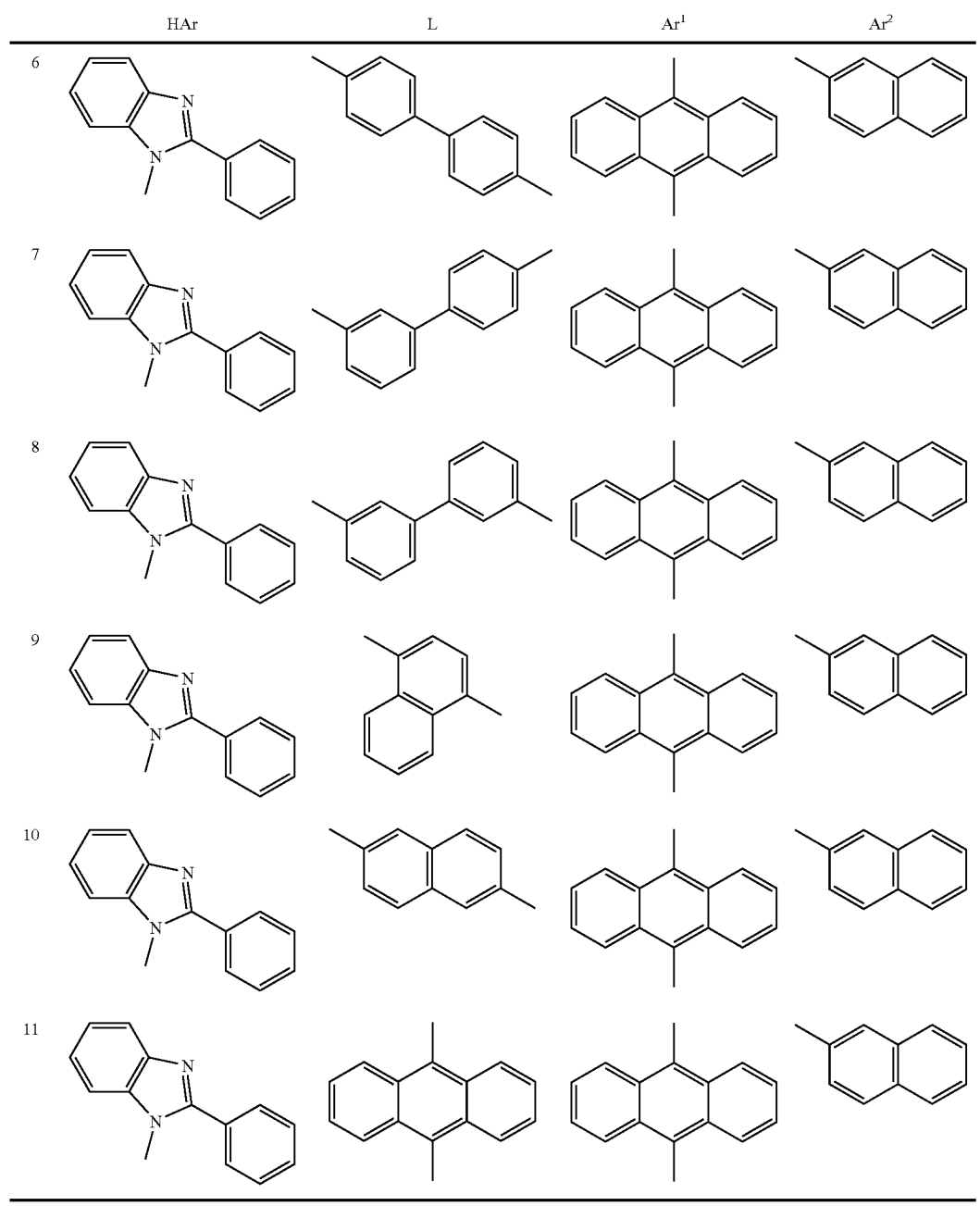
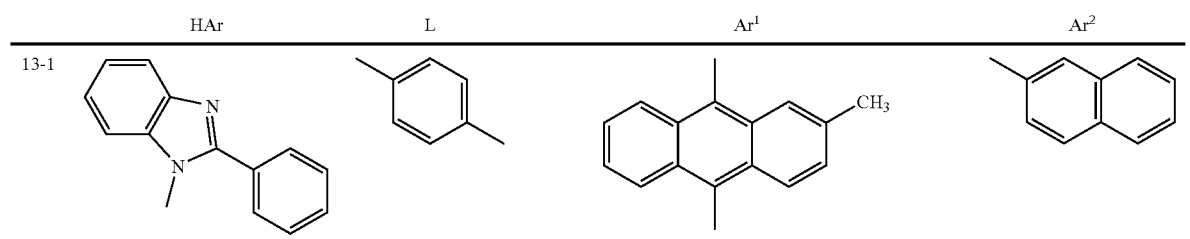

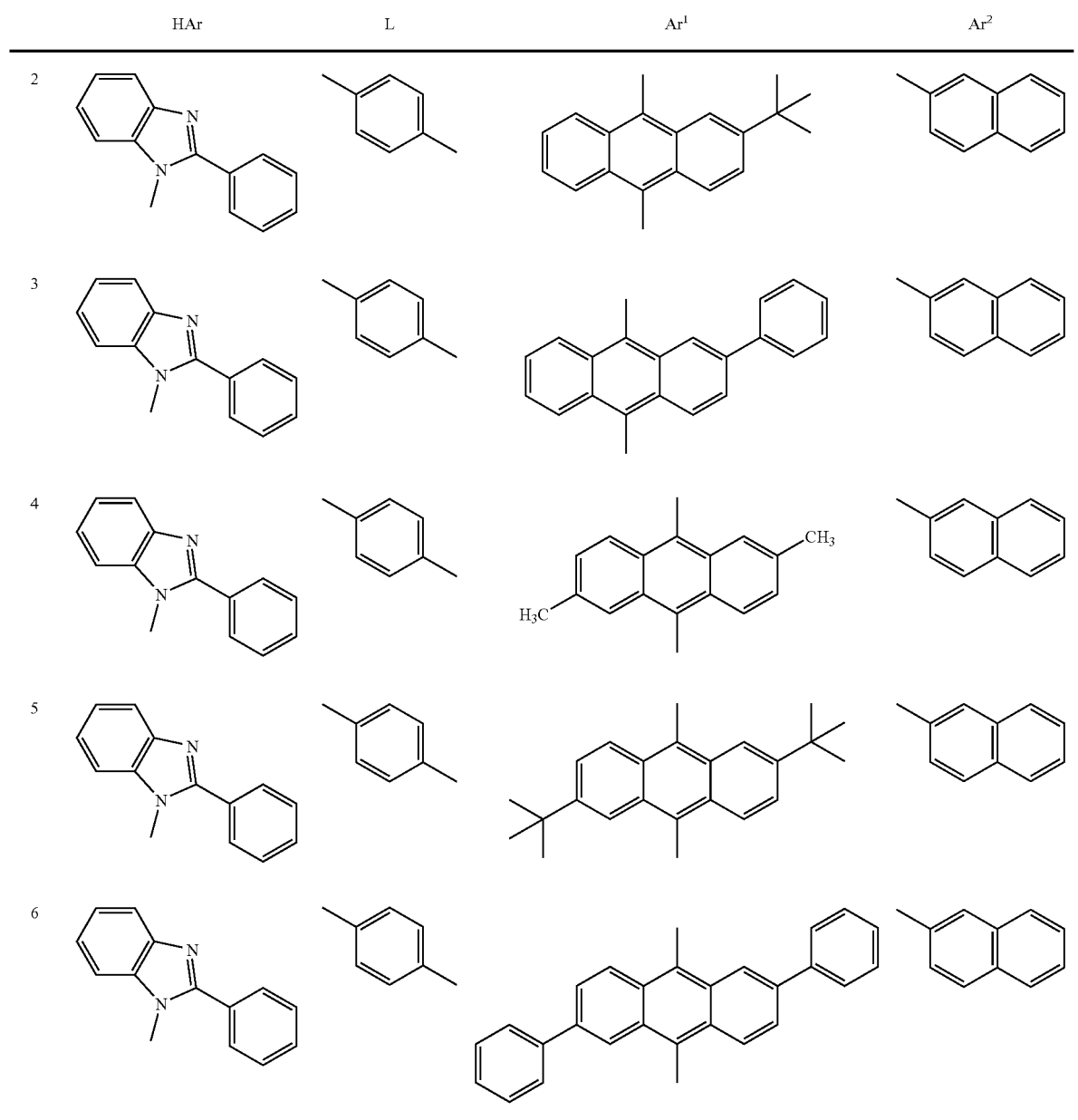
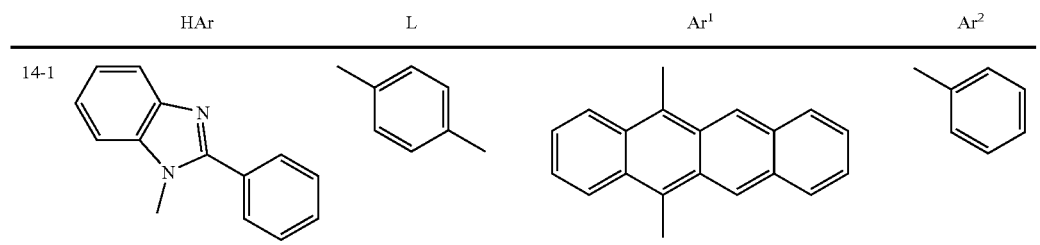

-continued
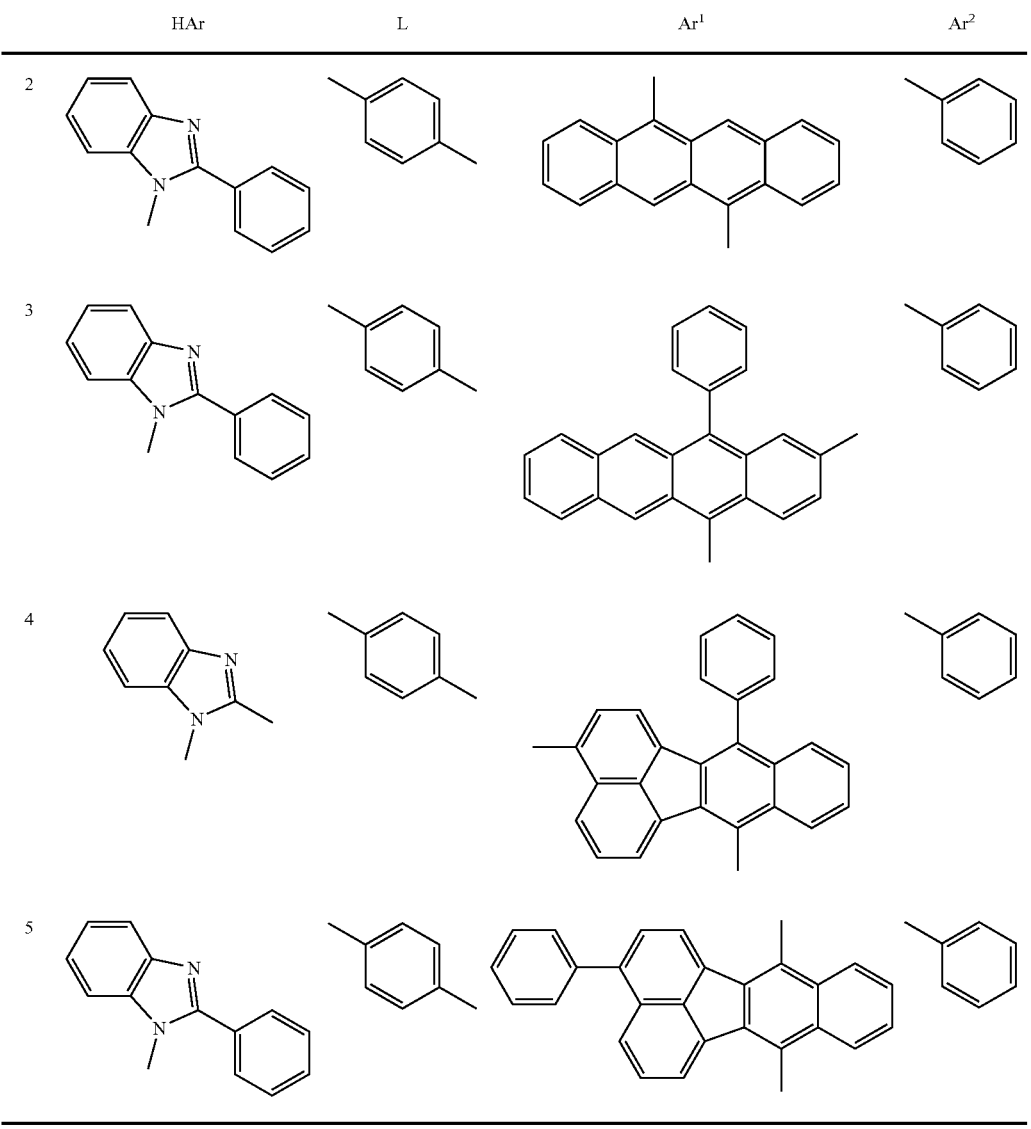
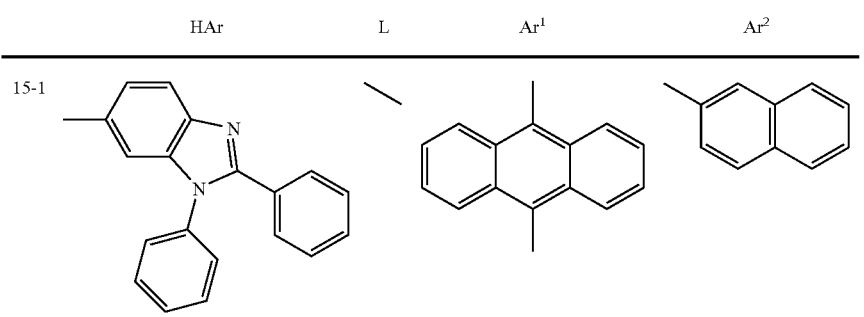

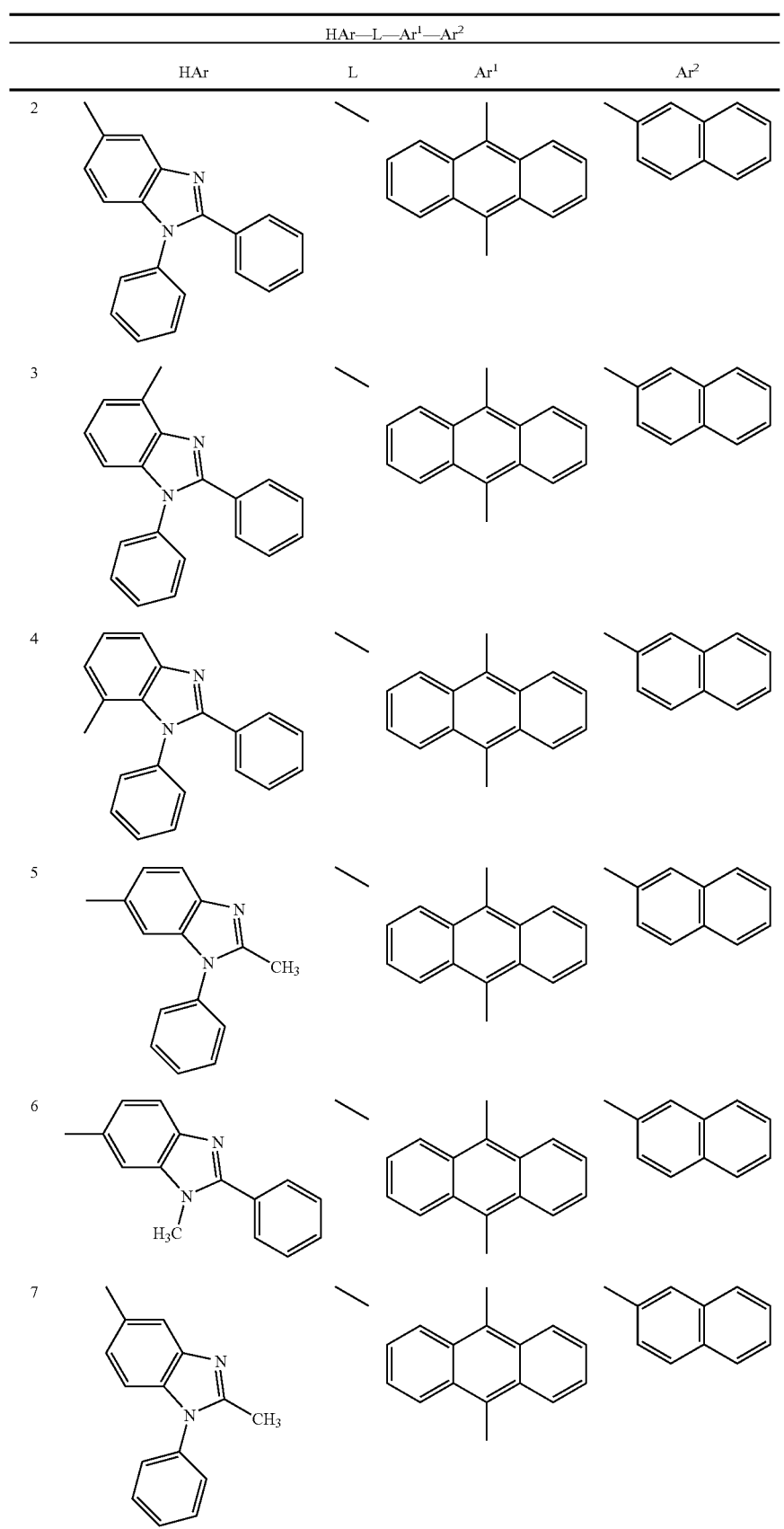

-continued
| HAr—L—Ar¹—Ar² | | | |
|---|---|---|---|
| HAr | L | Ar¹ | Ar² |
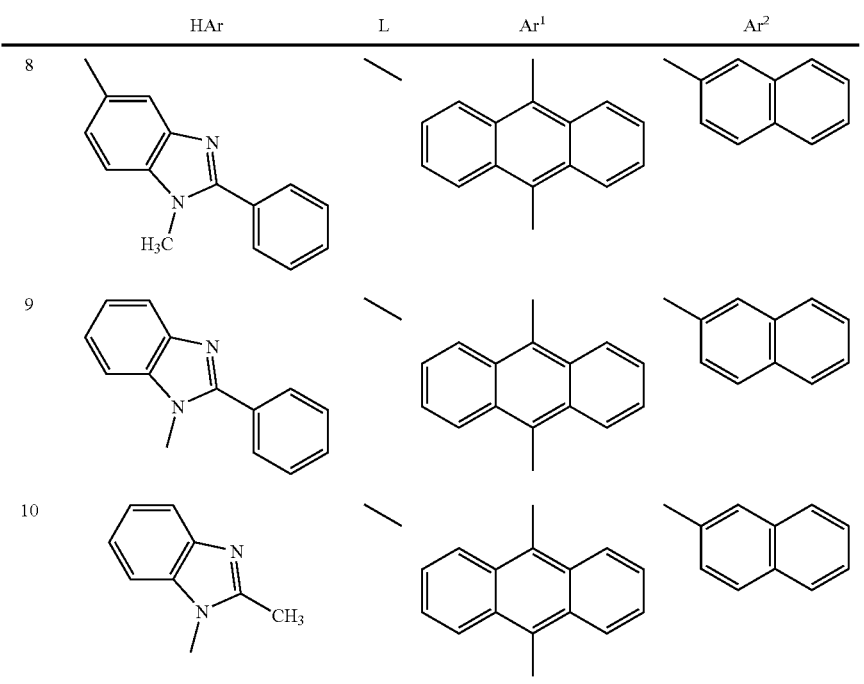
| HAr—L—Ar¹—Ar² | | | |
|---|---|---|---|
| HAr | L | Ar¹ | Ar² |
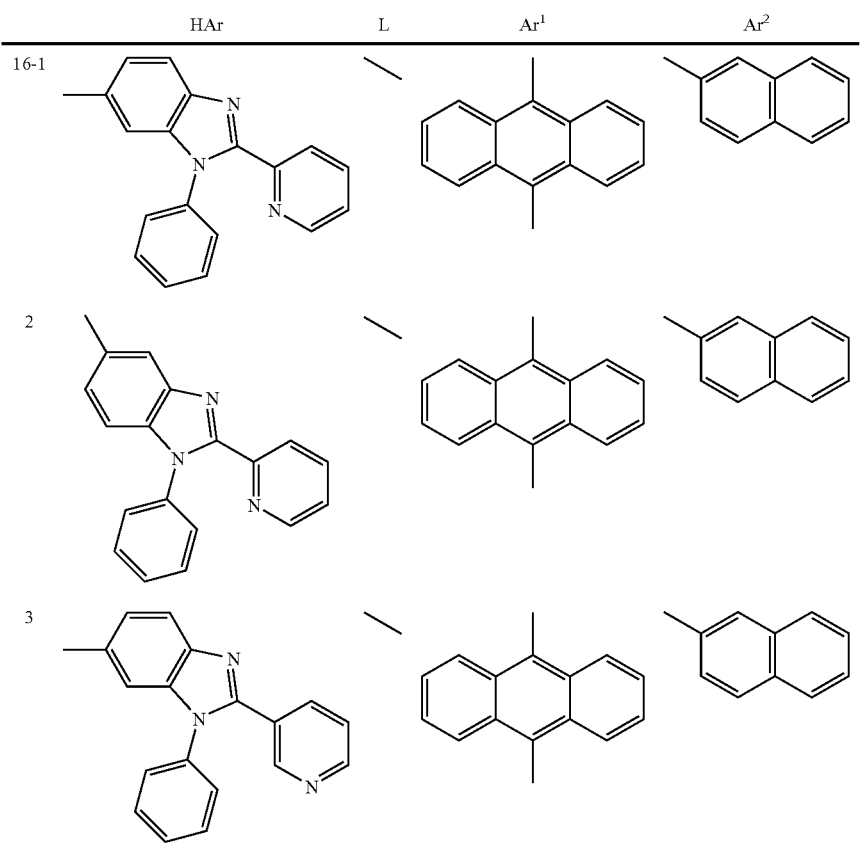

-continued

| HAr | L | Ar¹ | Ar² |
|---|---|---|---|
| 4 | — | | |
| 5 | — | | |
| 6 | — | | |
| 7 | — | | |
| 8 | — | | |

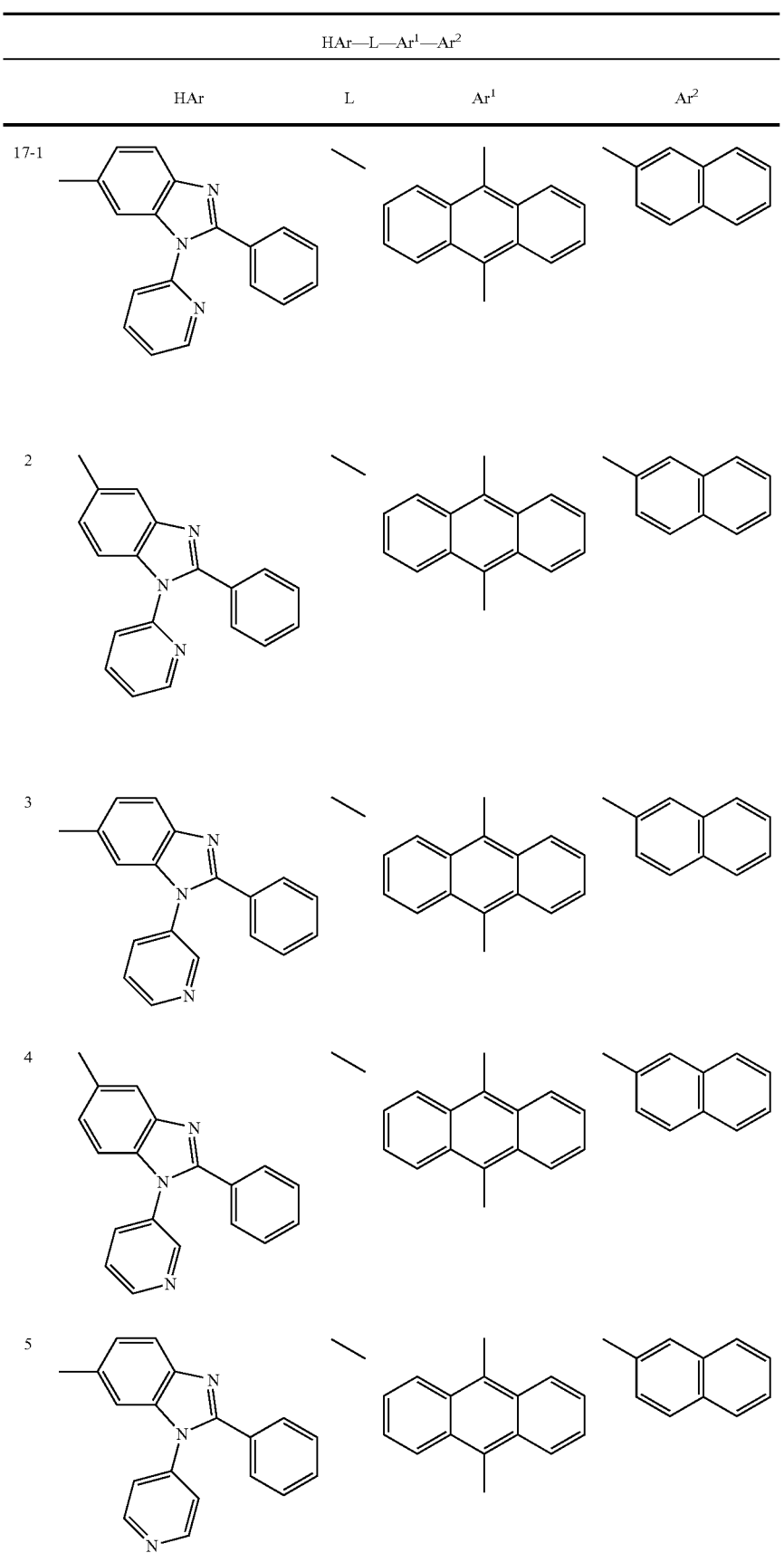

-continued

| HAr | L | Ar¹ | Ar² |
|---|---|---|---|

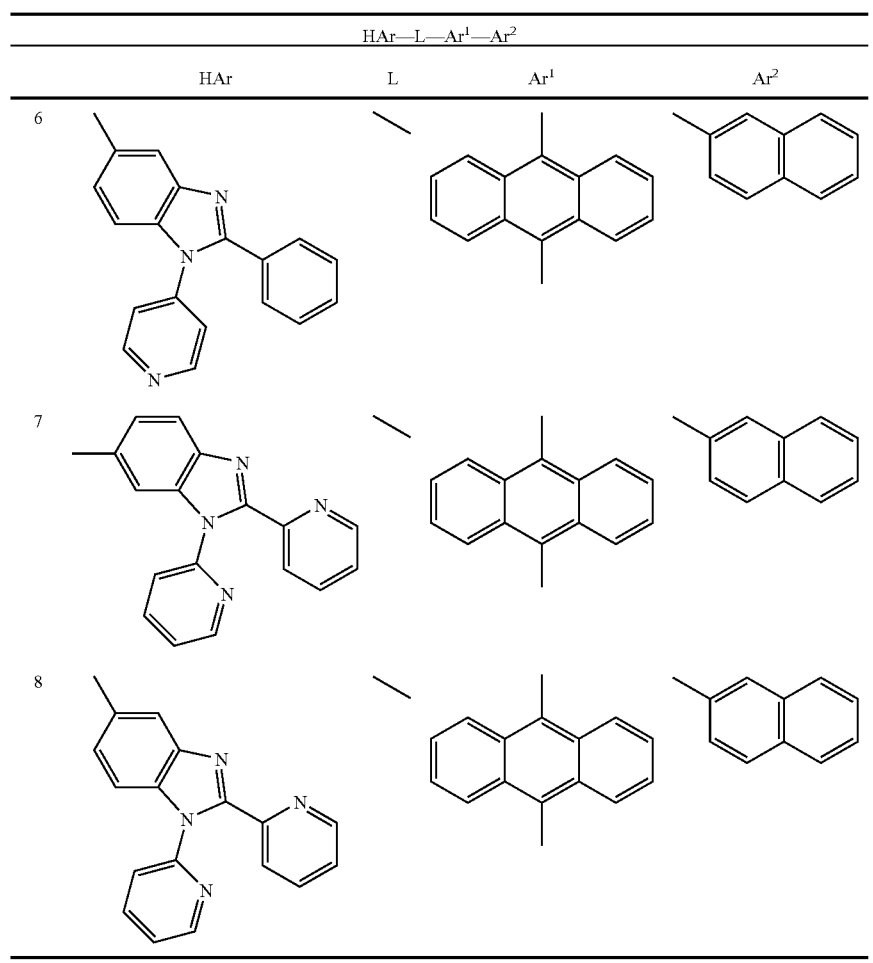

Among the above examples, examples (1-1), (1-5), (1-7), (2-1), (3-1), (4-2), (4-6), (7-2), (7-7), (7-8), (7-9), (9-1) and (9-7) are particularly preferred.

Although thickness of the electron injecting layer or the electron transporting layer is not specifically limited, the thickness is preferably 1 to 100 nm.

The electron injecting layer preferably contains an inorganic compound such as an insulator or a semiconductor in addition to the nitrogen-containing cyclic derivative. Such an insulator or a semiconductor, when contained in the electron injecting layer, can effectively prevent a current leak, thereby enhancing electron injectability of the electron injecting layer.

As the insulator, it is preferable to use at least one metal compound selected from a group consisting of an alkali metal chalcogenide, an alkali earth metal chalcogenide, a halogenide of alkali metal and a halogenide of alkali earth metal. By forming the electron injecting layer from the alkali metal chalcogenide or the like, the electron injecting capability can preferably be further enhanced. Specifically, preferable examples of the alkali metal chalcogenide are $Li_2O$, $K_2O$, $Na_2S$, $Na_2Se$ and $Na_2O$, while preferable example of the alkali earth metal chalcogenide are CaO, BaO, SrO, BeO, BaS and CaSe. Preferable examples of the halogenide of the alkali metal are LiF, NaF, KF, LiCl, KCl and NaCl. Preferable examples of the halogenide of the alkali earth metal are fluorides such as $CaF_2$, $BaF_2$, $SrF_2$, $MgF_2$ and $BeF_2$, and halogenides other than the fluoride.

Examples of the semiconductor are one of or a combination of two or more of an oxide, a nitride or an oxidized nitride containing at least one element selected from Ba, Ca, Sr, Yb, Al, Ga, In, Li, Na, Cd, Mg, Si, Ta, Sb and Zn. An inorganic compound for forming the electron injecting layer is preferably a microcrystalline or amorphous semiconductor film. When the electron injecting layer is formed of such insulator film, more uniform thin film can be formed, thereby reducing pixel defects such as a dark spot. Examples of such an inorganic compound are the above-described alkali metal chalcogenide, alkali earth metal chalcogenide, halogenide of the alkali metal and halogenide of the alkali earth metal.

When the electron injecting layer contains such an insulator or such a semiconductor, a thickness thereof is preferably in a range of approximately 0.1 to 15 nm. The electron injecting layer according to the present invention may preferably contain the above-described reductive dopant.

The hole injecting layer or the hole transporting layer (including the hole injecting/transporting layer) may contain an aromatic amine compound such as an aromatic amine derivative represented by the following general formula (I).

(I)

In the above formula (I), $Ar^1$ to $Ar^4$ each represent a substituted or unsubstituted aryl group having 6 to 50 carbon atoms for forming a ring or a substituted or unsubstituted heteroaryl group having 5 to 50 atoms for forming a ring.

Examples of the substituted or unsubstituted aryl group having 6 to 50 ring carbon atoms are a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, fluoranthenyl group, fluorenyl group and the like.

Examples of the substituted or unsubstituted heteroaryl group having 5 to 50 ring atoms are a 1-pyrroryl group, 2-pyrroryl group, 3-pyrroryl group, pyrazinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl 1-indolyl group, 4-t-butyl 1-indolyl group, 2-t-butyl 3-indolyl group, 4-t-butyl 3-indolyl group and the like. Among the above, a phenyl group, a naphthyl group, biphenyl group, anthranil group, phenanthryl group, pyrenyl group, chrysenyl group, fluoranthenyl group, fluorenyl group and the like are preferable.

L represents a link group. Specifically, L represents a substituted or unsubstituted arylene group having 6 to 50 carbon atoms forming a ring, a substituted or unsubstituted heteroarylene group having 5 to 50 atoms forming a ring, a divalent group formed by singly bonding, ether-bonding or thioether-bonding two or more arylene groups, a divalent group formed by bonding two or more arylene groups by alkylene group having 1 to 20 carbon atoms, alkenylene group having 2 to 20 carbon atoms or amino group, a divalent group formed by singly bonding, ether-bonding or thioether-bonding two or more heteroarylene groups, or a divalent group formed by bonding two or more heteroarylene groups by alkylene group having 1 to 20 carbon atoms, alkenylene group having 2 to 20 carbon atoms or amino group. Examples of the arylene group having 6 to 50 ring carbon atoms are a 1,4-phenylene group, 1,2-phenylene group, 1,3-phenylene group, 1,4-naphthylene group, 2,6-naphthylene group, 1,5-naphthylene group, 9,10-anthranylene group, 9,10-phenanthrenylene group, 3,6-phenanthrenylene group, 1,6-pyrenylene group, 2,7-pyrenylene group, 6,12-chrysenylene group, 4-4'-biphenylene group, 3,3'-biphenylene group, 2,2'-biphenylene group, 2,7-fluorenylene group and the like. Examples of the arylene group having 5 to 50 ring atoms are a 2,5-thiophenylene group, 2,5-silolylene group, 2,5-oxadiazolylene and the like. Among the above, a 1,4-phenylene group, 1,2-phenylene group, 1,3-phenylene group, 1,4-naphthylene group, 9,10-anthranylene group, 6,12-chrysenylene group, 4,4'-biphenylene group, 3,3'-biphenylene group, 2,2'-biphenylene group, and 2,7-fluorenylene group are preferable.

When L represents a link group formed of 2 or more arylene groups or 2 or more heteroarylene groups, adjacent arylene groups or adjacent heteroarylene groups may be bonded together via a divalent group to form a new ring. Examples of the divalent group for forming the ring are a tetramethylene group, a pentamethylene group, a hexamethylene group, a diphenylmethane-2,2'-diyl group, a diphenylethane-3,3'-diyl group, a diphenylpropane-4,4'-diyl group and the like.

Examples of a substituent for each of $Ar^1$ to $Ar^4$ and L are an amino group, a halogen atom, a cyano group, a nitro group and a hydroxy group each of which is substituted by a substituted or unsubstituted aryl group having 6 to 50 carbon atoms forming a ring, a substituted or unsubstituted heteroaryl group having 5 to 50 atoms forming a ring, a substituted or unsubstituted alkyl group having 1 to 50 carbon atoms, a substituted or unsubstituted cycloalkyl group having 3 to 50 carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 carbon atoms forming a ring, a substituted or unsubstituted heteroaryloxy group having 6 to 50 atoms forming a ring, a substituted or unsubstituted arylthio group having 6 to 50 carbon atoms forming a ring, a substituted or unsubstituted heteroarylthio group having 5 to 50 atoms forming a ring, a substituted or unsubstituted alkoxycarbonyl group having 2 to 50 carbon atoms, a substituted or unsubstituted aryl group having 6 to 50 carbon atoms forming a ring, or a substituted or unsubstituted heteroaryl group having 5 to 50 atoms forming a ring.

Examples of the substituted or unsubstituted aryl group having 6 to 50 ring carbon atoms are a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, fluoranthenyl group, fluorenyl group and the like.

Examples of the substituted or unsubstituted heteroaryl group having 5 to 50 ring atoms are a 1-pyrroryl group, 2-pyrroryl group, 3-pyrroryl group, pyrazinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl 1-indolyl group, 4-t-butyl 1-indolyl group, 2-t-butyl 3-indolyl group, 4-t-butyl 3-indolyl group and the like.

Examples of the substituted or unsubstituted alkyl group having 1 to 50 carbon atoms are a methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the substituted or unsubstituted cycloalkyl group having 3 to 50 carbon atoms are a cyclopropyl group, a cyclobutyl group, a cyclopentyl group, a cyclohexyl group, a 4-methylcyclohexyl group, a 1-adamantyl group, a 2-adamantyl group, a 1-norbornyl group, a 2-norbornyl group and the like.

The substituted or unsubstituted alkoxy group having 1 to 50 carbon atoms is a group represented by —OY. Examples of Y are a methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the substituted or unsubstituted aralkyl group having 7 to 50 carbon atoms are a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, 1-pyrrorylmethyl group, 2-(1-pyrroryl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, 1-chloro-2-phenylisopropyl group and the like.

The substituted or unsubstituted aryloxy group having 6 to 50 ring carbon atoms is represented by —OY'. Examples of Y' are a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group 3-methyl-2-naphthyl group, 4-methyl-1-naphthyl group, 4-methyl-1-anthryl group, 4'-methylbiphenylyl group, 4"-t-butyl-p-terphenyl-4-yl group and the like.

The substituted or unsubstituted heteroaryloxy group having 5 to 50 ring atoms is represented by —OZ'. Examples of Z' are a 2-pyrroryl group, 3-pyrroryl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl 1-indolyl group, 4-t-butyl 1-indolyl group, 2-t-butyl 3-indolyl group, 4-t-butyl 3-indolyl group and the like.

The substituted or unsubstituted arylthio group having 6 to 50 ring carbon atoms is represented by —SY". Preferable examples of Y" are a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group and the like.

The substituted or unsubstituted heteroarylthio group having 5 to 50 ring atoms is represented by —SZ". Examples of Z" are a 2-pyrroryl group, 3-pyrroryl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl 1-indolyl group, 4-t-butyl 1-indolyl group, 2-t-butyl 3-indolyl group, 4-t-butyl 3-indolyl group and the like.

The substituted or unsubstituted alkoxycarbonyl group having 2 to 50 carbon atoms is a group represented by —COOZ. Examples of Z are a methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group and the like.

The amino group substituted by the substituted or unsubstituted aryl group having 6 to 50 ring carbon atoms or the substituted or unsubstituted heteroarylthio group having 5 to 50 ring atoms is represented by —NPQ. Examples of P and Q are a phenyl group, 1-naphthyl group, 2-naphtyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrroryl group, 3-pyrroryl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl 1-indolyl group, 4-t-butyl 1-indolyl group, 2-t-butyl 3-indolyl group, 4-t-butyl 3-indolyl group and the like.

Examples of the compound represented by the general formula (1) are shown below. However, the compound represented by the formula (1) is not limited thereto.

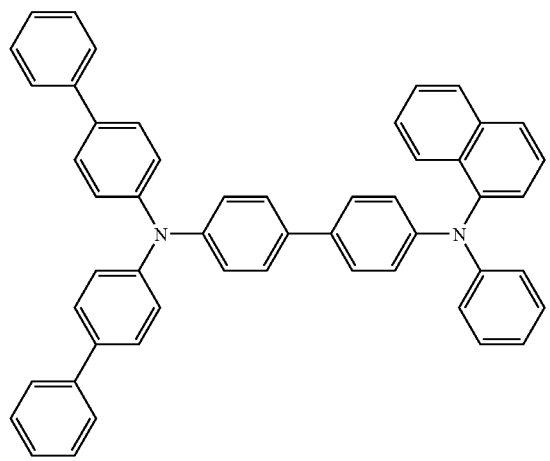

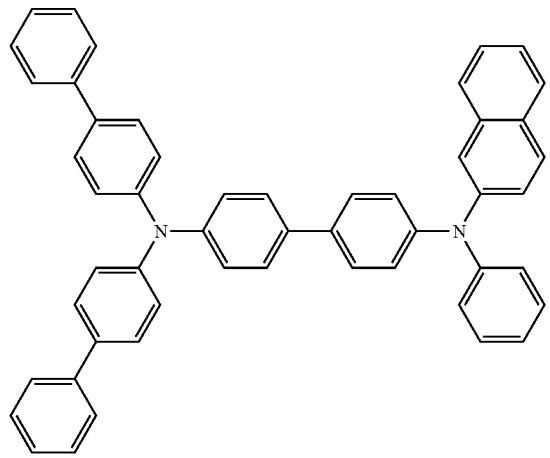

127
-continued
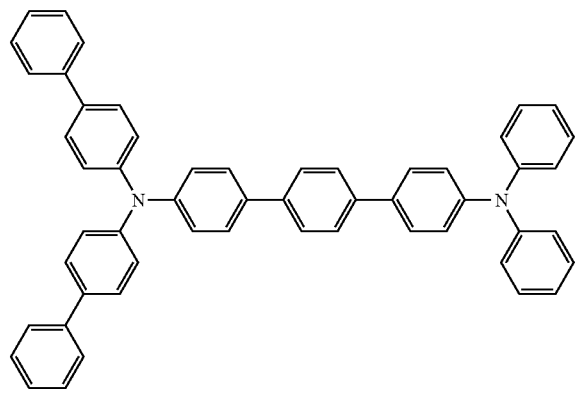
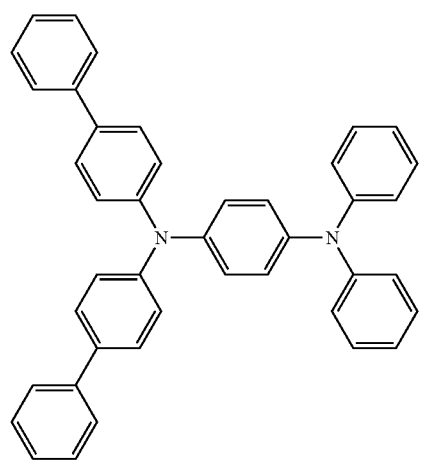
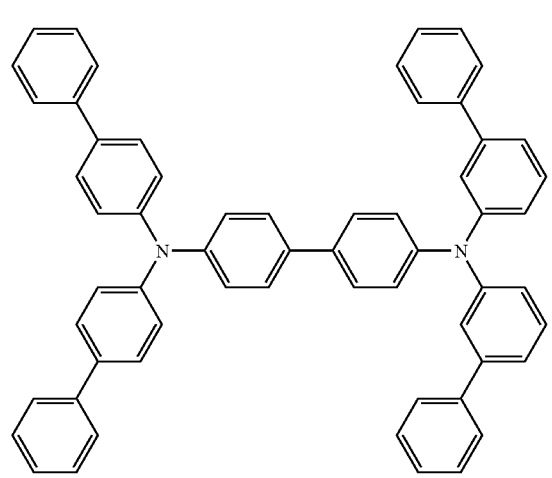
128
-continued
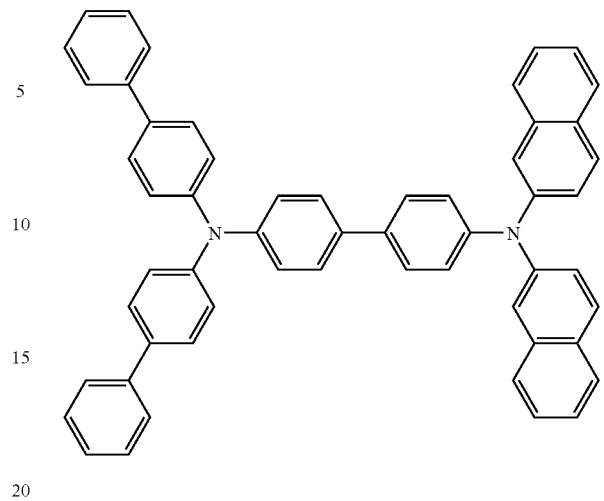
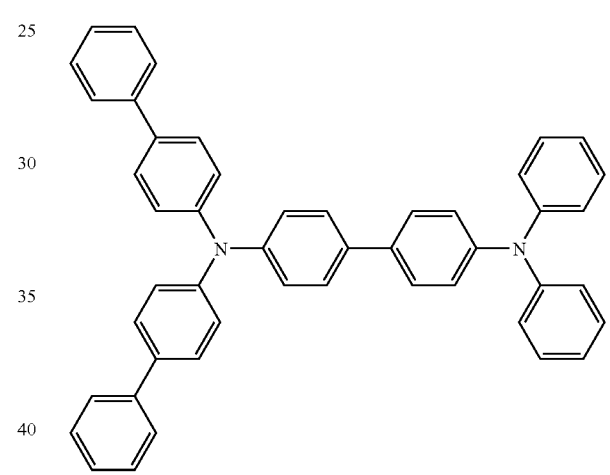
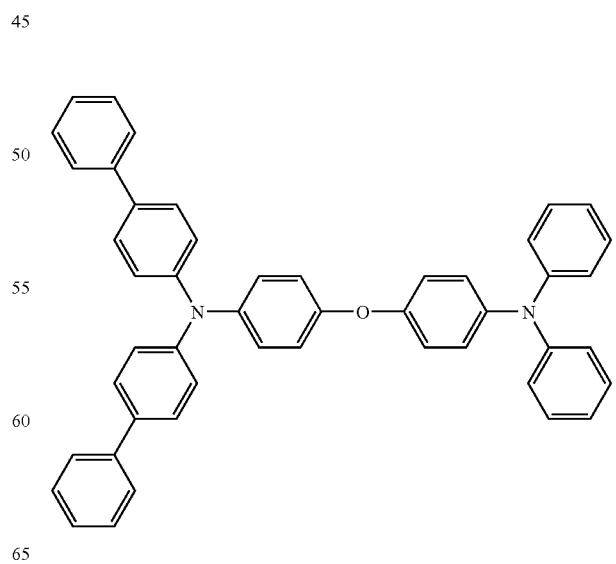

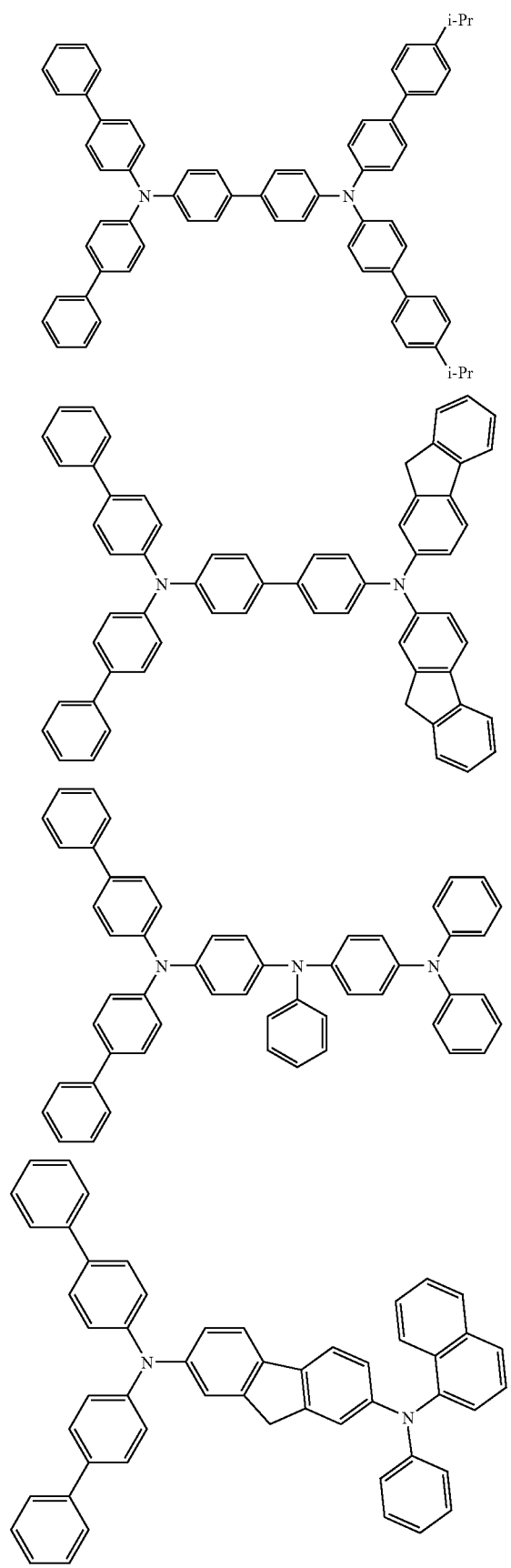
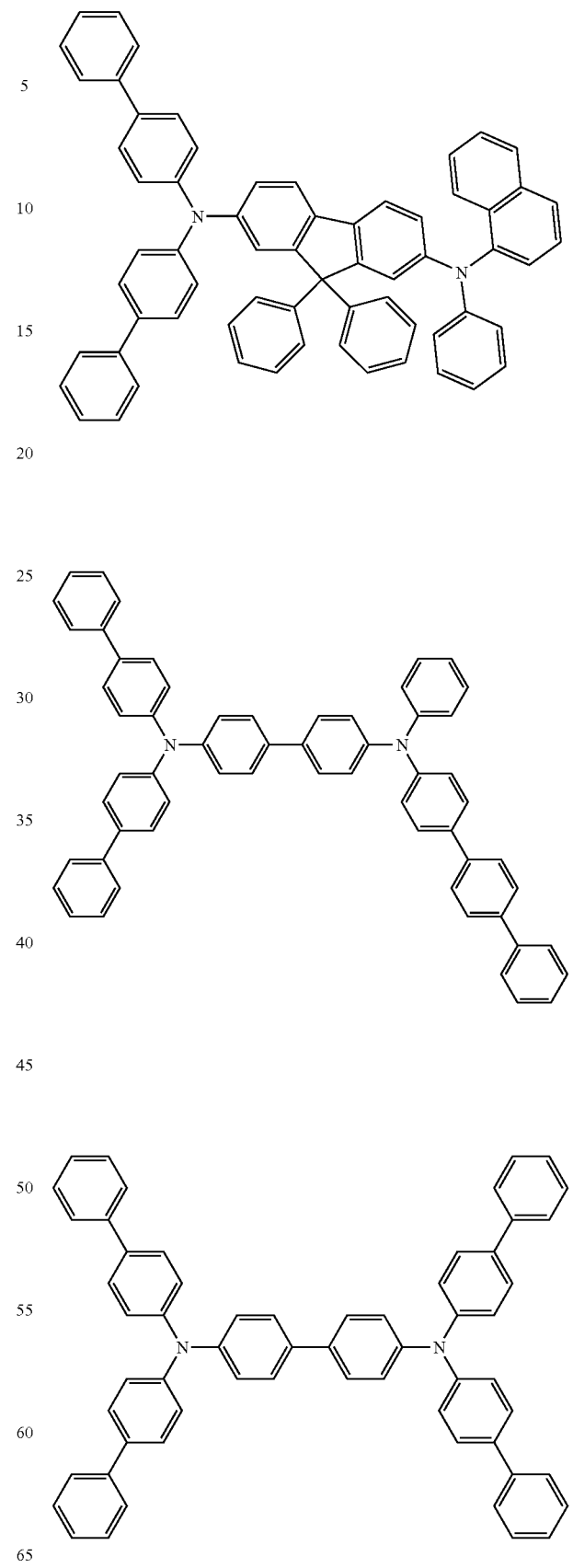

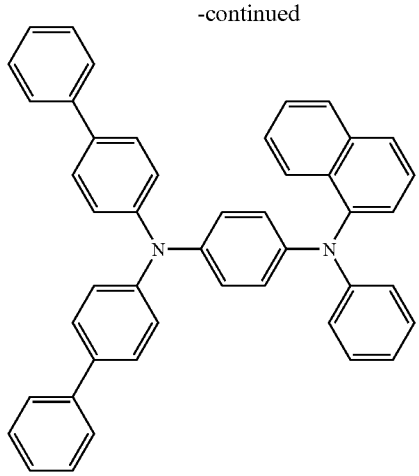
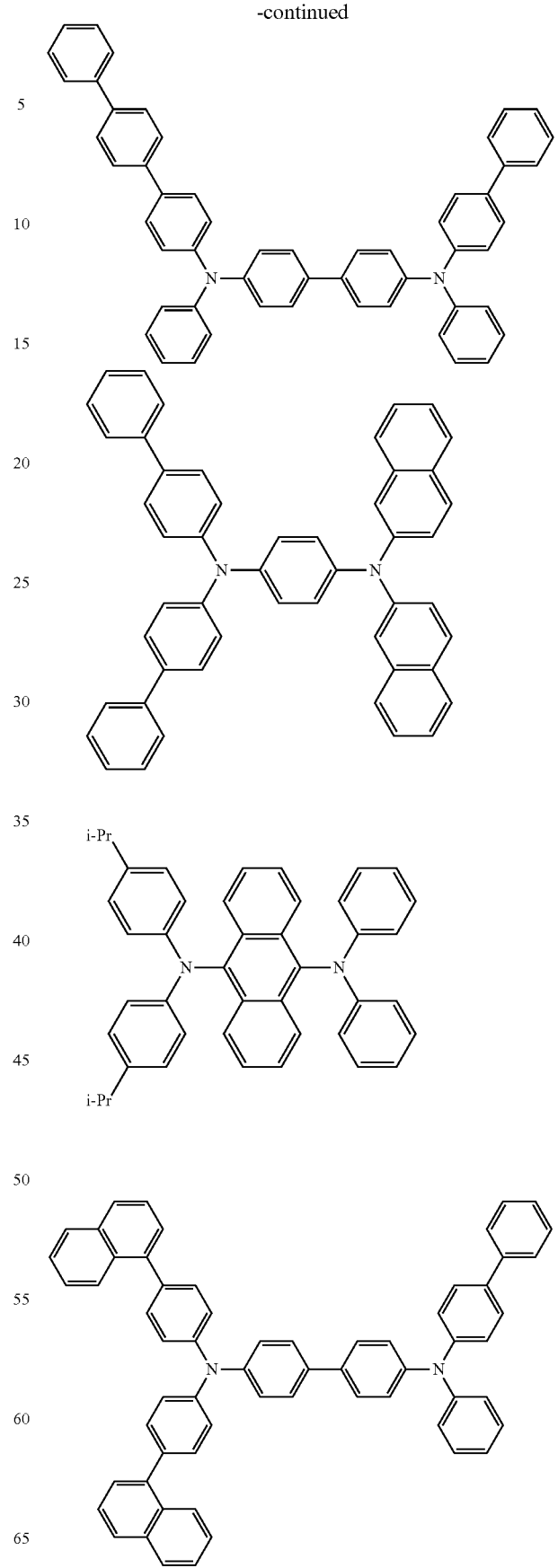

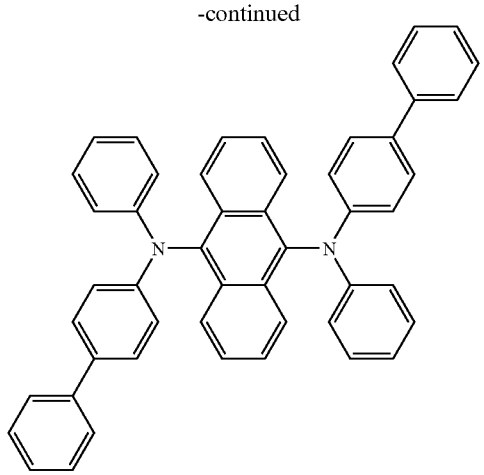

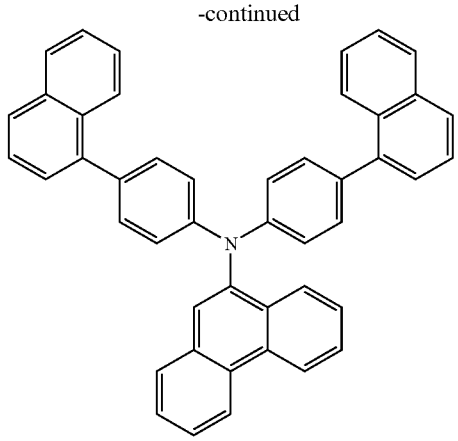

Aromatic amine represented by the following general formula (II) can also be preferably used for forming the hole injecting layer or the hole transporting layer.

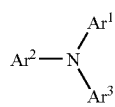 (II)

In the general formula (II), $Ar^1$ to $Ar^3$ each represent the same as those represented by $Ar^1$ to $Ar^4$ of the general formula (I). Examples of the compound represented by the general formula (II) are shown below. However, the compound represented by the formula (II) is not limited thereto.

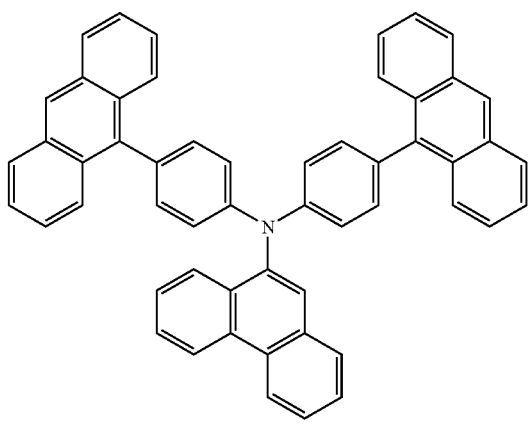

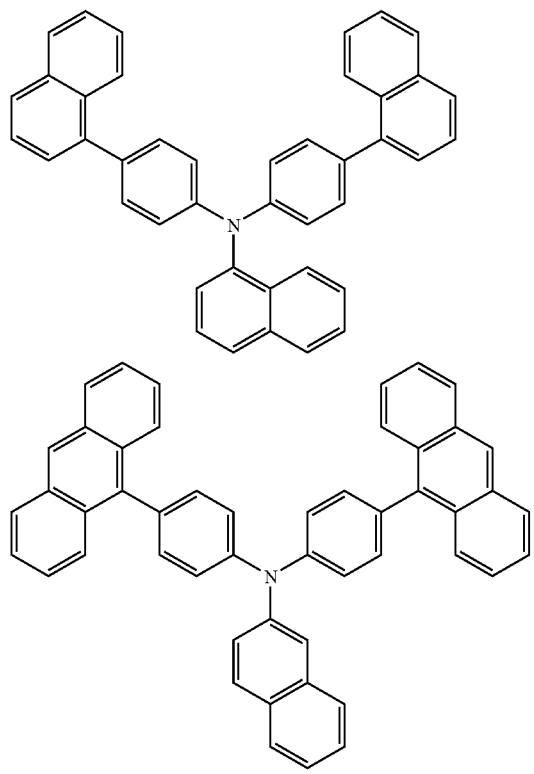

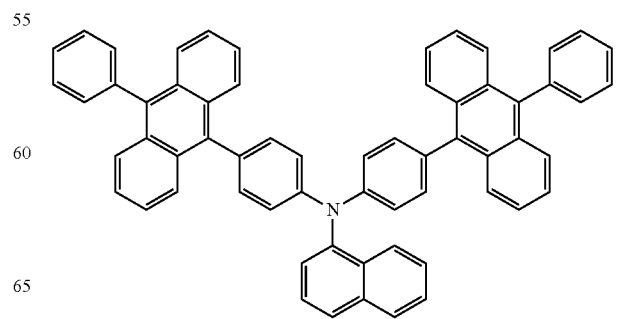

-continued

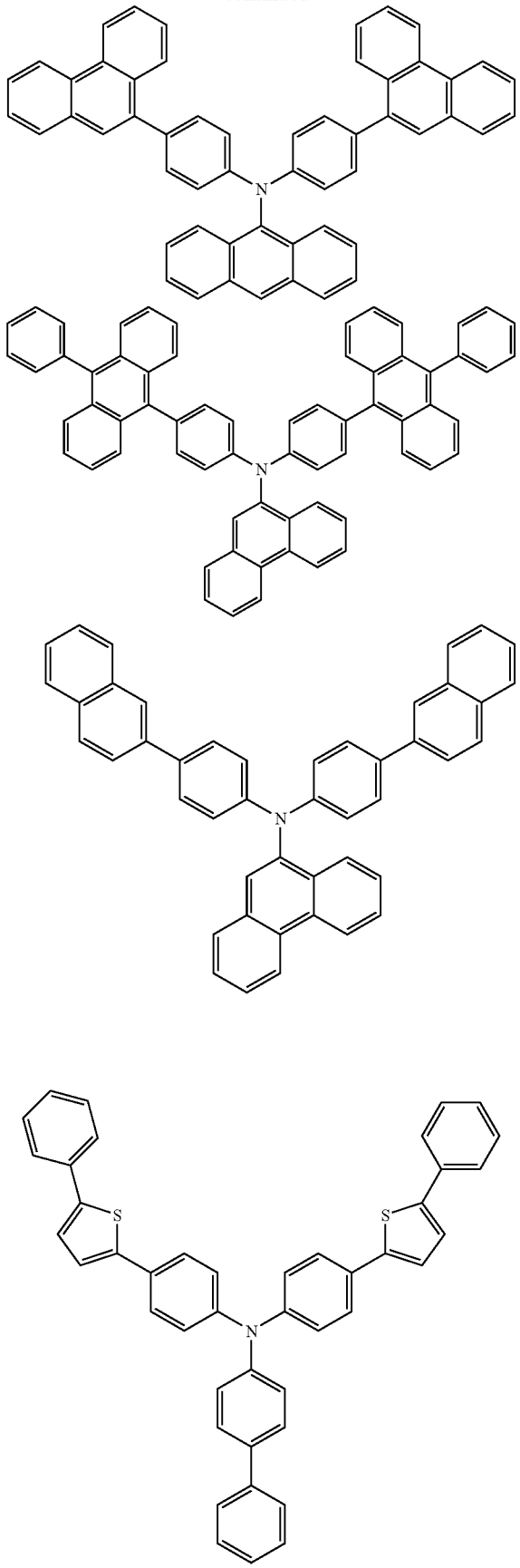
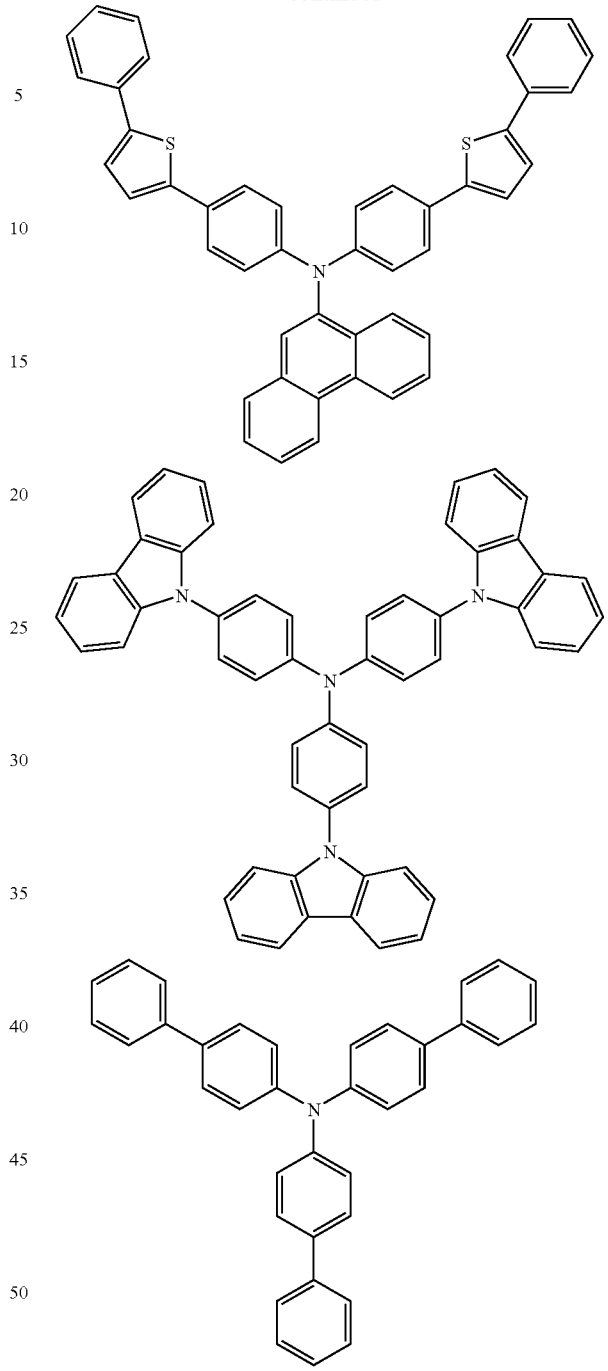

It should be noted that the present invention is not limited to the above description but may include any modification as long as such modification stays within a scope and a spirit of the present invention.

For instance, the following is a preferable example of such modification made to the present invention.

According to the aspect of the present invention, the emitting layer may also preferably contain an assistance substance for assisting injection of charges.

When the emitting layer is formed of a host material that exhibits a wide energy gap, a difference in ionization potential (Ip) between the host material and the hole injecting/transporting layer etc. becomes so large that the holes can hardly be injected into the emitting layer and that a driving voltage required for providing sufficient luminance may be raised.

In the above instance, introducing a hole-injectable or hole-transportable assistance substance for assisting injection of charges in the emitting layer can contribute to facilitation of the injection of the holes into the emitting layer and to reduction of the driving voltage.

As the assistance substance for assisting the injection of charges, for instance, a general hole injecting material, a general hole transporting material or the like can be used.

Examples of the material are a triazole derivative (see, for instance, the specification of U.S. Pat. No. 3,112,197), an oxadiazole derivative (see, for instance, the specification of U.S. Pat. No. 3,189,447), an imidazole derivative (see, for instance, JP-B-37-16096), a polyarylalkane derivative (see, for instance, the specifications of U.S. Pat. Nos. 3,615,402, 3,820,989 and 3,542,544, JP-B-45-555, JP-B-51-10983, JP-A-51-93224, JP-A-55-17105, JP-A-56-4148, JP-A-55-108667, JP-A-55-156953, and JP-A-56-36656), a pyrazoline derivative and a pyrazolone derivative (see, for instance, the specifications of U.S. Pat. Nos. 3,180,729 and 4,278,746, JP-A-55-88064, JP-A-55-88065, JP-A-49-105537, JP-A-55-51086, JP-A-56-80051, JP-A-56-88141, JP-A-57-45545, JP-A-54-112637 and JP-A-55-74546), a phenylenediamine derivative (see, for instance, the specification of U.S. Pat. No. 3,615,404, JP-B-51-10105, JP-B-46-3712, JP-B-47-25336, JP-A-54-53435, JP-A-54-110536 and JP-A-54-119925), an arylamine derivative (see, for instance, the specifications of U.S. Pat. Nos. 3,567,450, 3,180,703, 3,240,597, 3,658,520, 4,232,103, 4,175,961 and 4,012,376, JP-B-49-35702, JP-B-39-27577, JP-A-55-144250, JP-A-56-119132 and JP-A-56-22437 and the specification of West Germany Patent No. 1,110,518), an amino-substituted chalcone derivative (see, for instance, the specification of U.S. Pat. No. 3,526,501), an oxazole derivative (disclosed in, for instance, the specification of U.S. Pat. No. 3,257,203), a styrylanthracene derivative (see, for instance, JP-A-56-46234), a fluorenone derivative (see, for instance, JP-A-54-110837), a hydrazone derivative (see, for instance, the specification of U.S. Pat. No. 3,717,462 and JP-A-54-59143, JP-A-55-52063, JP-A-55-52064, JP-A-55-46760, JP-A-55-85495, JP-A-57-11350, JP-A-57-148749 and JP-A-02-311591), a stilbene derivative (see, for instance, JP-A-61-210363, JP-A-61-228451, JP-A-61-14642, JP-A-61-72255, JP-A-62-47646, JP-A-62-36674, JP-A-62-10652, JP-A-62-30255, JP-A-60-93455, JP-A-60-94462, JP-A-60-174749 and JP-A-60-175052), a silazane derivative (see the specification of U.S. Pat. No. 4,950,950), a polysilane type (see JP-A-02-204996), an aniline-based copolymer (see JP-A-02-282263), and a conductive polymer oligomer (particularly, thiophene oligomer) disclosed in JP-A-01-211399.

The hole-injectable material, examples of which are as listed above, is preferably a porphyrin compound (disclosed in JP-A-63-295695 etc.), an aromatic tertiary amine compound or a styrylamine compound (see, for instance, the specification of U.S. Pat. No. 4,127,412, JP-A-53-27033, JP-A-54-58445, JP-A-54-149634, JP-A-54-64299, JP-A-55-79450, JP-A-55-144250, JP-A-56-119132, JP-A-61-295558, JP-A-61-98353 or JP-A-63-295695), particularly preferably an aromatic tertiary amine compound.

In addition, 4,4'-bis(N-(1-naphthyl)-N-phenylamino)biphenyl (hereinafter, abbreviated as NPD) having in the molecule two condensed aromatic rings disclosed in U.S. Pat. Nos. 5,061,569, 4,4',4"-tris(N-(3-methylphenyl)-N-phenylamino)triphenylamine (hereinafter, abbreviated as MTDATA) in which three triphenylamine units disclosed in JP-A-04-308688 are bonded in a starbust form and the like may also be used.

Further, a hexaazatriphenylene derivative disclosed in Japanese Patent No. 3614405 and No. 3571977 and U.S. Pat. No. 4,780,536 may also preferably be used as the hole-injectable material.

Alternatively, inorganic compounds such as p-type Si and p-type SiC can also be used as the hole-injectable material.

A method of forming each of the layers in the organic EL device according to the present invention is not particularly limited. A conventionally-known methods such as vacuum deposition or spin coating may be employed for forming the layers. The organic thin-film layer containing the compound represented by the formula (1), which is used in the organic EL device according to the present invention, may be formed by a conventional coating method such as vacuum deposition, molecular beam epitaxy (MBE method) and coating methods using a solution such as a dipping, spin coating, casting, bar coating, and roll coating.

Although the thickness of each organic layer of the organic EL device is not particularly limited, the thickness is generally preferably in a range of several nanometers to 1 μm because an excessively-thinned film is likely to entail defects such as a pin hole while an excessively-thickened film requires high voltage to be applied and deteriorates efficiency.

SYNTHESIS EXAMPLE

Compounds according to the present invention can be synthesized by Suzuki-Miyaura cross coupling reaction.

Next, a manufacturing method of the host material according to the present invention will be described with reference to synthesis example(s). However, the present invention is not limited to the description made herein.

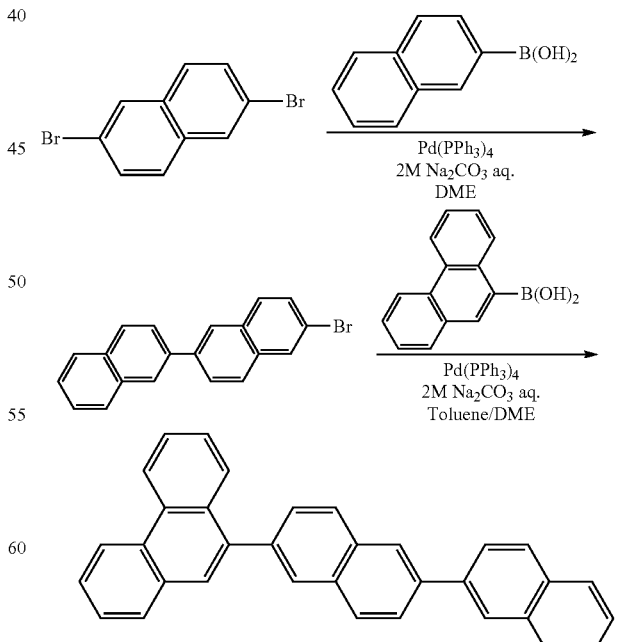

A1

Synthesis Example 1

Synthesis of Compound A1

Synthesis of 2-bromo-6-(2-naphthyl)naphthalene

Under an argon gas atmosphere, 246 g (860 mmol) of 2,6-dibromonaphthalene, 163 g (950 mmol) of 2-naphthalene boronic acid, 20 g (17.0 mmol) of tetrakis(triphenylphosphine)palladium(0), 3 L of dimethoxyethane (DME) and 1.5 L of 2M sodium carbonate solution were mixed, and stirred for 16 hours while being refluxed. After the completion of the reaction, precipitated crystal was separated by filtration. Then, the obtained solid was cleansed with water, methanol and hexane. The obtained solid was dried under reduced pressure, and 197 g of 2-bromo-6-(2-naphthyl)naphthalene was obtained at an yield of 69%.

Under an argon gas atmosphere, 5.00 g (15.0 mmol) of 2-bromo-6-(2-naphthyl)naphthalene, 3.50 g (15.8 mmol) of 9-phenanthreneboronic acid, 0.87 g (0.750 mmol) of tetrakis(triphenylphosphine)palladium(0), 50 mL of toluene, 50 mL of dimethoxyethane and 22.5 mL of 2M sodium carbonate solution were mixed, and stirred for 16 hours while being refluxed. After the completion of the reaction, precipitated crystal was separated by filtration. Then, the obtained solid was cleansed with water, methanol and hexane. By recrystallizing the obtained solid by toluene several times, 4.50 g of a white solid was obtained at an yield of 70%. Mass-spectrum analysis consequently showed that the white solid was a target object, and that m/e was equal to 430 while a calculated molecular weight was 430.17.

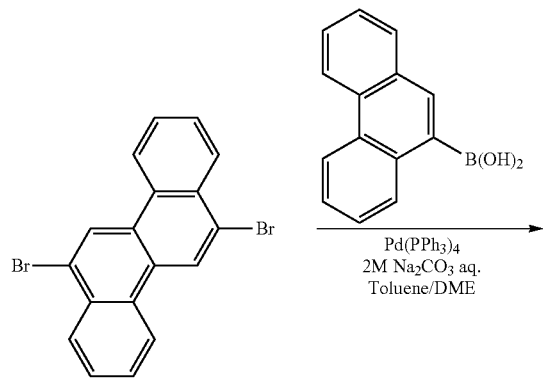

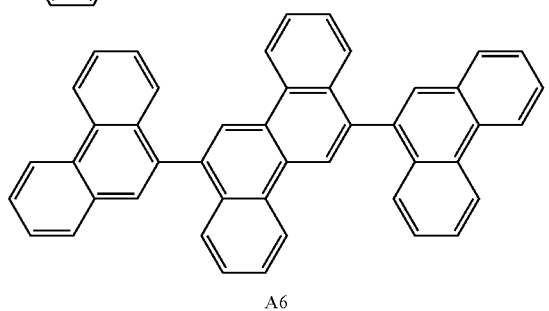

A6

Synthesis Example 2

Synthesis of Compound A6

Under an argon gas atmosphere, 5.00 g (13.0 mmol) of 6,12-dibromochrysene, 6.04 g (27.2 mmol) of 9-phenanthreneboronic acid, 0.75 g (0.65 mmol) of tetrakis(triphenylphosphine)palladium(0), 50 mL of toluene, 50 mL of dimethoxyethane and 40 mL of 2M sodium carbonate solution were mixed, and stirred for 10 hours at 90 degrees C. Subsequently, the reaction mixture was warmed up to room temperature, added with water and stirred for 1 hour. After the solid precipitated during the reaction was separated by filtration, the obtained solid was cleansed with water, methanol, dimethoxyethane and toluene in this order. By dissolving the obtained solid in toluene and refining the solution by silica-gel column chromatography, 4.6 g of the compound A6 was obtained at an yield of 61%.

Mass-spectrum analysis consequently showed that m/e was equal to 580 while a calculated molecular weight was 580.22.

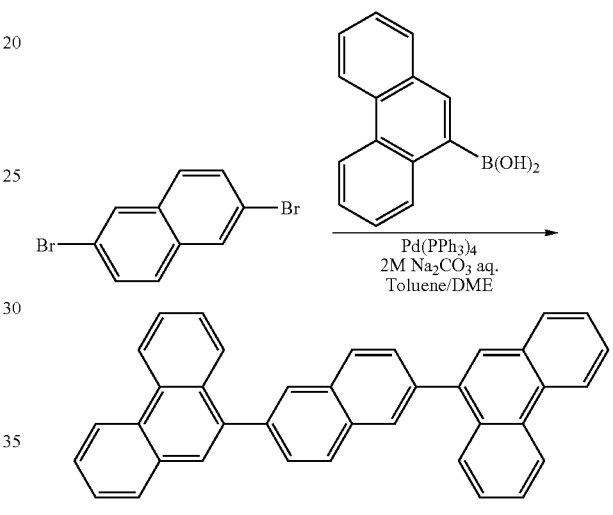

A22

Sythesis Example 3

Synthesis of Compound A22

The compound A22 was synthesized by the same method as the compound A6 except that 2,6-dibromonaphthalene was used in place of 6,12-dibromochrysene.

Mass-spectrum analysis consequently showed that m/e was equal to 480 while a calculated molecular weight was 480.19.

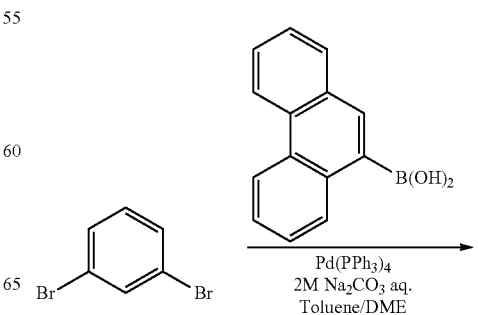

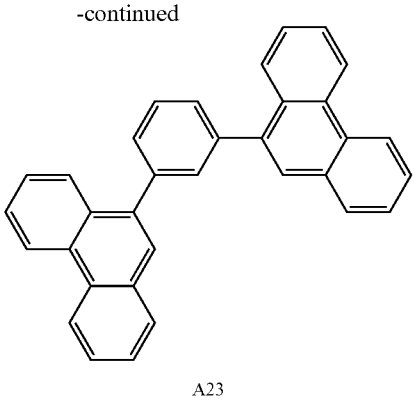

A23

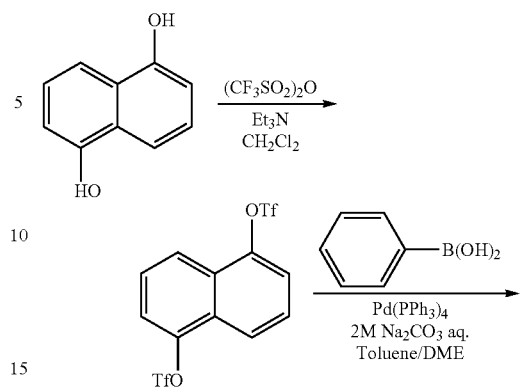

Sythesis Example 4

Synthesis of Compound A23

The compound A23 was synthesized by the same method as the compound A6 except that 1,3-dibromobenzene was used in place of 6,12-dibromochrysene.

Mass-spectrum analysis consequently showed that m/e was equal to 430 while a calculated molecular weight was 430.17.

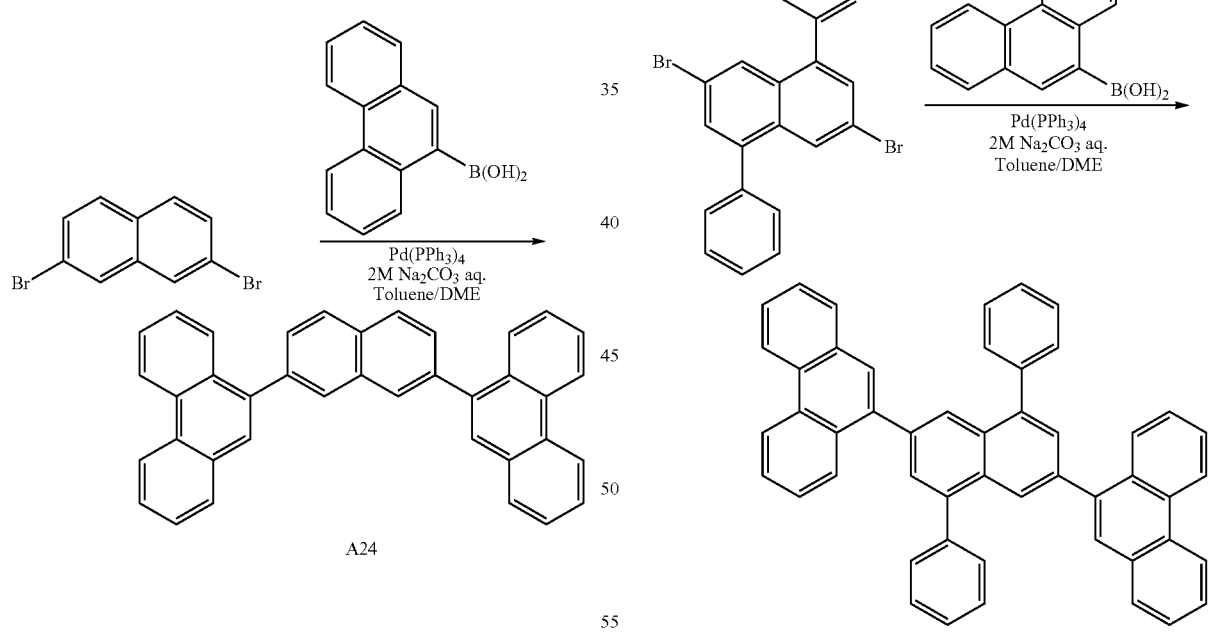

Sythesis Example 5

Synthesis of Compound A24

The compound A24 was synthesized by the same method as the compound A6 except that 2,7-dibromonaphthalene was used in place of 6,12-dibromochrysene.

Mass-spectrum analysis consequently showed that m/e was equal to 480 while a calculated molecular weight was 480.19.

Sythesis Example 6

Synthesis of Compound B15

Under an argon gas atmosphere, a mixture of 25.00 g (156.1 mmol) of 1,5-naphthalenediol, 60.52 g (468.3 mmol) of diisopropylamine and 250 ml of dehydrated dichloromethane was cooled down to 0 degree C., and 132.11 g (468.3 mmol) of trifluoromethanesulfonic anhydride was dropped into the mixture while the mixture was being stirred. Then, the mixture was warmed up to room temperature, and stirred for 18 hours. The reaction mixture was further added with water, and organic phase thereof was cleansed with water and dried with magnesium sulfate. After the solvent was distilled away, residue was refined by column chromatography, so that 49.0 g of 5-{[(trifluoromethyl)sulfonyl]oxy}naphthyl trifluoromethanesulfonate was obtained at an yield of 74%.

Under an argon gas atmosphere, 49.0 g (106.1 mmol) of 5-{[(trifluoromethyl)sulfonyl]oxy}naphthyl trifluoromethanesulfonate, 28.5 g (233.3 mmol) of phenylboronic acid, 4.90 g (4.24 mmol) of tetrakis(triphenylphosphine) palladium(0), 200 mL of toluene, 100 mL of dimethoxyethane and 320 mL of 2M sodium carbonate solution were mixed, and stirred for 24 hours at 90 degrees C. After the reaction in the mixture was over, the mixture experienced filtration, through which aqueous phase thereof was eliminated. After organic phase thereof was cleansed by water and dried with magnesium sulfate, the solvent was distilled away under reduced pressure. Residue thereof was refined by silica-gel column chromatography, such that 18.0 g of 1,5-diphenyl-naphthalene was obtained with an yield of 60%.

A mixture of 15.5 g (55.3 mmol) of 1,5-diphenylnaphthalene, 0.93 g (16.6 mmol) of iron powder and 3000 ml of carbon tetrachloride was added with drops of a solution in which 17.7 g (11.06 mmol) of bromine and 40 ml of carbon tetrachloride were mixed, and stirred for six days at room temperature. The reaction mixture was further added with water, and organic phase thereof was cleansed with sodium acid carbonate solution after liquid separation to be subsequently cleansed with saturated saline. The organic phase was dried with magnesium sulfate, and the solvent was distilled away. Subsequently, residue thereof was added with acetone, so that precipitated solid was separated by filtration. By recrystallizing the obtained solid by acetic ether, 8.4 g of 3,7-dibromo-1,5-diphenylnaphthalene was obtained at an yield of 35%.

Under an argon gas atmosphere, 5.00 g (11.4 mmol) of 3,7-dibromo-1,5-diphenylnaphthalene, 5.32 g (24.0 mmol) of 9-phenanthreneboronic acid, 0.66 g (0.57 mmol) of tetrakis(triphenylphosphine) palladium(0), 200 ml of toluene, 50 ml of dimethoxyethane and 35 ml of 2M sodium carbonate solution were mixed, and stirred for 10 hours at 90 degrees C. Subsequently, the reaction mixture was warmed up to room temperature, added with water and stirred for 1 hour. After the solid precipitated during the reaction was separated by filtration, the obtained solid was cleansed with water, methanol, dimethoxyethane and toluene in this order. By dissolving the obtained solid in toluene and refining the solution by silica-gel column chromatography, 3.4 g of the compound B15 was obtained at an yield of 47%.

Mass-spectrum analysis consequently showed that m/e was equal to 632 while a calculated molecular weight was 632.25.

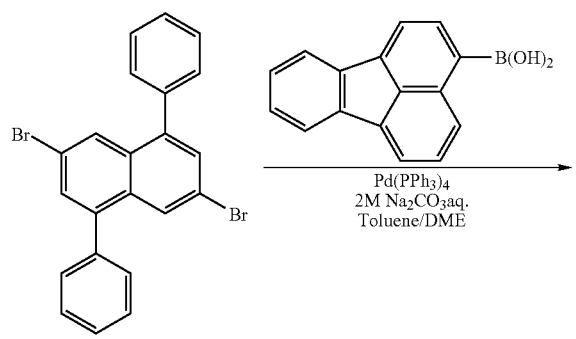

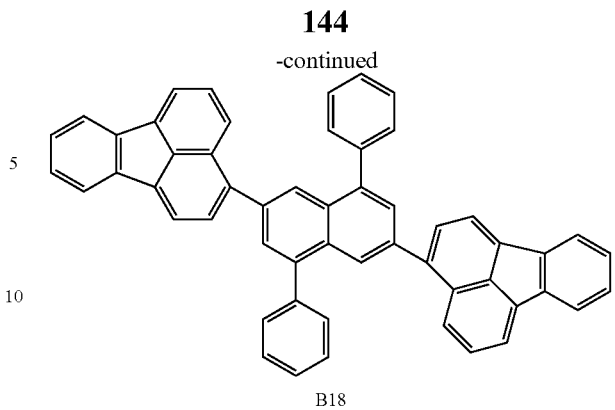

B18

Sythesis Example 7

Synthesis of Compound B18

Under an argon gas atmosphere, 5.00 g (11.4 mmol) of 3,7-dibromo-1,5-diphenylnaphthalene, 5.90 g (24.0 mmol) of fluoranthene-3-ylboronic acid, 0.66 g (0.57 mmol) of tetrakis(triphenylphosphine) palladium(0), 200 ml of toluene, 50 ml of dimethoxyethane and 35 ml of 2M sodium carbonate solution were mixed, and stirred for 10 hours at 90 degrees C. Subsequently, the reaction mixture was warmed up to room temperature, added with water and stirred for 1 hour. After the solid precipitated during the reaction was separated by filtration, the obtained solid was cleansed with water, methanol, dimethoxyethane and toluene in this order. By dissolving the obtained solid in toluene and refining the solution by silica-gel column chromatography, 3.1 g of the compound B18 was obtained at an yield of 40%.

Mass-spectrum analysis consequently showed that m/e was equal to 680 while a calculated molecular weight was 680.25.

A machine used in the measurement of mass spectrometry and measurement conditions thereof in the above synthesis examples will be described below.

Machine: JSM-700 (manufactured by Japan Electron Optics Laboratories Ltd.)

Conditions: accelerating voltage of 8 kV scan range m/z of 50 to 3000

Emitter type: carbon emitter current: 0 mA→2 mA/minute→40 mA (maintained for 10 minutes)

EXAMPLES

Next, the present invention will be described in further detail by exemplifying Example(s) and Comparative(s). However, the present invention is not limited by the description of Example(s).

Note that solid-property values of each material, which are shown in the Table below, were measured in the following manner.

Triplet energy gap Eg was defined based on phosphorescence spectrum.

Specifically, each material was dissolved in an EPA solvent (diethylether:isopentane:ethanol=5:5:2 in volume ratio) with a concentration of 10 μmol/L, thereby forming a sample for phosphorescence measurement.

Then, the sample for phosphorescence measurement was put into a quartz cell, cooled to 77K and irradiated with exciting light, so that phosphorescence radiated therefrom was measured in terms of its wavelength.

A tangent line was drawn to be tangent to a rising section adjacent to short-wavelength of the obtained phosphorescence spectrum, a wavelength value thereof was converted into energy value, and the converted energy value was defined as the triplet energy gap Eg(T).

For the measurement, a commercially-available measuring equipment F-4500 (manufactured by Hitachi, Ltd.) was used.

Structures of compounds used in Examples and Comparatives will be shown Below.

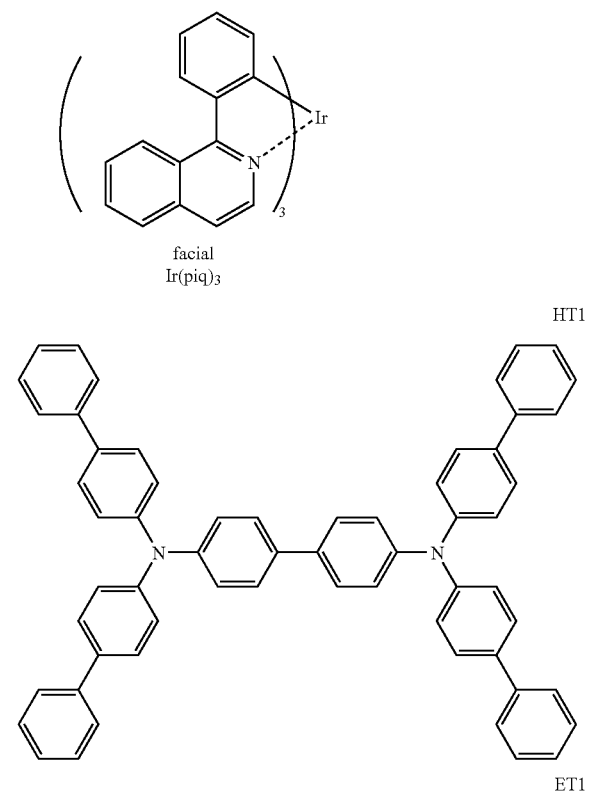

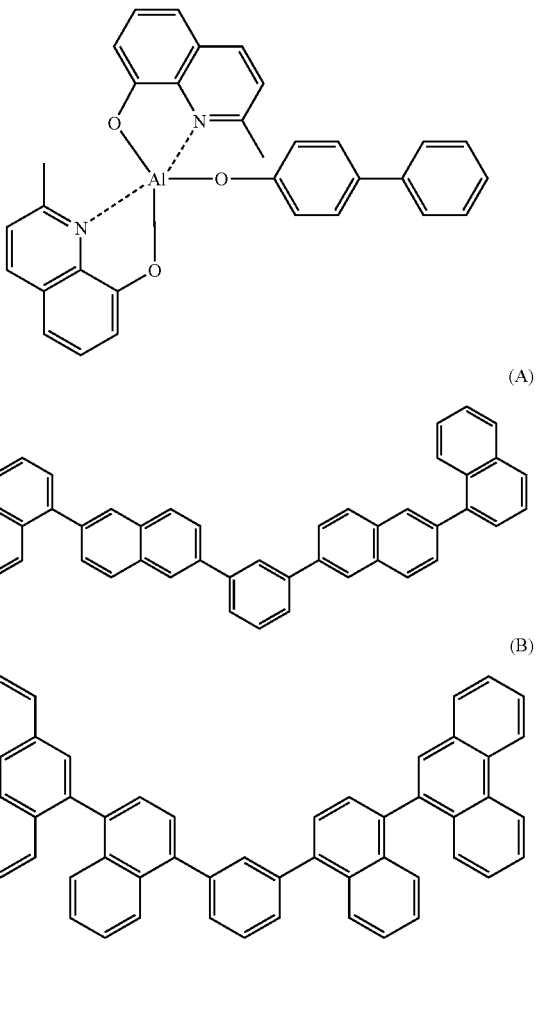

Example 1

Manufacturing of Organic EL Device

A glass substrate (size: 25 mm×75 mm×0.7 mm thick) having an ITO transparent electrode (manufactured by Asahi Glass Co., Ltd) was ultrasonic-cleaned in isopropyl alcohol for five minutes, and then UV/ozone-cleaned for 30 minutes. After the glass substrate having the transparent electrode line was cleaned, the glass substrate was mounted on of a substrate holder of a vacuum deposition apparatus, so that 50-nm thick film of HT1 was initially formed to cover a surface of the glass substrate where the transparent electrode line was provided. The HT1 film serves as a hole injecting/transporting layer. Subsequently to the formation of the hole injecting/transporting layer, 40-nm thick film of the compound A1 and a film of Ir(piq)$_3$ as a phosphorescent dopant were co-evaporated by resistance heating so that Ir(piq)$_3$ was contained therein with a content of 10 mass %. The co-deposited film serves as an emitting layer (phosphorescent-emitting layer). After the film of the emitting layer was formed, 40-nm thick film of ET1 was formed. The film of ET1 serves as an electron transporting layer. Then, 0.5-nm thick film of LiF was formed as an electron-injecting electrode (cathode) at a film-forming speed of 0.1 nm/min. Metal (Al) was vapor-deposited on the LiF film to form a 150-nm thick metal cathode, thereby providing the organic EL device.

Examples 2 to 7 and Comparatives 1 to 5

The organic EL devices according respectively to Examples 2 to 7 and Comparatives 1 to 4 were formed by the same method as Example 1 except that host compounds shown in Table 1 were respectively used in place of the compound A1.

[Evaluation on Emitting Performance of Organic EL Device]

The organic EL devices according to Examples 1 to 7 and Comparatives 1 to 5 each were driven by direct-current electricity to emit light, so that voltage at a current density of 10 mA/cm², luminous efficiency and time elapsed until the initial luminance intensity of 3000 cd/m² was reduced to the half (i.e., time until half-life) were measured for each organic EL device. The results of the evaluation are shown in Table 1.

TABLE 1

|  | Host Material | Eg(T) of Host Material (eV) | Voltage (V) | Luminous Efficiency (cd/A) | Time Until Half-life (hour) |
| --- | --- | --- | --- | --- | --- |
| Example 1 | Compound A1 | 2.52 | 4.4 | 11.3 | 6500 |
| Example 2 | Compound A6 | 2.40 | 4.7 | 9.6 | 6000 |
| Example 3 | Compound A22 | 2.51 | 4.3 | 10.8 | 9500 |
| Example 4 | Compound A23 | 2.58 | 4.8 | 10.0 | 8500 |
| Example 5 | Compound A24 | 2.54 | 4.2 | 11.0 | 10000 |
| Example 6 | Compound B15 | 2.55 | 4.5 | 11.4 | 7500 |
| Example 7 | Compound B18 | 2.30 | 4.7 | 9.4 | 6000 |
| Comparative 1 | CBP | 2.81 | 5.7 | 6.3 | 1200 |
| Comparative 2 | BAlq | 2.28 | 5.3 | 7.0 | 2300 |
| Comparative 3 | Compound (A) | 2.51 | 5.2 | 7.5 | 3800 |
| Comparative 4 | Compound (B) | 2.65 | 5.1 | 8.7 | 3400 |
| Comparative 5 | Compound (C) | 2.55 | 5.5 | 6.6 | 700 |

As is clearly understood from Table 1, the organic EL device according to each of Examples 1 to 7, which was formed of the host material according to the present invention, has been found to be excellent in luminous efficiency with its external quantum efficiency being high, and to have considerably long lifetime.

Comparative 1 required high voltage and exhibited considerably short lifetime.

Comparative 2 required less high voltage but exhibited short lifetime.

Comparatives 3 and 4 required less high voltage but exhibited shorter lifetime than Examples 1 to 7.

Comparative 5 was less efficient, and exhibited shorter lifetime than Examples 1 to 7.

The combination of the materials according to the present invention enables the luminous efficiency to be enhanced because the triplet energy gap of the host material and the triplet energy gap of the dopant are well-balanced, and enables the device to have a longer lifetime than a device provided by a conventional combination of materials because the emitting material is highly tolerant of the holes and electrons with the host material not being substituted by nitrogen-containing ring(s) or nitrogen atom(s).

The priority applications respectively numbered as JP2007-179109, JP2007-179120, JP2007-179121, U.S. Non-Provisional application Ser. No. 12/108,066, and U.S. Provisional Application No. 61/053,908 upon which this patent application is based are hereby incorporated by reference.

What is claimed is:

1. An organic electroluminescence device, comprising:
a cathode;
an anode; and
a single-layered or multilayered organic thin-film layer provided between the cathode and the anode, wherein the organic thin-film layer comprises at least one emitting layer, and the at least one emitting layer comprises: at least one phosphorescent material; and a host material having excited triplet energy of of 2.0 eV to 2.8 eV, the host material represented by a formula (1) as follows,

where:
Ar¹ represents a condensed aromatic hydrocarbon ring selected from a substituted or unsubstituted benzochrysene ring, and a substituted or unsubstituted picene ring;
Ra and Rb each represent a substituted or unsubstituted benzene ring or a condensed aromatic hydrocarbon ring selected from a substituted or unsubstituted naphthalene ring, a substituted or unsubstituted chrysene ring, a substituted or unsubstituted fluoranthene ring, a substituted or unsubstituted phenanthrene ring, a substituted or unsubstituted benzophenanthrene ring, a substituted or unsubstituted dibenzophenanthrene ring, a substituted or unsubstituted benzochrysene ring, and a substituted or unsubstituted picene ring, wherein the substituents for Ra and Rb are not aryl groups,
wherein when Ra, Rb, or both are substituted with a substituent, the substituent is one or more of an alkyl group comprising 1 to 20 carbon atoms, a haloalkyl group comprising 1 to 20 carbon atoms, a cycloalkyl group comprising 5 to 18 carbon atoms, a silyl group comprising 3 to 20 carbon atoms, a cyano group, and a halogen atom,
wherein when Ar¹ is substituted with a substituent, the substituent is one or more of an aryl group comprising 6 to 22 carbon atoms, an alkyl group comprising 1 to 20 carbon atoms, a haloalkyl group comprising 1 to 20 carbon atoms, a cycloalkyl group comprising 5 to 18 carbon atoms, a silyl group comprising 3 to 20 carbon atoms, a cyano group, and a halogen atom.

2. The organic electroluminescence device according to claim 1, wherein
the phosphorescent material comprises a metal complex, and
the metal complex comprises: a metal atom selected from Ir, Pt, Os, Au, Cu, Re and Ru; and a ligand.

3. The organic electroluminescence device according to claim 2, wherein the ligand has an ortho-metal bond.

4. The organic electroluminescence device according to claim 1, wherein a maximum wavelength of light emission of the at least one phosphorescent material contained in the emitting layer is in a range of 500 nm to 720 nm.

5. The organic electroluminescence device according to claim 1, wherein
the organic thin-film layer comprises an electron transporting layer or an electron injecting layer between the cathode and the emitting layer, and
the electron transporting layer or the electron injecting layer comprises an aromatic ring having a nitrogen-containing six-membered or five-membered ring skeleton, or a condensed aromatic cyclic compound having a nitrogen-containing six-membered or five-membered ring skeleton.

6. The organic electroluminescence device according to claim 1, wherein a reductive dopant is present at an interfacial region between the cathode and the organic thin-film layer.

7. The organic electroluminescence device according to claim 1, wherein Ra, Rb, or both represent a substituted or unsubstituted naphthalene ring.

8. The organic electroluminescence device according to claim 1, wherein Ra, Rb, or both represent a substituted or unsubstituted chrysene ring.

9. The organic electroluminescence device according to claim 1, wherein Ra, Rb, or both represent a substituted or unsubstituted fluoranthene ring.

10. The organic electroluminescence device according to claim 1, wherein Ra, Rb, or both represent a substituted or unsubstituted phenanthrene ring.

11. The organic electroluminescence device according to claim 1, wherein Ra, Rb, or both each represent a substituted or unsubstituted benzophenanthrene ring.

12. The organic electroluminescence device according to claim 1, wherein Ra, Rb, or both each represent a substituted or unsubstituted dibenzophenanthrene ring.

13. The organic electroluminescence device according to claim 1, wherein Ra, Rb, or both represent a substituted or unsubstituted benzochrysene ring.

14. The organic electroluminescence device according to claim 1, wherein Ra, Rb, or both represent a substituted or unsubstituted picene ring.

15. An organic electroluminescence device, comprising:
a cathode;
an anode; and
a single-layered or multilayered organic thin-film layer provided between the cathode and the anode, wherein
the organic thin-film layer comprises at least one emitting layer, and
the at least one emitting layer comprises: at least one phosphorescent material; and a host material having excited triplet energy of of 2.0 eV to 2.8 eV, the host material represented by a formula (1) as follows, $$Ra—Ar^1—Rb \quad (1)$$

where:
$Ar^1$ represents a condensed aromatic hydrocarbon ring selected from a substituted or unsubstituted naphthalene ring, a substituted or unsubstituted dibenzophenanthrene ring, a substituted or unsubstituted benzochrysene ring, and a substituted or unsubstituted picene ring;
wherein Ra, Rb, or both represent a substituted or unsubstituted chrysene ring, a substituted or unsubstituted fluoranthene ring, a substituted or unsubstituted phenanthrene ring, a substituted or unsubstituted benzophenanthrene ring, a substituted or unsubstituted dibenzophenanthrene ring, a substituted or unsubstituted benzochrysene ring, and a substituted or unsubstituted picene ring, wherein the substituents for Ra and Rb are not aryl groups,
wherein when Ra, Rb, or both are substituted with a substituent, the substituent is one or more of an alkyl group comprising 1 to 20 carbon atoms, a haloalkyl group comprising 1 to 20 carbon atoms, a cycloalkyl group comprising 5 to 18 carbon atoms, a silyl group comprising 3 to 20 carbon atoms, a cyano group, and a halogen atom,
wherein when $Ar^1$ is substituted with a substituent, the substituent is one or more of an aryl group comprising 6 to 22 carbon atoms, an alkyl group comprising 1 to 20 carbon atoms, a haloalkyl group comprising 1 to 20 carbon atoms, a cycloalkyl group comprising 5 to 18 carbon atoms, a silyl group comprising 3 to 20 carbon atoms, a cyano group, and a halogen atom.

16. The organic electroluminescence device according to claim 15, wherein $Ar^1$ is a substituted or unsubstituted naphthalene ring.

17. The organic electroluminescence device according to claim 15, wherein $Ar^1$ is a substituted or unsubstituted benzochrysene ring.

18. The organic electroluminescence device according to claim 15, wherein $Ar^1$ is a substituted or unsubstituted picene ring.

* * * * *